(12) United States Patent
Lablans

(10) Patent No.: US 7,877,670 B2
(45) Date of Patent: Jan. 25, 2011

(54) ERROR CORRECTING DECODING FOR CONVOLUTIONAL AND RECURSIVE SYSTEMATIC CONVOLUTIONAL ENCODED SEQUENCES

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 1085 days.

(21) Appl. No.: 11/566,725

(22) Filed: Dec. 5, 2006

(65) Prior Publication Data

US 2007/0226594 A1    Sep. 27, 2007

Related U.S. Application Data

(60) Provisional application No. 60/742,831, filed on Dec. 6, 2005.

(51) Int. Cl.
*H03M 13/00* (2006.01)

(52) U.S. Cl. .................. 714/774; 714/778; 714/755; 714/786; 714/701; 326/59; 380/275

(58) Field of Classification Search ............... 714/774, 714/701, 755, 786, 778; 326/59; 380/275
See application file for complete search history.

(56) References Cited

U.S. PATENT DOCUMENTS

| 5,327,441 | A | 7/1994 | Kawazoe et al. |
|---|---|---|---|
| 5,881,073 | A | 3/1999 | Wan et al. |
| 6,275,538 | B1 | 8/2001 | Ramesh et al. |
| 6,477,680 | B2 | 11/2002 | Mujtaba |
| 6,530,059 | B1 | 3/2003 | Crozier et al. |
| 6,570,927 | B1 | 5/2003 | Van Stralen et al. |
| 6,665,832 | B1 | 12/2003 | Neufeld et al. |
| 6,845,481 | B2 | 1/2005 | Gueguen et al. |
| 7,127,004 | B1 * | 10/2006 | Sonning et al. ............. 375/295 |
| 7,246,296 | B2 * | 7/2007 | Yokokawa et al. .......... 714/755 |
| 7,634,694 | B2 * | 12/2009 | Green et al. ................ 714/701 |
| 2003/0063677 | A1 | 4/2003 | Mix et al. |

OTHER PUBLICATIONS

Frank M.Loya, Algorithm for Initialization of a Convolutional Decoder, JPL New Technology Report NPO- 19776, Sep. 1998, 13 pages, JPL, Pasadena, CA.

* cited by examiner

*Primary Examiner*—Guy J Lamarre
(74) *Attorney, Agent, or Firm*—Diehl Servilla LLC

(57) ABSTRACT

The invention relates to error-correcting coding and correct restart of decoding after errors of sequences that are coded by convolutional coders or LFSR based descramblers. The signals can be binary or multi-valued signals. Methods and apparatus to convolutional encode and decode sequences of binary and n-valued symbols are disclosed. The invention further discloses methods and apparatus to identify symbols in error in sequences coded according to methods of the invention. Methods and apparatus to correct these errors are provided. Methods and apparatus to repair errors in a Trellis of received sequences are also provided. Methods and apparatus for n-valued Recursive Systematic Convolutional coders and decoders are disclosed.

20 Claims, 23 Drawing Sheets

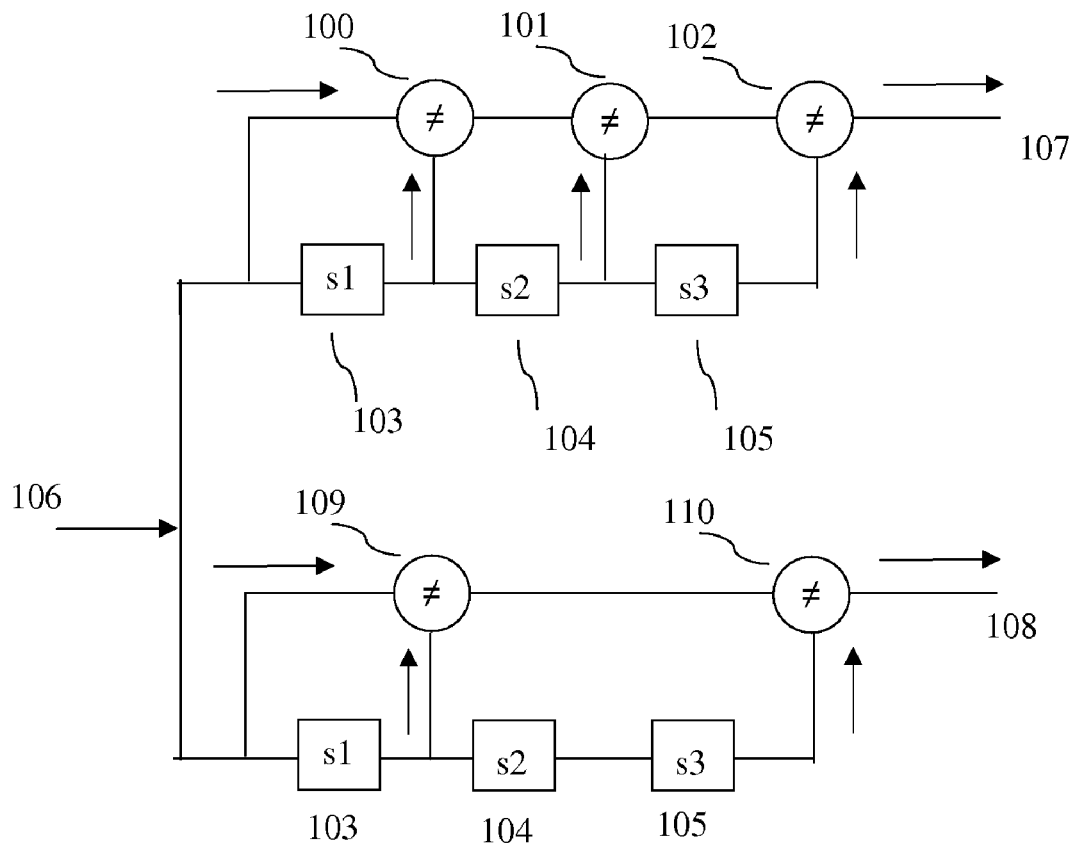
FIG. 1 PRIOR ART
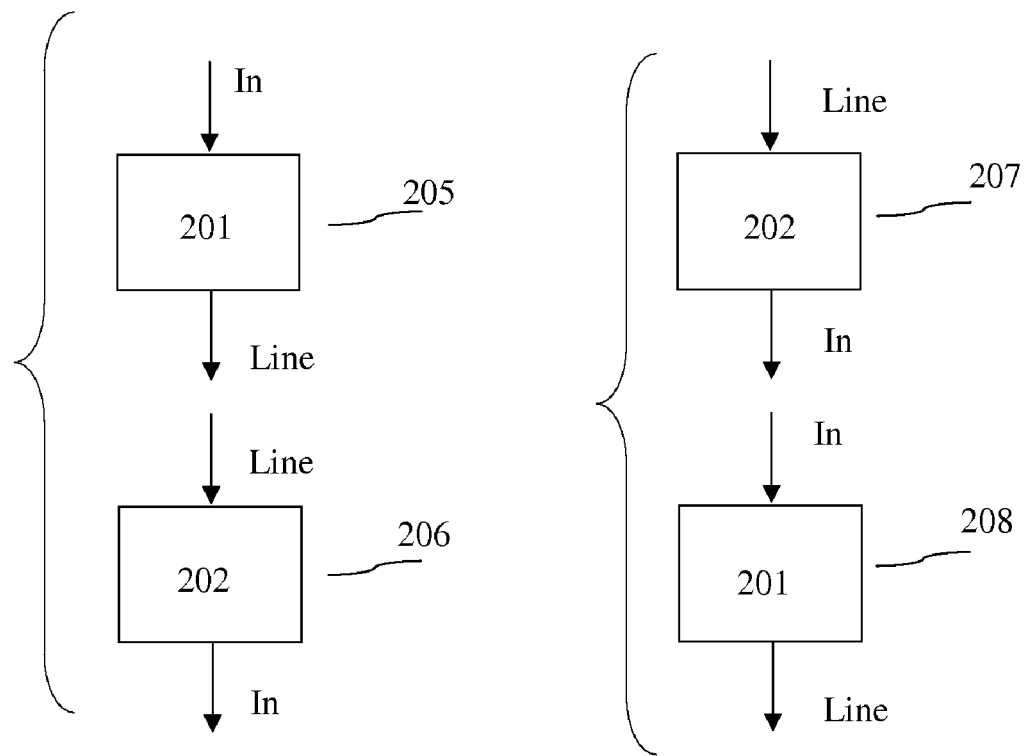
FIG. 2
FIG. 3

| in | u1 | u2 | u3 | e | e | e | e | u8 | u9 | u10 |
|---|---|---|---|---|---|---|---|---|---|---|
| status SR | g | g | g | g | e | e | e | g | g | g |
| out | y1 | y2 | y3 | e | e | e | e | y8 | y9 | y10 | s1 s2 s3    3300
s2 s3 s4    3301
s3 s4 s5    3302
s4 s5 s6    3303
s5 s6 s7

FIG. 33

| # | 1 | 2 | 3 | 4 | 5 | 6 | 7 | 8 | 9 |
|---|---|---|---|---|---|---|---|---|---|
| 4301 | u1 | u2 | u3 | e | e | e | u7 | u8 | u9 |
| status SR | g | g | g | g | e | e | g | g | g |
| 4302 | r1 | r2 | r3 | e/s3 | e/s2 | e/s1 | g | g | g |
| 4303 | y1 | y2 | y3 | e | e | e | g | g | g |

ERROR CORRECTING DECODING FOR CONVOLUTIONAL AND RECURSIVE SYSTEMATIC CONVOLUTIONAL ENCODED SEQUENCES

CROSS-REFERENCE TO RELATED APPLICATIONS

This application claims the benefit of U.S. Provisional Patent Application Ser. No: 60/742,831, filed Dec. 6, 2005, which is incorporated herein by reference.

BACKGROUND OF THE INVENTION

This invention relates to the coding and decoding of binary and non-binary digital sequences. More specifically it provides novel error-correcting methods and apparatus that allow to correct errors experienced during the transmission of signals.

Digital signals such as binary and non-binary digital sequences are used in the transmission of information. Disturbances of the signals during transmission can cause errors is such a way that the detected signal is different from the transmitted signal. Error-detecting and error correcting codes that address the issue of transmission errors are well known.

A known method to create error correcting codes is by the use of convolutional coding in the encoding process and Viterbi decoding of the signal after reception of the signal. Different methods exist to decode convolutionally coded signals.

The current methods to decode convolutionally coded messages require tracing the many different ways that a current state of the code can be reached in so called Trellis diagrams. These methods can become quite complicated. Hence simpler methods and apparatus to detect and correct errors in a received sequence are required. Most convolutional encoding and decoding techniques apply to binary signals. Hence methods and apparatus to convolutionally encode and decode non-binary signals are required.

SUMMARY OF THE INVENTION

In view of the more limited possibilities of the prior art in the convolutionally coding and decoding of binary and non-binary digital sequences, the current invention provides methods and apparatus for the coding and decoding of digital sequences and the automatic correction of errors.

The general purpose of the present invention, which will be described subsequently in greater detail, is to provide novel methods and apparatus which can be applied in the coding and decoding of binary and multi-valued digital sequences in such a way that it can automatically correct occurring errors. In general the digital sequences that are coded may assumed to be unpredictable and may be comprised of any valid sequence of binary or n-valued symbols. This may include long series of identical symbols or repeating patterns of symbols. The individual symbols in a sequence are represented by a signal. N-valued symbols may also be formed as words of binary symbols. N in n-valued means n≧3. Signals are usually of an electrical or optical nature, but they may be of any valid distinguishable physical phenomenon.

Before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

Binary in the context of this application means 2-valued. Multi-valued generally means n-valued in the context of this invention and means in general an integer greater than 2, however it may sometimes mean equal to or greater than 2 there where it will be clear to one of ordinary skill in the art.

It is one aspect of the present invention to create decoding methods and apparatus that can correct errors in coded binary and multi-valued sequences.

In accordance with another aspect of the present invention a method is provided for detecting where errors have occurred in convolutional and Recursive Systematic Convolutional (RSC) coded binary and multi-valued sequences.

In accordance with a further aspect of the present invention a method is provided to calculate a position for successfully restarting decoding of convolutional or RSC coded sequences with errors.

In accordance with another aspect of the present invention methods are provided to implement convolutional and RSC coders and decoders.

In accordance with a further aspect of the present invention methods are provided to correct errors in decoded convolutional and RSC coded sequences with errors.

In accordance with another aspect of the present invention a method is provided to correct errors in convolutional and RSC coded sequences with errors.

In accordance with a further aspect of the present invention a method is provided to determine the content of the shift register of an RSC coder in the initial state, based on the shift register content of an end state of the shift register.

In accordance with another aspect of the present invention methods are provided to design forward coders and corresponding feedback decoders.

In accordance with a further aspect of the present invention methods are provided to design and implement RSC coders by combining scramblers and descramblers sharing a shift register.

In accordance with another aspect of the present invention methods are provided to design and implement RSC decoders corresponding with RSC coders.

In accordance with a further aspect of the present invention systems and apparatus are provided to implement the methods and steps which are aspects of the present invention.

BRIEF DESCRIPTION OF THE DRAWINGS

Various other objects, features and attendant advantages of the present invention will become fully appreciated as the same becomes better understood when considered in conjunction with the accompanying drawings, and wherein:

FIG. 1 is a diagram of a binary convolutional coder.

FIG. 2 is a block diagram of a coder/decoder combination.

FIG. 3 is a block diagram of another coder/decoder combination.

FIG. 33 is a status diagram of a decoding process.

DETAILED DESCRIPTION OF THE INVENTION

The Related Art

Figure 4:
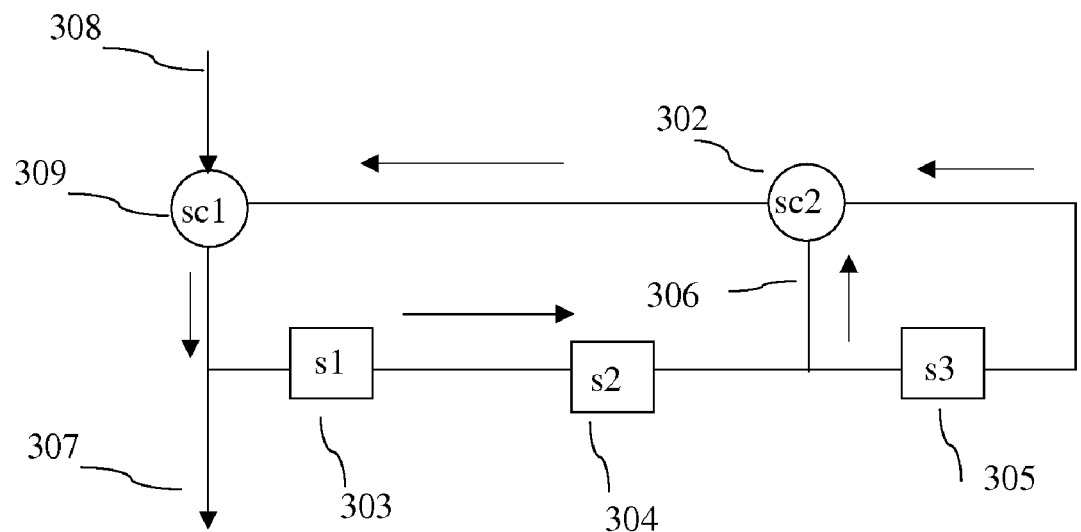
FIG. 4 is a diagram of a LFSR based scrambler.

Binary convolutional coders are known. These coders are comprised of a shift register of finite length and taps from individual elements of the shift register which are combined through usually a modulo-2 adder. Different taps may be combined to create a different output signal. FIG. 1 shows a diagram of a known convolutional coder. It is comprised of a 3-element shift register. For clarity and for later purposes the coder is drawn as two separate shift-registers. It may be assumed that the circuit is a binary circuit. A binary signal is inputted on input 106 in FIG. 1. The sequence is shifted into the different elements of the shift register 103, 104 and 105 from left to right, controlled by a clock signal that is synchronous with the elements of the input sequence on input 106. The clock signal is assumed but generally not shown. The input signal is put through the shift register unchanged or 'as is'. This is the reason why usually only one shift register is shown. The top part of the coder has three taps from the elements of the shift register with 3 elements 103, 104, 105. The incoming signal on 106 and the taps are combined through devices 100, 101 and 102. A first output signal is outputted on 107. In general the known literature uses the modulo-2 addition or binary XOR function to be executed by these devices, however the binary EQUAL function may also be applied. The bottom part of the coder uses just two taps and combines the incoming signal on 106 with two taps through devices 109 and 110. A second output signal is outputted on 108. The binary devices 109 and 110 also execute a binary XOR function in this illustrative example. The signals on 107 and 108 are in general different from each other. These signals will be combined, for instance with a multiplexer, in a serial fashion and transmitted as a single sequence. At the receiving end the two sequences are separated from the received sequence by for instance a demultiplexer and decoded by a Viterbi decoder, using for instance a Trellis diagram. The decoder then reconstructs the input sequence which was provided on 106.

One of the conditions for the circuit of FIG. 1 to be a convolutional coder is that the initial condition of the shift register should be all 0s. A second condition is that when all bits of the sequence are coded the shift register has to be flushed so it only contains 0s.

The Present Invention

The elements of the convolutional coder are actually modified LFSR descramblers used in a coder configuration. A scrambler/descrambler combination has an input sequence that is to be scrambled; the output of the scrambler is a scrambled sequence that forms the input to the descrambler. The descrambler should have as its output a sequence that is identical to the sequence inputted to the scrambler. The inventor has identified in U.S. Non-Provisional Patent Application Ser. No. 11/042,645, filed Jan. 25, 2005, and entitled: MULTI-VALUED SCRAMBLING AND DESCRAMBLING OF DIGITAL DATA ON OPTICAL DISKS AND OTHER STORAGE MEDIA which is incorporated by reference herein in its entirety, that the role of scrambler and descrambler can be exchanged. This is also shown in FIG. 2 and FIG. 3. In FIG. 2 a scrambler 205 executes a function 201; its descrambler 206 executes a function 202. Functions 201 and 202 should be each others reversing function. The concept of function may include composite functions as present in LFSRs. Suppose that 201 and 202 are each others reversing function. In that case one may exchange the order of 201 and 202. This is shown in FIG. 3 wherein the scrambler 207 executes function 202 and descrambler 208 executes 201. Most likely there will be conditions (such as initial states) to make these arrangements work. In LFSR solutions the initial condition is usually related to the initial content of the shift register.

Figure 5:
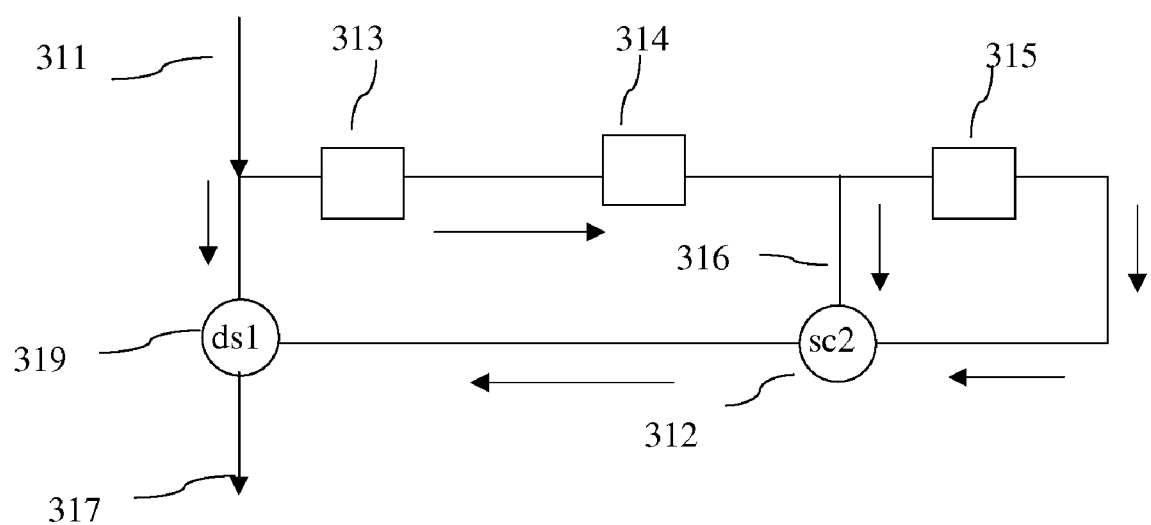
FIG. 5 is a diagram of an LFSR based self-synchronizing descrambler.

There are two fundamentally different shift-register scrambler/descrambler combinations that can be applied. The first one is the n-valued LFSR based scrambler/descrambler, wherein n is an integer of 2 or greater. The binary LFSR based scrambler/descrambler is well known. The solution for non-binary LFSR based scramblers/descramblers is described in U.S. Non-Provisional Patent Application Ser. No. 10/935, 960, filed on Sep. 8, 2004, entitled TERNARY AND MULTI-VALUE DIGITAL SCRAMBLERS, DESCRAMBLERS AND SEQUENCE GENERATORS which is herein incorporated by reference in its entirety. As an illustrative example the circuits in FIG. 4 and FIG. 5 are provided. It is understood that circuits of different shift register length, with different logic functions and different taps can also be created. In this example FIG. 4 serves as a 3-element n-valued LFSR based scrambler. The reversible n-valued functions 'sc1' in device 309 and reversible n-valued function 'sc2' is used for device 302. The shift register elements 303, 304 and 305 can hold and shift n-valued signals. The corresponding descrambler is shown in FIG. 5. Device 312 executes the same function 'sc2' as device 302 in FIG. 4. Device 319 executes a function 'ds1', which reverses the function 'sc1' of device 309. When the circuits are binary circuits then the functions 'sc1', 'sc2' and 'ds1' can be either XOR or EQUAL functions, applied in a correct manner.

For illustrative purposes the following two examples are provided. First assume the circuits of FIG. 4 and FIG. 5 to be binary. A binary sequence SEQ is used as an input. SEQ=[1 1 0 1 0 0 0 1 1 0 1 0 0 1 1 1]. The circuit of FIG. 4 is used as scrambler with all functions XOR and initial shift register [1 0 0]. The output of the scrambler is RES1=[0 1 0 1 0 0 1 0 1 0 1 0 0 0 1 0]. The sequence RES1 is then inputted into the circuit of FIG. 5 as descrambler also with all function XOR and initial state of the shift register [1 0 0]. The output of the descrambler is RES2=[1 1 0 1 0 0 0 1 1 0 1 0 0 1 1 1]. This is identical to the input sequence RES. The sequence SEQ can also be inputted into the circuit of FIG. 5 as scrambler. This will create output RES11=[0 0 0 0 0 0 1 1 0 1 0 0 0 0 0 0]. When RES11 is inputted into the circuit of FIG. 4 as descrambler it will create the sequence RES22=[1 1 0 1 0 0 0 1 1 0 1 0 0 1 1 1], which is identical to the sequence SEQ. This demonstrates that in the binary case the roles of scrambler and descrambler are interchangeable.

The interchangeability of scrambler and descrambler also applies to the non-binary case. For illustrative purposes a ternary example will be provided. The ternary logic functions 'sc1', 'sc2' and 'ds2' as used in devices 309, 302, 312 and 319 in FIG. 4 and FIG. 5 have the following truth tables:

| sc2 | 0 | 1 | 2 | sc1 | 0 | 1 | 2 | ds1 | 0 | 1 | 2 |
|-----|---|---|---|-----|---|---|---|-----|---|---|---|
| 0   | 1 | 0 | 2 | 0   | 0 | 2 | 1 | 0   | 0 | 1 | 2 |
| 1   | 2 | 1 | 0 | 1   | 1 | 0 | 2 | 1   | 1 | 2 | 0 |
| 2   | 0 | 2 | 1 | 2   | 2 | 1 | 0 | 2   | 2 | 0 | 1 |

Assume the circuit of FIG. 4 is used as the ternary scrambler with initial state of the ternary shift register [1 0 2] and input sequence: SEQ3=[1 1 2 0 1 0 0 2 2 0 1 2 1 1 0]. The generated output sequence is RES31=[2 2 2 2 0 0 0 1 2 1 0 2 1 1 1]. Inputting RES31 into the ternary circuit of FIG. 5 as descrambler with initial state [1 0 2] generates output sequence RES32=[1 1 2 0 1 0 0 2 2 0 1 2 1 1 0]. This sequence is identical to the original ternary sequence SEQ3. One can also input sequence SEQ3 in FIG. 5 as ternary scrambler, generating RES311=[0 1 0 0 0 2 1 1 1 2 1 1 0 2 2].

Inputting RES311 into the circuit of FIG. 4 as descrambler will recover the original sequence.

Figure 6:
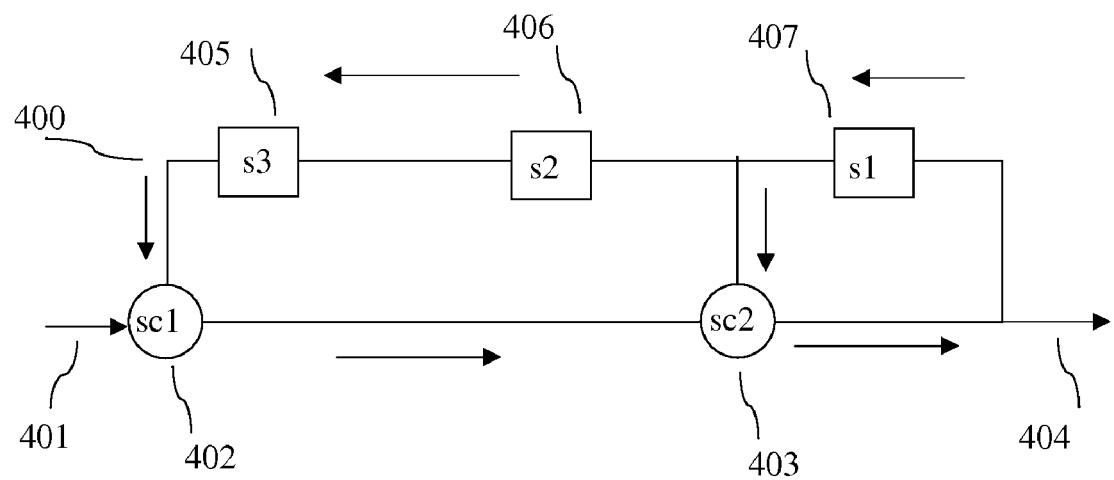
FIG. 6 is a diagram of a shift register based coder.
Figure 7:
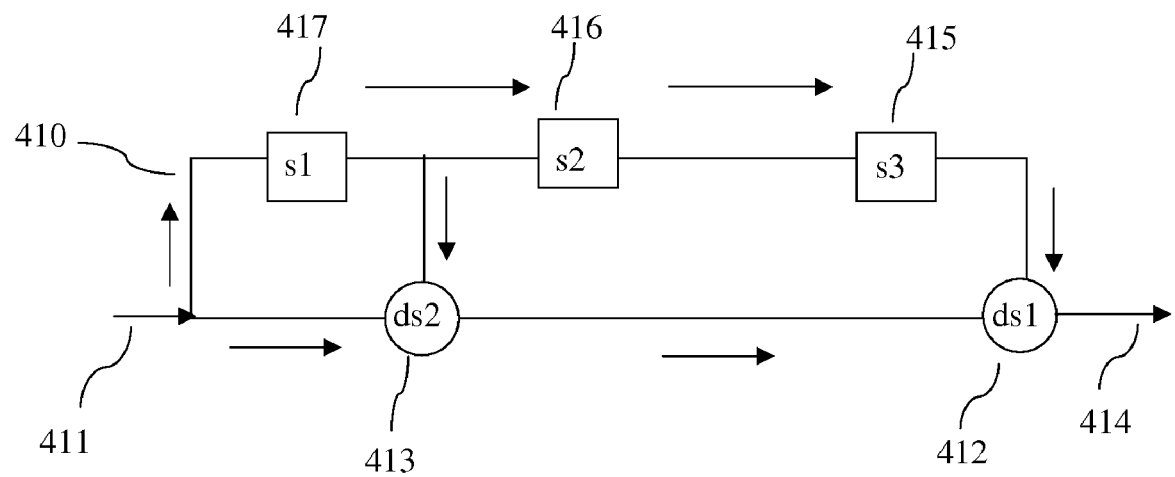
FIG. 7 is a diagram of a shift register based decoder.

For illustrative purposes, the same interchangeability of coder/decoder can be demonstrated on the circuits of FIG. 6 and FIG. 7. The binary sequence SEQ=[1 1 0 1 0 0 0 1 1 0 1 0 0 1 1 1] is inputted into the binary circuit of FIG. 6 as a coder with initial state [1 0 0]. This generates RES1=[0 1 0 1 0 0 1 0 1 0 1 0 0 0 1 0]. Inputting RES1 into the circuit of FIG. 7 as decoder will generate RES2, which is identical to SEQ. By first inputting SEQ into the circuit of FIG. 7 as coder will generate RES11=[0 0 0 0 0 0 1 1 0 1 0 0 0 0 0 0]. Inputting RES11 into the circuit of FIG. 6 will recover the sequence SEQ.

For illustrative purpose, the circuits of FIG. 6 and FIG. 7 will be configured as ternary circuits. The shift registers will be able to hold and shift ternary signals and the functions 'sc1', 'sc2', 'ds1' and 'ds2' are ternary logic functions where of the truth table are provided in the following table.

| sc2 | 0 | 1 | 2 | ds2 | 0 | 1 | 2 | sc1 | 0 | 1 | 2 | ds1 | 0 | 1 | 2 |
|-----|---|---|---|-----|---|---|---|-----|---|---|---|-----|---|---|---|
| 0   | 1 | 0 | 2 | 0   | 2 | 0 | 1 | 0   | 0 | 2 | 1 | 0   | 0 | 1 | 2 |
| 1   | 2 | 1 | 0 | 1   | 0 | 1 | 2 | 1   | 1 | 0 | 2 | 1   | 1 | 2 | 0 |
| 2   | 0 | 2 | 1 | 2   | 1 | 2 | 0 | 2   | 2 | 1 | 0 | 2   | 2 | 0 | 1 |

It should be clear to those skilled in the art that these are non-commutative reversible functions, so the order of the inputs is of importance to the proper functioning of the circuits. One can input the sequence SEQ3=[1 1 2 0 1 0 0 2 2 0 1 2 1 1 0] to the circuit of FIG. 6 with initial state [1 0 2]. The generated result is RES31=[2 0 2 0 2 0 1 0 0 0 2 1 1 2 1]. Inputting RES31 into the ternary circuit of FIG. 7 will generate the sequence SEQ3. Inputting SEQ3 into the ternary circuit of FIG. 7 with initial state [1 0 2] will generate the ternary sequence RES331=[0 1 0 2 1 2 2 2 0 1 2 1 2 2 2]. Inputting RES331 into the ternary circuit of FIG. 6 with initial state [1 0 2] will generate the original sequence SEQ3. It is thus demonstrated that in the ternary case the role of coder and decoder are interchangeable. One can demonstrate the effect for all n-valued LFSR based scramblers, descramblers as well as for shift register based coders and decoders.

In both the circuits of FIG. 4 and FIG. 6 feedback takes place. This has as a pronounced effect that a previous state of the shift register will affect the output of the circuit beyond the length of the shift register. In both the circuits of FIG. 5 and FIG. 7 the output signal is only affected by the present state of the shift register. In some situations that is desirable because when an error occurs, the effect of the error will be gone when the shift register is 'flushed'. When the feedback configuration circuits are used as descramblers or decoders any error, without additional action, may be catastrophic as the error will propagate through the rest of the decoded or descrambled signal. Catastrophic effects can be limited by limiting the size of a sequence. If a catastrophic error occurs, it will not propagate beyond the length of the sequence. One may re-initialize coders and decoders after a certain number of symbols. If one can accept a limited number of errors and one expects a low error ratio then use of the 'self-flushing' configurations may be desirable as the descrambler or decoder.

One aspect of the present invention is to have dissimilar coders scramble or code one sequence in at least two dissimilar sequences. These sequences can be combined (for instance by a multiplexer) into a single sequence with a higher symbol transmission rate or they can be transmitted through separate channels. At the receiving end the sequences can be separated (for instance by a demultiplexer) and compared (in phase) which each other. It may be assumed that one or several or all of the sequences have experienced transmission errors. The benefit of receiving multiple (derived) versions of a single sequence is that one can reconstruct the original sequence and correct errors that may have occurred. For simplicity and illustrative purposes mainly two scrambled sequences related to a single original sequence will be used and described. However it should be clear to a person skilled in the art that one may use also 3 or more differently scrambled sequences derived from a single sequence. The benefits of 3 or more derived scrambled sequences become greater if more errors are expected or if one wishes to limit the processing time to determine the correct sequence.

In general error-correcting codes require the determination of the likelihood of an occurring sequence compared to a second sequence, so conclusions can be drawn about the occurrence of errors. When two identical descrambled results are achieved, it may be concluded that the error-free sequence has been identified. This is based on the fact that only the correct scrambled sequence will generate a correct descrambled sequence.

It is also assumed that a sequence scrambled with two different scrambling methods, and each scrambled sequence experiencing errors, will not create identical descrambled sequences. The last statement is only true if the number of consecutive errors in both sequences does not exceed (in-phase of each other) the length of the shift register of the coder. Errors propagate beyond the length of the shift register. In order to be able to determine if the sequences are error free one should have a sufficient length of error-free sequences. Thus the expected error ratio of the line, the distribution of the errors, the error free tail after errors all determine how well errors can be detected and corrected.

One can check in an illustrative example that if only errors occur within a reach of 3 bits of corresponding positions between the two sequences, one can generate all 8 (being 2 to the power 3) possible permutations of each sequence with 3 possible errors. One can then compare the decoded versions of each sequence, with a sufficiently long tail. Only one pair of identical sequences will be generated. This identical pair is then the correct sequence.

Figure 8:
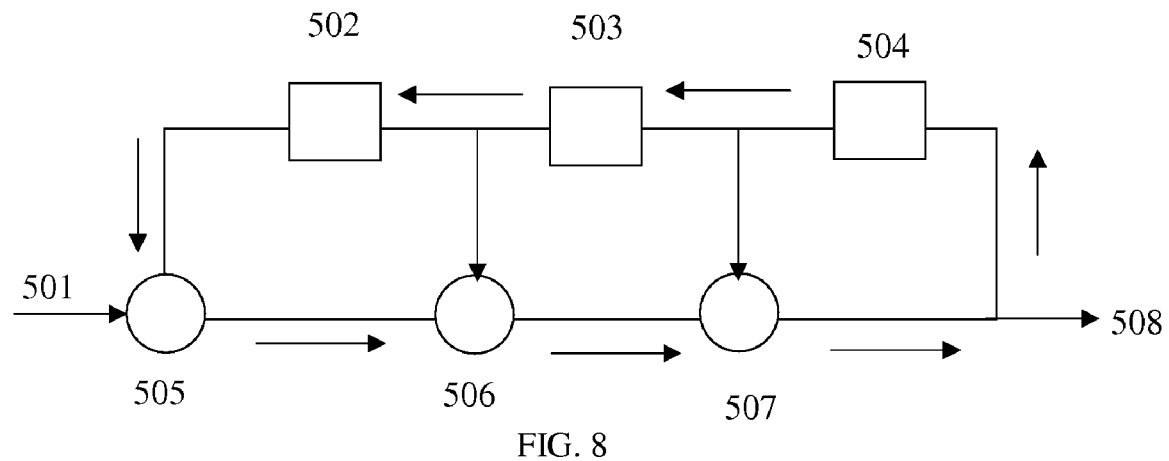
FIG. 8 is a diagram of another shift register based decoder.
Figure 9:
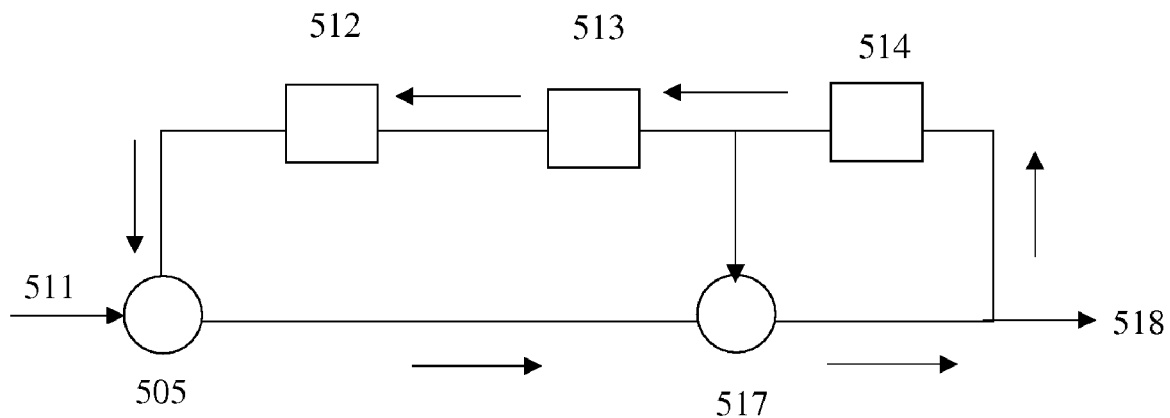
FIG. 9 is a diagram of another shift register based decoder.

The circuits of which the diagram is shown in FIG. 8 and FIG. 9 are the dual descrambling solutions for the dual coder as shown in FIG. 1. A configuration of a shift register based coder and its feedback based decoder, applying adder functions in the coder and subtraction functions in the decoder is described in US Non-provisional Patent Application as Publication Number 20030063677 on Apr. 3, 2003 by Mix, et al. entitled: 'Multi-level coding for digital communication' and is incorporated herein in its entirety by reference. The invention of different possible coders/decoders of similar configurations was provided in the recited U.S. Non-Provisional Patent Application Ser. No. 11/042,645, filed Jan. 25, 2005.

In the present illustrative example the two scrambled versions of the original sequence may have been combined for transmission and again split into two separate sequences for decoding. The sequence generated on 107 in the circuit of FIG. 1 will be inputted on 501 in the circuit of FIG. 8 and the sequence generated on 108 will be inputted on 511 in FIG. 9. If no errors have occurred during transmission then the generated sequences on 508 and 518 will be identical. When one or more errors have occurred during transmission (even though it is not known how many errors or in which sequence) the two sequences will not be identical. The present configurations as shown in FIG. 8 and FIG. 9 use a decoder in feedback configuration. Such configuration has infinite (or catastrophic) error propagation. So unless the error is corrected the sequences on 508 and 518 will remain different. That does not mean that some parts of the sequence will not be identical. An effective method to correct errors in a sequence received with a descrambling method as shown in FIG. 8 and FIG. 9 is to create sequences wherein each 'suspected' error symbol is changed in the received sequences before descrambling, descramble the changed sequences and compare the descrambled sequences.

When two descrambled sequences are equal they may be supposed to represent the correct original sequence and thus occurring errors have been corrected. For illustrative purposes the binary sequence SEQ as previously used will be scrambled by the configuration of FIG. 1 with initial state [1 0 0] of the shift register.

SEQ=[1 1 0 1 0 0 0 1 1 0 1 0 0 1 1 1]

XX1=[0 1 1 1 0 1 1 1 0 0 1 0 1 0 0 1]

XX2=[0 0 0 0 0 0 1 1 0 1 0 0 0 0 0 0]

Putting XX1 and XX2 through their respective descramblers will recreate SEQ. Assume for illustrative purposes that the $5^{th}$ bit of both XX1 and XX2 have changed to 1. This will create:

XX1e=[0 1 1 1 1 1 1 1 0 0 1 0 1 0 0 1]

XX2e=[0 0 0 0 1 0 1 1 0 1 0 0 0 0 0 0]

Putting these sequences through their respective descramblers will create:

YY1e=[1 1 0 1 1 1 0 1 0 1 1 0 1 0 1 1]

YY2e=[1 1 0 1 1 1 1 1 0 0 1 1 1 0 1 0].

One can see that the errors cause different descrambled sequences. However the errors do not show up as difference in signals until bit 7. This implies that one should select a 'reach' of comparison between descrambled sequences that is sufficiently broad in order to identify the start of error. In the example the 'detection reach' should be broader than 2 bits. This applies to a single or double error in corresponding positions. When an expected bit-error-ratio can create errors in consecutive bits or within a word of a certain number of bits, the detection reach should be expanded. It is expected that the number of errors will be finite in such a way that when errors are detected and corrected by the methods here provided, that based on the selected reach the system will become error free for a certain number of bits. However one cannot make the reach broader than the length of the shift register. If that happens the decoder may start correcting errors that were not there, even if there are more than 3 errors in the illustrative example. When more than 3 consecutive errors are expected one should use coders or scramblers with shift registers with more than 3 elements.

One should also make sure that errors are corrected before the next set of errors can be addressed (at least in the present configuration) as the errors will propagate. The following table shows what happens during error correction when the here invented method is applied. It is assumed that previously generated sequences XX1 and XX2 both experience an error in bit 5. It is assumed that the error is corrected when YY1 and YY2 being the decoded sequences of XX1e and XX2e are equal. Or in other words when the difference of YY1 and YY2 is 0.

| | YY1-YY2 | mod XX1 | mod XX2 | correct |
|---|---|---|---|---|
| 1 | 0 0 0 0 0 1 1 0 0 1-1 0 0-1-1 0 | 0 0 | 0 0 | 0 |
| 2 | 0 0 0 0 0 0 0 1 0 0-1 0-1 0 0 0 | 0 0 | 0 1 | 0 |
| 3 | 0 0 0 0-1 0 0 0 1 1-1-1-1 0-1 1 | 0 0 | 1 0 | 0 |
| 4 | 0 0 0 0-1 1 1 1 1 0-1-1 0-1 0 1 | 0 0 | 1 1 | 0 |
| 5 | 0 0 0 0 0 0 0 0 0 0 0 0 0 0 0 0 | 0 1 | 0 0 | 1 |
| 6 | 0 0 0 0 0-1-1 1 0-1 0 0-1 1 1 0 | 0 1 | 0 1 | 0 |
| 7 | 0 0 0 0-1-1-1 0 1 0 0-1-1 1 0 1 | 0 1 | 1 0 | 0 |
| 8 | 0 0 0 0-1 0 0 1 1-1 0-1 0 0 1 1 | 0 1 | 1 1 | 0 |
| 9 | 0 0 0 0 1 0 1 0-1 0-1 0 1 0-1 0 | 1 0 | 0 0 | 0 |
| 10 | 0 0 0 0 1-1 0 1-1-1-1 0 0 1 0 0 | 1 0 | 0 1 | 0 |
| 11 | 0 0 0 0 0-1 0 0 0 0-1-1 0 1-1 1 | 1 0 | 1 0 | 0 |
| 12 | 0 0 0 0 0 0 1 1 0-1-1-1 1 0 0 1 | 1 0 | 1 1 | 0 |
| 13 | 0 0 0 0 1 1 0 0-1 1 0 0 1-1 0 0 | 1 1 | 0 0 | 0 |
| 14 | 0 0 0 0 1 0-1 1-1 0 0 0 0 0 1 0 | 1 1 | 0 1 | 0 |
| 15 | 0 0 0 0 0 0-1 0 0 1 0-1 0 0 0 1 | 1 1 | 1 0 | 0 |
| 16 | 0 0 0 0 0 1 0 1 0 0 0-1 1-1 1 1 | 1 1 | 1 1 | 0 |

The decoder in this illustrative example works as follows:

1. the bits number 4 and 5 in XX1 are replaced by bits as shown in a row under column mod XX1;
2. the bits number 4 and 5 in XX2 are replaced by bits as shown in a row under column XX2;
3. all possible replacements may be considered. However when the changes result in identical decoded sequences YY1 and YY2 then the correct sequence is identified. This is shown by the first 1 in the column under 'correct'. One can see that at that time YY1-YY2 is all 0. Further decoding can then be halted.

As stated before it is assumed that errors are restricted to maximal 3 consecutive positions in either or both sequences XX1 and XX2 when considering corresponding positions. Further more no further errors should happen for a certain number of bits. This in order to make sure that appropriate comparison can take place. For this pattern there should not be any further errors for at least 3 more bits. This in order to make sure that the sequence in row 2 is not wrongly identified as being correct.

One can change 3 bits in each sequence using the above procedure. However changing 4 or more bits will generate more than 1 as correct identified sequences while such a sequence may not be identical to the original one. Such an 'as correct' identified sequence may still contain errors. However these errors are not catastrophic.

The illustrative example shows that one will have to create an error-detecting/correcting strategy even if one knows that only 3 consecutive errors can occur. One may then conclude that errors have taken place on bit 7 or earlier. One can 'step' back the 3-bit changes in 1 and 2 positions to find the correct sequence. In this case that means that 8*8*8 calculations (changes and comparisons) may have to be executed to identify and correct the errors. Unless one uses a method to determine if the sequences are error-free from a certain position going forward (this is another aspect of the present invention described later) one has to conduct all the comparisons.

In order to be able to deal with errors at the end of a sequence one should end each coded sequence with a 'known' tail such as [0 1 0] in the illustrative example. Later as another aspect of the invention a method will be disclosed that will enable a coded sequence to end in a known state without adding 'tail' symbols.

An illustrative example of a procedure for detecting and correcting errors in a received ½ coding rate sequence using the 3-element shift register coding method can be:

1. Take a reasonable number of bits and separate these into two appropriate sequences (if required apply de-interleaving). In the example the number is 32, creating 2 16-bit sequences.
2. Decoding the sequences and determine if the results are identical;
3. If the results are identical no action is required. If the results are not identical then determine where the first difference occurs;
4. Go back 2 bits from the first error; do that in each sequence as starting point. Use the shown method applying all possible changes for three bits in the received sequences starting at said starting point and determine the decoded sequences using the changed sequences. Determine if the decoded changed sequences are identical. If that is the case the errors have been detected and corrected. If not repeat the process starting at the next bit. If that does not work move to the next position. If that does not work then the BER exceeds the capability of the selected decoders.
5. It is assumed that the rest of the sequence is error free and the sequences are moved up 16 minus 3 positions. If not move up to the next error minus 3 position and repeat the process so that again 16 bits sequences can be analyzed.
6. How long the analyzed sequences should be depends on the expected BER, the cost of hardware and requirements on latency because of decoding processing.
7. When more consecutive errors can occur then can be corrected with the illustrative coders and decoders one should use longer coders and decoders;
8. Alternatively one can use decoding methods that changes more bits but that may not correct all errors but that will prevent catastrophic errors
9. One should replace the errors in the incoming signals by the determined correct signals as to 'undo' the errors and the following catastrophic errors.

While the choice of the coders and decoders length and the length of the to be analyzed sequence depend on the error performance, the method using coders and decoders is shown to be effective as error correcting coding and decoding method for n-valued sequences and coders/decoders.

In the binary case using XOR functions the scramblers and coders and descramblers and decoders of FIG. 4 and FIG. 5 and FIG. 6 and FIG. 7 have identical performance. For ease of use the scrambling/descrambling versions of FIG. 4 and FIG. 5 will be used in the binary illustrative examples. However it should be apparent to those skilled in the art that the configuration of FIG. 6 and FIG. 7 can be used as well. In fact the method applies to any n-valued configuration.

Figure 10:
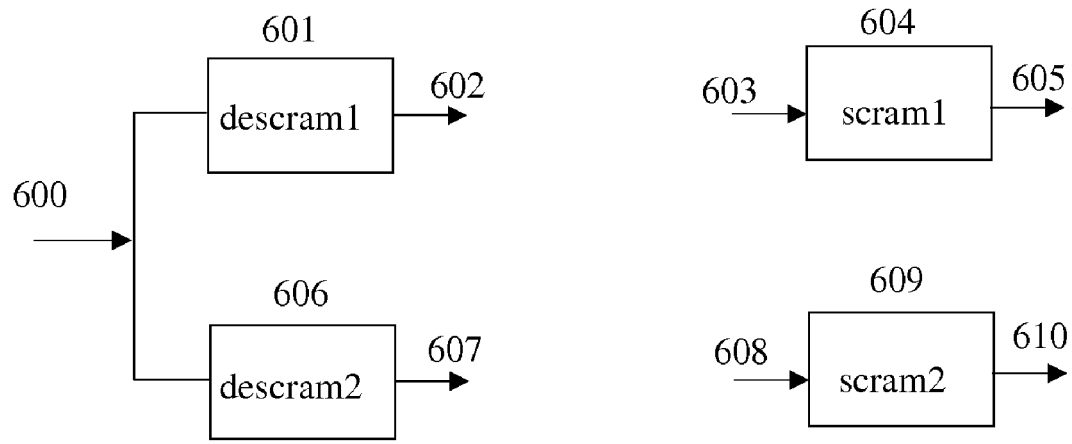
FIG. 10 is a block diagram of a dual coder/decoder combination.
Figure 11:
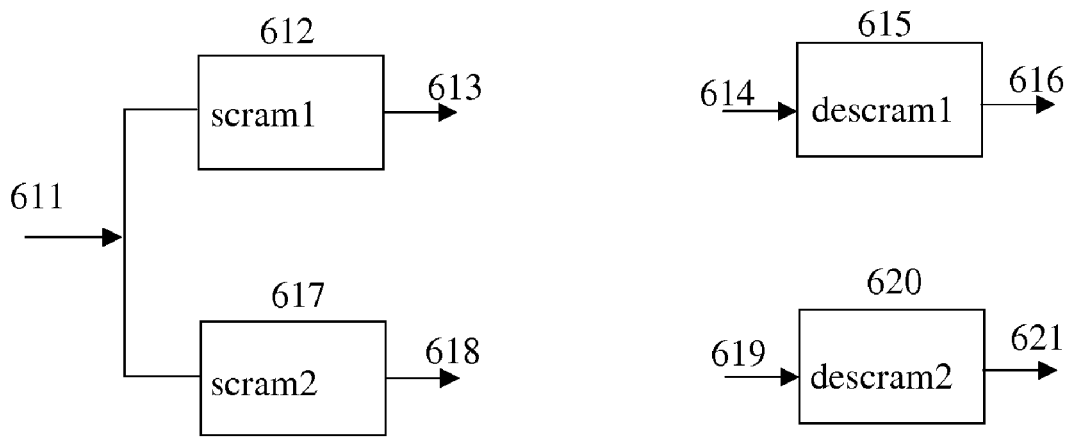
FIG. 11 is a block diagram of another dual coder/decoder combination.
Figure 12:
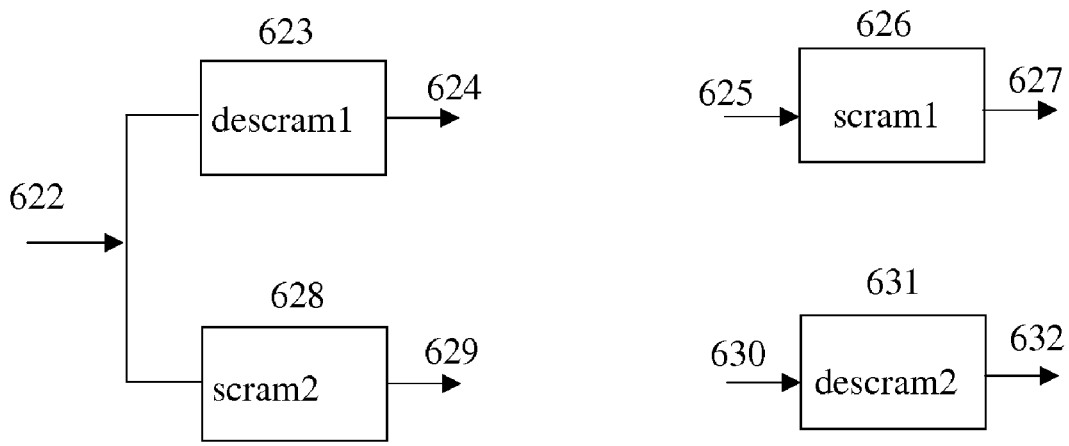
FIG. 12 is a block diagram of another dual coder/decoder combination.

FIG. 10, FIG. 11 and FIG. 12 show different aspects of the error correcting configurations of the present invention. FIG. 10 is the configuration wherein two signal coders 601 and 606 are formed by descrambler circuits and the decoders 604 and 609 by scrambler circuits. This means that the output signals on 605 and 610 of the decoders 604 and 609, when an error occurs in the transmitted coded signal, will always be different after the error occurs. The reason for that is that the scrambler circuit with the wrong setting will continue to produce a wrong signal once it has started to be wrong. In other words: an error will be a catastrophic error. Once the error (or errors) in the signals provided on 603 and 608 are corrected the output signals on 605 and 610 will be equal. For the error correcting method to work it has to 'know' where the errors occurred. This can be established by assuming a range of bits wherein errors may have occurred. Only when the output signals are identical is it known that the correct start of the errors has been identified.

A different aspect of the present invention is provided by the configuration of FIG. 11 wherein the coders 612 and 617 are standard but different LFSR scramblers, which will scramble the incoming signal on 611. The decoders 615 and 620 are the corresponding descramblers. The descramblers will flush an error, so that the outputs on 616 and 621 will be identical after the errors have been flushed. This is shown in the following illustrative example.
SEQ=[1 1 0 1 0 0 0 1 1 0 1 0 0 1 1 1]
XX1=[0 0 1 0 0 0 1 1 1 1 0 0 1 0 0 0]
XX2=[0 1 0 1 1 0 1 0 1 0 1 0 0 0 1 0]

An input sequence SEQ is scrambled by two different scramblers, the results are combined and transmitted, received and separated again. The result is two sequences XX1 and XX2 which will be inputted to the corresponding descramblers thus generating YY1 and YY2.
YY1=[1 1 0 1 1 1 1 0 1 0 1 0 0 1 1 1]
YY2=[1 1 0 1 1 1 0 0 1 0 1 0 0 1 1 1]

The output signals differ on bit 7. That means that one or more errors could have occurred in bit 4, 5, or 6 of XX1 and/or XX2. After bit 7 no error has occurred. Like in the previous method the assumed or suspected bits can be changed until the generated output signals are identical. Because the shift registers in the scramblers have 3 elements one can only correct 3 consecutive errors with confidence. For illustrative purposes 2 bits will be changed in XX1 and XX2 related to bits 4 and 5. The following table shows the differences between the two output sequences YY1-YY2.

| | YY1-YY2 | mod XX1 | mod XX2 | correct |
|---|---|---|---|---|
| 1 | 0 0 0 1 0 1 0 -1 0 0 0 0 0 0 0 0 | 0 0 | 0 0 | 0 |
| 2 | 0 0 0 1 1 0 0 0 0 0 0 0 0 0 0 0 | 0 0 | 0 1 | 0 |
| 3 | 0 0 0 0 1 1 1 -1 0 0 0 0 0 0 0 0 | 0 0 | 1 0 | 0 |
| 4 | 0 0 0 0 0 0 1 0 0 0 0 0 0 0 0 0 | 0 0 | 1 1 | 0 |
| 5 | 0 0 0 1 -1 0 -1 0 0 0 0 0 0 0 0 0 | 0 1 | 0 0 | 0 |
| 6 | 0 0 0 1 0 -1 -1 1 0 0 0 0 0 0 0 0 | 0 1 | 0 1 | 0 |
| 7 | 0 0 0 0 0 0 0 0 0 0 0 0 0 0 0 0 | 0 1 | 1 0 | 1 |
| 8 | 0 0 0 0 -1 -1 0 1 0 0 0 0 0 0 0 0 | 0 1 | 1 1 | 0 |
| 9 | 0 0 0 0 -1 0 -1 -1 0 0 0 0 0 0 0 0 | 1 0 | 0 0 | 0 |
| 10 | 0 0 0 0 0 -1 -1 0 0 0 0 0 0 0 0 0 | 1 0 | 0 1 | 0 |
| 11 | 0 0 0 -1 0 0 0 -1 0 0 0 0 0 0 0 0 | 1 0 | 1 0 | 0 |
| 12 | 0 0 0 -1 -1 -1 0 0 0 0 0 0 0 0 0 0 | 1 0 | 1 1 | 0 |
| 13 | 0 0 0 0 0 0 1 0 0 0 0 0 0 0 0 0 | 1 1 | 0 0 | 0 |
| 14 | 0 0 0 0 1 0 0 1 0 0 0 0 0 0 0 0 | 1 1 | 0 1 | 0 |
| 15 | 0 0 0 -1 1 1 1 0 0 0 0 0 0 0 0 0 | 1 1 | 1 0 | 0 |
| 16 | 0 0 0 -1 0 0 1 1 0 0 0 0 0 0 0 0 | 1 1 | 1 1 | 0 |

It is clear that at row 7 the correct output sequence has been identified. The results of YY1-YY2 also show that 3 bits after a change (or error) the error will have been flushed. Changing more than 3 bits in a coder/decoder that applies 3 elements shift registers will introduce non-valid solutions.

It is another aspect of the present invention to create methods to correct more than 3 consecutive errors by using coders with longer shift registers. To those skilled in the art it should be clear how the methods can be expanded to correct longer error bursts. As an illustrative example the earlier sequence SEQ will be coded with two 4-element shift register scramblers and decoded with the corresponding descramblers such as shown in FIG. 13 and FIG. 14 and FIG. 15 and FIG. 16.
SEQ=[1 1 0 1 0 0 0 1 1 0 1 0 0 1 1 1]
XX1=[1 0 1 0 1 0 1 1 1 0 1 1 0 0 1 1]
XX2=[1 0 0 0 1 1 1 0 0 1 1 1 1 1 1 1]

Errors have been introduced into both XX1 and XX2:
XX1e=[1 1 0 1 0 0 1 1 1 0 1 1 0 0 1 1]
XX2e=[1 0 1 1 1 1 1 0 0 1 1 1 1 1 1 1]

Descrambling the sequences XX1e and XX2e will create:
YY1e=[1 0 0 1 1 1 0 1 0 0 1 0 0 1 1 1]
YY2e=[1 1 1 1 1 0 1 0 1 0 1 0 0 1 1 1]

The last error is located at bit 9. Because the descramblers use 4-element shift registers, the last error could have started at 9-4=bit 5. The first error could have started after bit (5-4)=1. The bit after 1 is bit 2. This is where the first error was located. By checking each result (YY1-YY2) for each input XX1 and XX2 wherein each combination of bits 2, 3, 4 and 5 can occur, the corrected sequence can be identified.

Another aspect of the present invention is an error-correcting coding method wherein one of two coders is a scrambler and another one is a descrambler. One of the two possible configurations is shown in FIG. 12. Herein coder 623 is a descrambler and coder 628 is a scrambler. Consequently decoder 626 should be a scrambler and decoder 631 should be a descrambler. In case of errors the decoder 626 will create continuous wrong signals or catastrophic errors. After errors are flushed 631 will again provide correct output. Because one sequence may be assumed to be correct at a certain stage (for instance because the uncoded sequence is also available), it is possible to 'restart' the sequence with a catastrophic error moving forward. This is demonstrated in the following illustrative example. Again the sequence SEQ is used. It is processed by a descrambler to generate XX1 and by a scrambler to create XX2. Errors are introduces in the $5^{th}$ bit of both XX1 and XX2 which will create XX1e and XX2e. XX1e is decoded by a scrambler into YY1e and will demonstrate catastrophic error propagation. XX2e will be decoded by a descrambler into YY2e and after a number of bits will generate the correct sequence.
SEQ=[1 1 0 1 0 0 0 1 1 0 1 0 0 1 1 1]
XX1=[0 1 1 1 0 1 1 1 0 0 1 0 1 0 0 1]
XX2=[0 1 0 1 0 0 1 0 1 0 1 0 0 0 1 0]

XX1 and XX2 with error in bit 5:
XX1=[0 1 1 1 1 1 1 1 1 0 0 1 0 1 0 0 1]
XX2=[0 1 0 1 1 0 1 0 1 0 1 0 0 0 1 0]

This will generate the decoded sequences YY1e and YY2e:
YY1e=[1 1 0 1 1 1 0 1 0 1 1 0 1 0 1 1]
YY2e=[1 1 0 1 1 1 0 0 1 0 1 0 0 1 1 1]

For illustrative purposes it is assumed that one can be fairly confident that YY2e is correct and error free as of bit 11. That means one can be confident that [1 0 0 1 1 1] represents a correct output of the sequence. That means that the remainder of XX1e as of bit 11, which is [1 0 1 0 0 1] should produce [1 0 0 1 1 1]. In order to restart correct decoding of XX1 one does only have to determine the required state of the shift register when initialized for correct decoding. For the illustrative example the state of the decoder shift register should be [0 1 1] for the rest of the sequence to be decoded correctly.

It is another aspect of the present invention to determine the correct state of the shift register of a decoder when the input signals are known. One can use this knowledge to restart correct decoding of a signal after it was known that an error has occurred and it may be assumed that the input signal at the present and following positions does not comprise errors. All shift register based coders and decoders in the present invention can be realized with binary and non-binary shift registers. Because all coders/decoders are reversible the signals are generated in a deterministic and reversible way. This means that when the input signal is known and the shift register content is known the output can be determined. When the output is known and the shift register content is known the input signal can also be determined.

When input signals are known over the length of the shift register the content of the shift register can be determined, when one knows that two different decoders (with feedback such as the scrambler) with identical length shift register have to generate identical output signals. In a first illustrative example assume that a scrambler as shown in FIG. 4 uses two commutative self-reversing n-valued functions 'sc1' and 'sc2'. This means that (a sc1 b)=(b sc1 a). It also means that when c=(a sc1 b) then a=(c sc1 b) and a=(b sc1 c). Assume that a 3 symbol signal [x1 x2 x3] is inputted on 308 and as a result [y1 y2 y3] is outputted on 307. When the symbol x1 of [x1 x2 x3] is inputted the elements 303, 304 and 305 of the shift register contain [r1 r2 r3]. The device 302 with function 'sc2' provides a signal 'temp1' at the start which is inputted to device 309 with function 'sc1'. Over the duration of the input the signal [temp1 temp2 temp3] is provided to 309.

One can then write the following equations for the signals:

temp1=r2 sc2 r3 y1=x1 sc1 temp1 temp2=r1 sc2 r2 y2=x2 sc1 temp2 temp3=y1 sc2 r1 y3=x3 sc1 temp3

Which provides:

temp3=y3 sc1 x3 r1=y1 sc2 (y3 sc1 x3)

temp2=y2 sc1 x2 r2=r1 sc2 temp2 r2={y1 sc2 (y3 sc1 x3)} sc2 {y2 sc1 x2} temp1=x1 sc1 y1 r3=r2 sc2 temp1 r3={y1 sc2 (y3 sc1 x3)} sc2 {y2 sc1 x2} sc2 {x1 sc1 y1}.

This shows that the content of the shift register [r1 r2 r3] can be determined directly from the input and output signals. Those skilled in the art will notice that this approach can also be used for non-commutative reversible devices. The above equations also hold for the circuit of FIG. 5 wherein the signal on 311 is [x1 x2 x3] the output on 317 is [y1 y2 y3] the content of 313, 314 and 315 initially is [r1 r2 r3] and the signal generated by 312 is [temp1 temp2 temp3].

Figure 17:
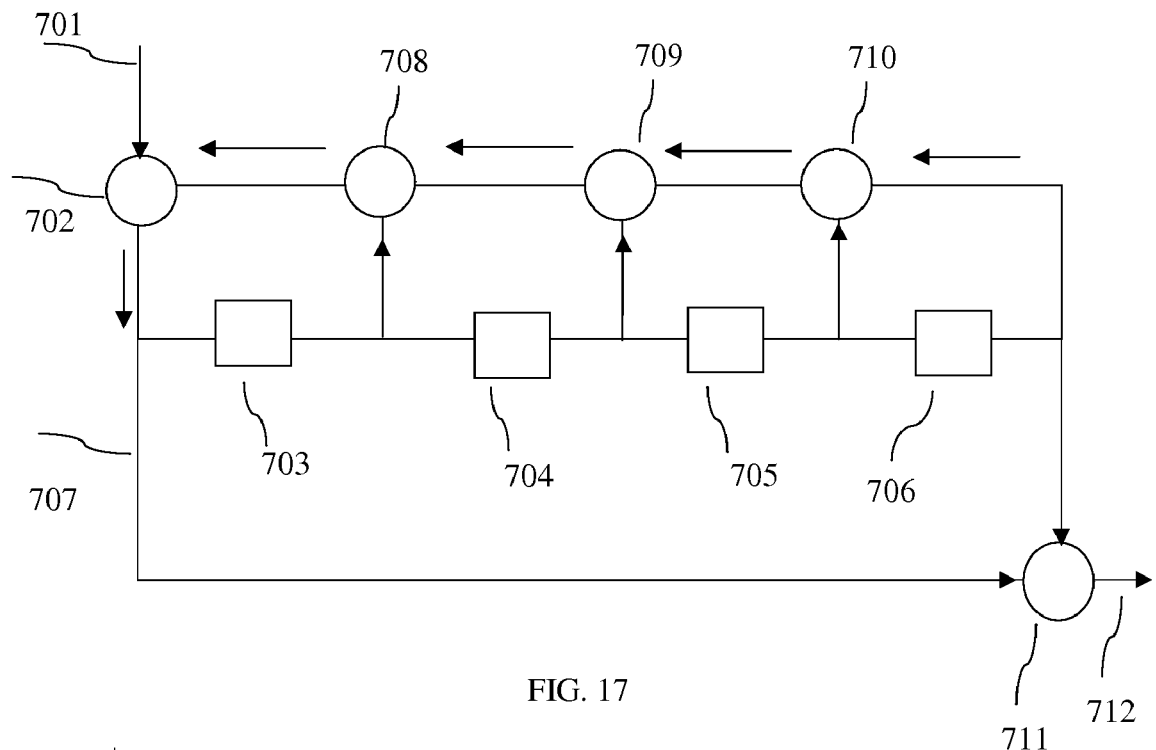
FIG. 17 is a diagram of a Recursive Systematic Convolutional coder.

Sometimes a different but related shift-register based coder unit is applied in the generation of what are known as Recursive Systematic Codes (RSC). An illustrative example of part of such a coder is shown in FIG. 17. Such a coder is actually a modified LFSR scrambler. The diagram of FIG. 17 shows a 4 element shift register based scrambler, with three taps connected to reversible logic devices 708, 709 and 710. The feedback signal is combined with the to be scrambled signal on 701 through a device 702. In one known configuration the output signal would be provided on 707. However in the current configuration of FIG. 17 the signal on 707 is provided to yet another reversible device 711 where it is combined with the output of the last element of the shift register into an output signal on 712. In the binary case the combining devices will in general execute the binary XOR function. The EQUAL function can also be used. In n-valued applications the functions should be reversible. Clearly this requires careful selection and connection of the devices as many of the functions that can be applied are non-commutative. In the binary case, whatever the configuration on number of elements in shift register and number of taps and whatever the used function (XOR or EQUAL) the coder and decoder apply the same functions in corresponding positions. The coder in binary form as shown is known. However n-valued coders using the structure of FIG. 17 are novel and are another aspect of the present invention.

Figure 18:
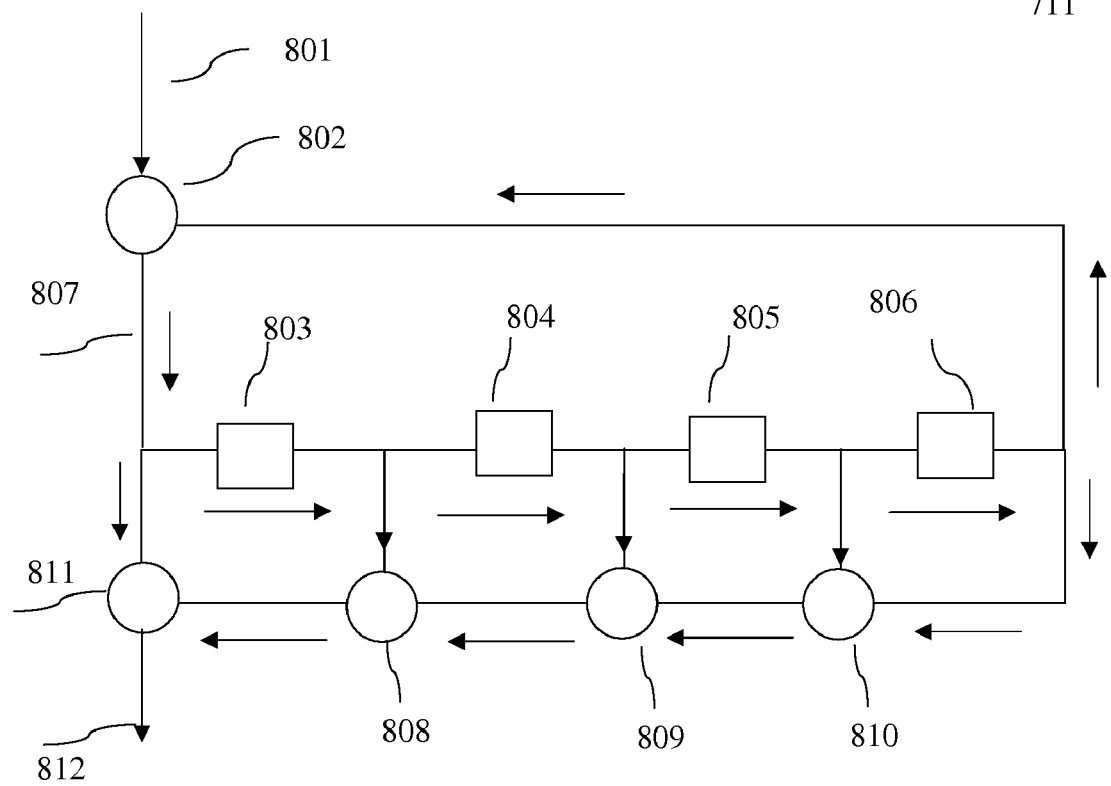
FIG. 18 is a diagram of a Recursive Systematic Convolutional decoder.

Another aspect of the current invention is the structure of a shift register based decoder that will decode the signal as generated by a coder with the structure as provided in FIG. 17. This structure is provided in FIG. 18 and is another aspect of the present invention. Assuming that an n-valued signal is provided on 701 in the coder of FIG. 17 and a coded signal is outputted on 712, with an initial content of the shift register elements 703, 704, 705 and 706. When this coded signal is provided on input 801 of the decoder of which a diagram is shown in FIG. 18 and the initial state of the shift register elements 803, 804, 805 and 806 is the same as the initial state of the shift register elements of the coder of FIG. 17, then the decoder of FIG. 18 will generate a signal on output 812 that is identical to the input on 701 of the coder in FIG. 17. All devices in FIG. 17 and FIG. 18 should execute reversible n-valued (with n is integer 2 or greater) logic functions. Device 708 executes the same function as 808, device 709 executes the same function as 809 and device 710 executes the same function as 810. Devices 712 and 802 execute each others reverse function and also devices 702 and 812 execute each others reverse function.

Throughout this Patent Application the terms 'structure' and 'configuration' are used which cover the general distinguishing elements of coders and decoders. While for instance illustrative examples with 4-element shift registers are used it is understood that the terms 'configuration' and 'structure' cover coders and decoders with shift register with more or fewer elements and with more or fewer taps and devices, but fall in one of three classes of coders/decoders. The present invention recognizes three basic structures: the structure of FIG. 4 and FIG. 5, the structure of FIG. 6 and FIG. 7; and the structure of Recursive Systematic Convolutional coders and decoders, to be provided in detail later.

The coder and decoder with the structure as shown in FIG. 17 and FIG. 18 can also be used in n-valued logic configurations. When the functions are commutative and self-reversing all corresponding functions in coders and decoders are the same. As an illustrative example a ternary coder will be designed with its corresponding ternary decoder. The ternary coder has the configuration as in FIG. 17. Device 702 in FIG. 17 uses a ternary logic function 'scter1', all other devices use the ternary logic function 'scter2'. In the decoder of FIG. 18 the devices in the scrambler part: 808, 809 and 810 will also apply 'scter2'. However the device 802 reverses 711 and device 811 reverses 702. Consequently device 811 executes function 'dter1' and device 802 executes function 'dter2'. The structure of the coders and decoders remains as shown in FIG. 17 and FIG. 18. The truth tables of 'scter1', 'scter2', 'dter1' and 'dter2' are shown in the following tables.

| scter1 | 0 | 1 | 2 | scter2 | 0 | 1 | 2 | dter1 | 0 | 1 | 2 | dter2 | 0 | 1 | 2 |
|---|---|---|---|---|---|---|---|---|---|---|---|---|---|---|---|
| 0 | 1 | 0 | 2 | 0 | 0 | 2 | 1 | 0 | 2 | 0 | 1 | 0 | 0 | 1 | 2 |
| 1 | 2 | 1 | 0 | 1 | 1 | 0 | 2 | 1 | 0 | 1 | 2 | 1 | 1 | 2 | 0 |
| 2 | 0 | 2 | 1 | 2 | 2 | 1 | 0 | 2 | 1 | 2 | 0 | 2 | 2 | 0 | 1 |

It should be clear to those skilled in the art that care should been taken in the order of execution, and thus of the order of inputs to the devices as the scrambling functions are not commutative. The methods for coding and decoding shown in FIG. 17 and FIG. 18 and illustrated with a ternary example can also be executed in n-valued logic with n greater than 2. The core scrambler and descrambler which are part of the method follow the design rules as part of recited patent application Ser. No. 10/935,960. It should be clear to those skilled in the art that the LFSRs can have other number of shift register elements and different feedback taps as well as different feedback functions without changing the validity of the methods here provided.

Each of the coding and decoding configurations can be applied to detect and correct errors. For illustrative purposes ternary or 3-valued examples will be shown. These examples can be extended to n-valued solutions with n an integer greater than 3. All examples will apply the reversible ternary logic functions 'sc1', 'sc2', 'ds1' and 'ds2'. The functions 'sc1' and 'ds1' are each others reversing function. The same applies to the functions 'sc2' and 'ds2'. The examples provided can be much simpler but are then less generic when self-reversing functions are used. The following table shows the truth tables for the ternary functions.

| sct1 | 0 | 1 | 2 | sct2 | 0 | 1 | 2 | ds1 | 0 | 1 | 2 | ds2 | 0 | 1 | 2 |
|---|---|---|---|---|---|---|---|---|---|---|---|---|---|---|---|
| 0 | 1 | 0 | 2 | 0 | 0 | 2 | 1 | 0 | 2 | 0 | 1 | 0 | 0 | 1 | 2 |
| 1 | 2 | 1 | 0 | 1 | 1 | 0 | 2 | 1 | 0 | 1 | 2 | 1 | 1 | 2 | 0 |
| 2 | 0 | 2 | 1 | 2 | 2 | 1 | 0 | 2 | 1 | 2 | 0 | 2 | 2 | 0 | 1 |

Figure 13:
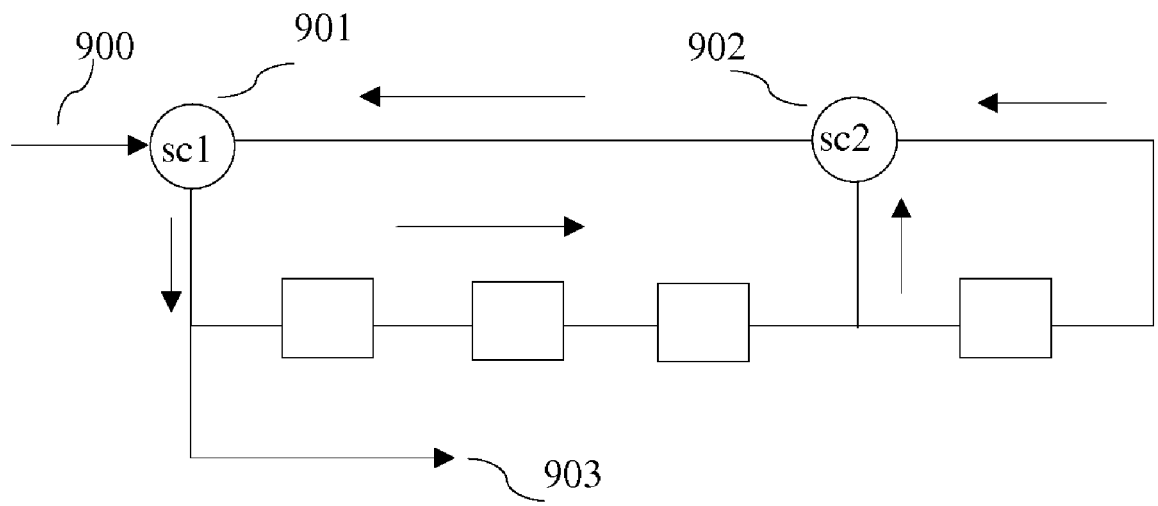
FIG. 13 is a diagram of a shift register based coder.
Figure 14:
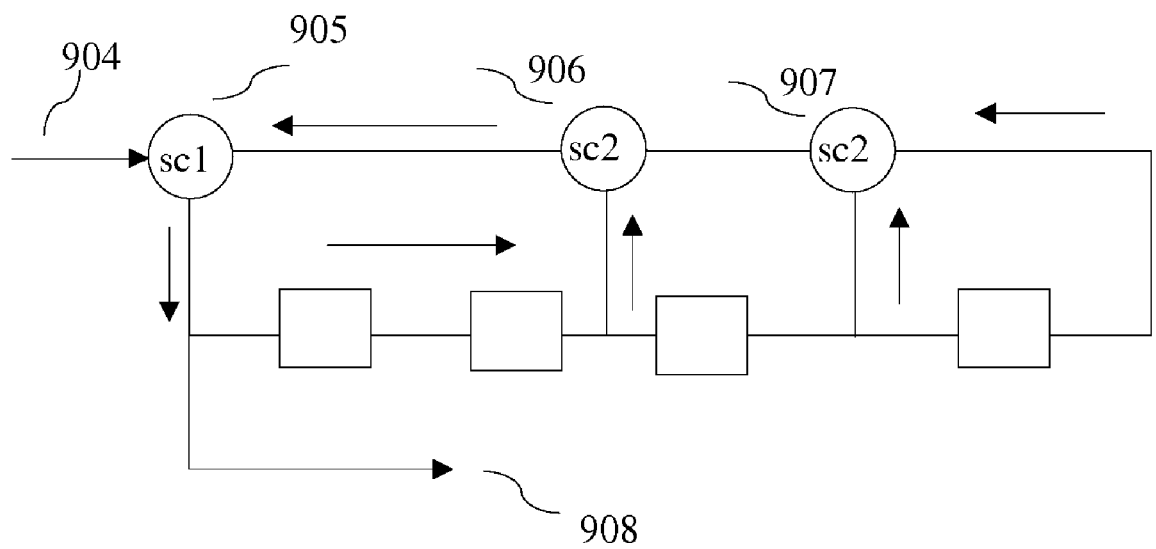
FIG. 14 is a diagram of another shift register based coder.
Figure 15:
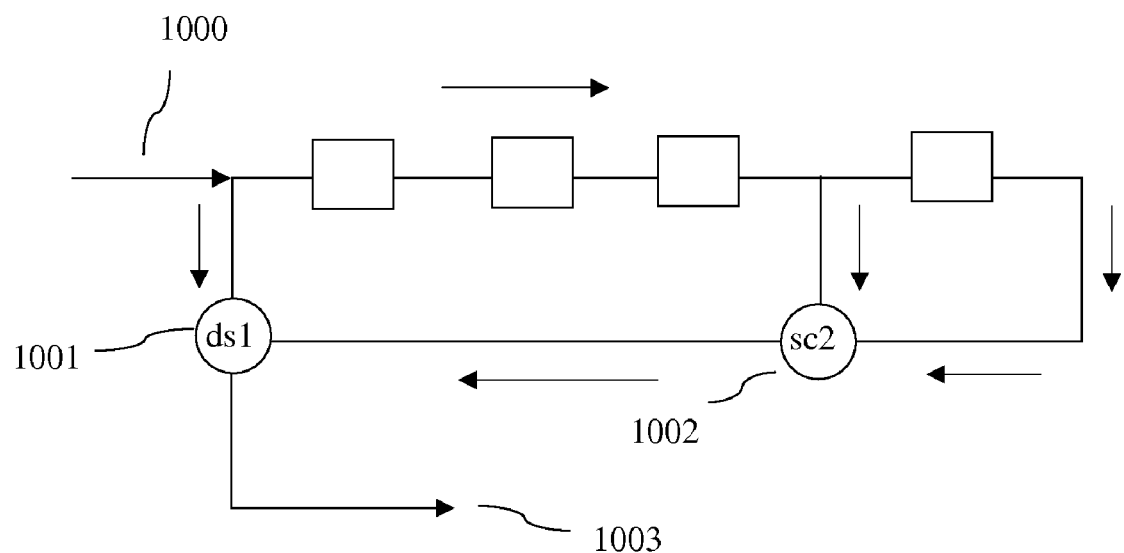
FIG. 15 is a diagram of a shift register based decoder.
Figure 16:
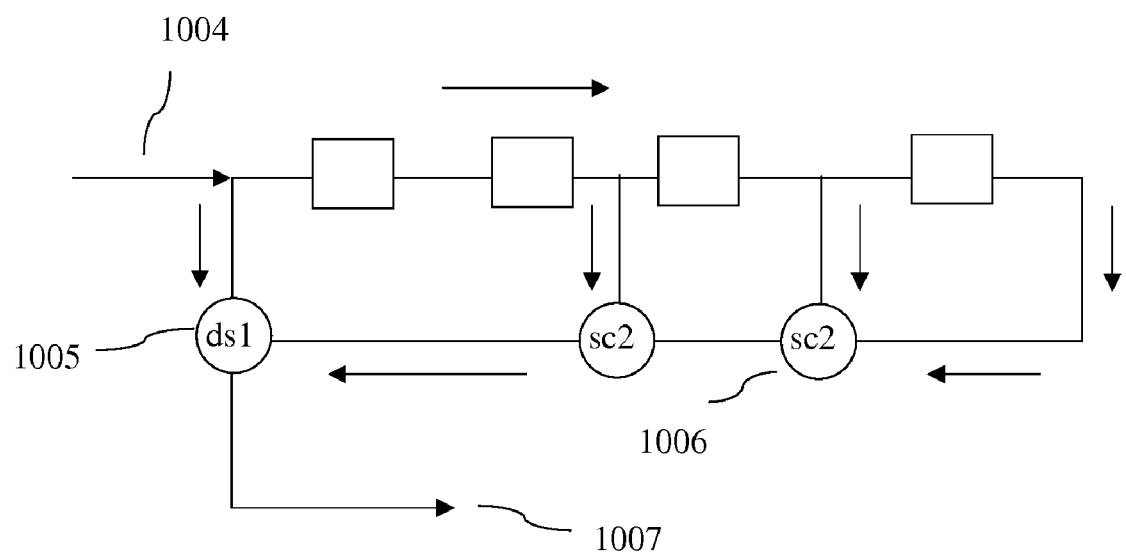
FIG. 16 is a diagram of another shift register based decoder.

The first ternary example uses the coders and decoders as shown in FIG. 13 and FIG. 14 and FIG. 15 and FIG. 16. Assume the circuit of FIG. 13 as the coder. Then it has FIG. 15 as its decoder. When FIG. 14 shows a coder then FIG. 16 is its decoder. For the illustrative examples it is assumed that all circuits start with identical initial 4-element ternary symbol shift registers [1 2 0 1]. Clock signals are not shown but are assumed. FIG. 13 is an LFSR scrambler where a signal is inputted on 900 of a device 901 with function 'sc1' and outputted on 903. The scrambler has one tap from the third element of the shift register which is inputted into device 902 with function 'sc2' and combined with the required output of the last element of the shift register. Its decoder is shown in FIG. 15. The descrambler is almost a mirror image of the scrambler. Device 1002 also executes function 'sc2'. However device 1001 is the reverse of 9001 and executes 'ds1'. Assume the following input sequence SEQ3 on 900 and on 904:

SEQ3=[0 0 2 2 0 1 2 1 1 0 2 1 2 0 1 1 2 0 1]

The device of FIG. 13 will generate on 903:

XX1=[2 2 1 1 1 1 0 2 2 0 2 2 1 0 2 1 2 0 1] and the device of FIG. 14 will generate on 908:

XX2=[2 0 0 1 2 0 0 0 0 1 0 0 1 0 0 0 2 1 1]

XX1 and XX2 will be transmitted and received. Assume that two errors (fewer than 4) take place in XX1(4), XX1(5), XX2(4) and XX2(5) such that those symbols assume state 2. So the received sequences are:

XX1e=[2 2 1 2 2 1 0 2 2 0 2 2 1 0 2 1 2 0 1] inputted on input 1000 of the circuit of FIG. 15 and XX2e=[2 0 0 2 2 0 0 0 0 1 0 0 1 0 0 0 2 1 1] on input 1004 of the circuit of FIG. 16.

This will result in:

YY1=[0 0 2 0 1 1 1 1 2 0 2 1 2 0 1 1 2 0 1] on output 1003 and

YY2=[0 0 2 0 0 0 1 2 1 0 2 1 2 0 1 1 2 0 1] on output 1007.

In the here applied configuration the decoders are flushed after the error has left the shift register.

One can create a detection mechanism by comparing decoded sequences that detects where the two sequences YY1 and YY2 are identical: from symbol 1 to symbol 4 and from symbol 10 onward. In order to correct errors early in the sequence one may want to lead each sequence will a known start. In order to correct the present error one has to go back from the last error position a number of (2*p+1) wherein p is the length of the shift register. Then one has to determine all possible states of the signal from that and the following two positions in the sequence and determine their related decoded outputs. When thus the results of the outputs YY1 and YY2 are identical one has found the correct sequence. In some situations (assuming that the number of errors will not be greater than the length of the shift register, one may have to create a strategy to 'hunt' for the error start).

The configurations that use either FIG. 15 or FIG. 16 as its decoders bring the advantage of flushing the shift register. This provides a clear indication when errors have "passed" and the signal can be assumed to be error-free.

Bridging and Correcting Errors

It is another aspect of the present invention to correct errors from at least two sequences generated from an identical sequence by:

1. determining where at least two received sequences have their last correct symbols before errors occur;
2. determining where errors in the at least two sequences stop and unaffected symbols again occur; and
3. in a further step bridge the part of a sequence with errors by calculating the correct symbols.

One can use this method by to more than two sequences generated from a single sequence, by analyzing pairs of sequences.

Figure 19:
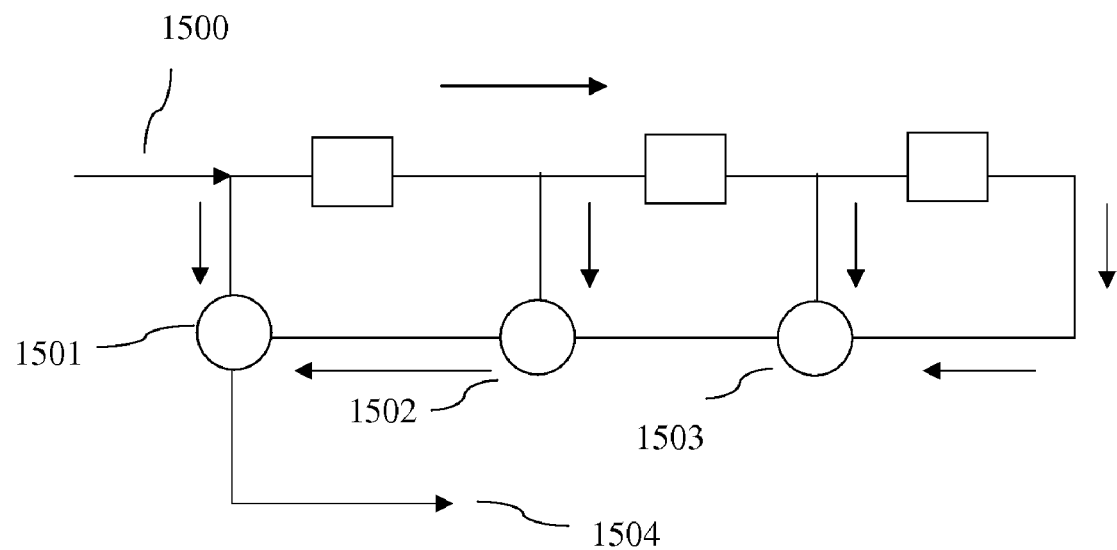
FIG. 19 is a diagram of a shift register based coder.
Figure 20:
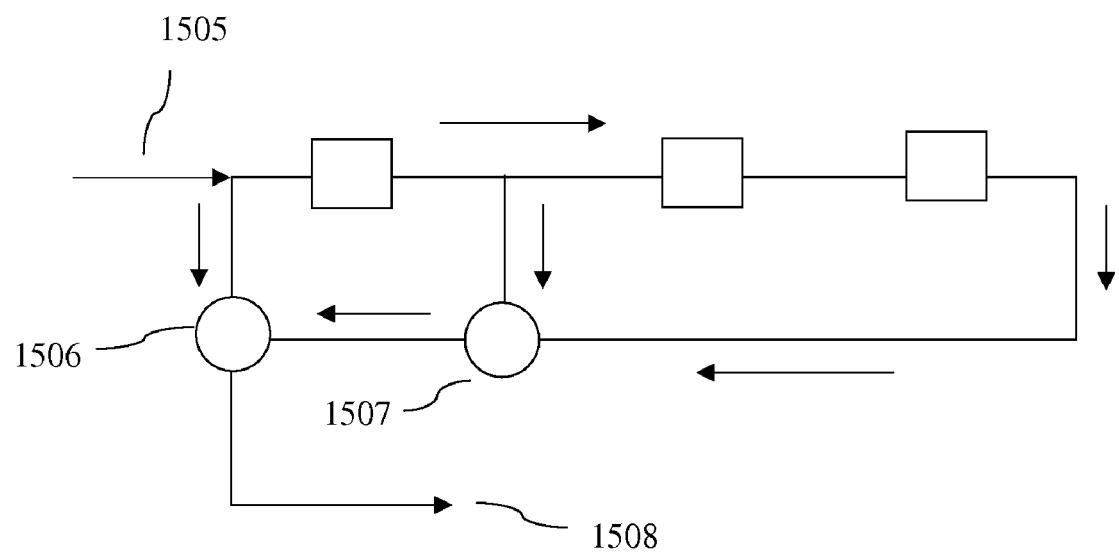
FIG. 20 is a diagram of another shift register based coder.

One can apply this method to different coding rates and different polynomials applied in the coders, for different n-valued coded sequences. For binary illustrative purposes a coding rate ½ is used, created by 2 3-bit shift register based coders. Assume that the coders code a binary sequence SEQ into 2 different binary sequences XX1 and XX2 which are combined for transmission and can be adequately separated for decoding. The following table shows the original binary sequence SEQ, its coded versions XX1 and XX2. The related coders are shown in the diagrams of FIG. 19 and FIG. 20. All devices 1501, 1502, 1503, 1506 and 1507 in this example execute the binary XOR function.

The purpose of having a sufficiently long enough clear path is that when it is possible to restart correct decoding then the decoded following sequences as a result of XX1 and XX2 should be identical. When the decoded sequences are different then the used input signals were clearly containing errors.

The first step in identifying a place for restarting correct decoding is selecting a decoding starting point. Based on the assumptions of maximal 3 errors it should be sufficient to start decoding on the 4th symbol after the first identified error. Assume that as of bit 8 in XX1 and XX2 the symbols are received correctly. If that is the case then both the decoders of FIG. 21 and FIG. 22 should generate identical output signals.

| SEQ | 1 | 1 | 0 | 1 | 0 | 0 | 0 | 1 | 1 | 0 | 1 | 0 | 0 | 1 | 1 | 1 |
| --- | - | - | - | - | - | - | - | - | - | - | - | - | - | - | - | - |
| XX1 | 0 | 1 | 1 | 1 | 0 | 1 | 1 | 1 | 0 | 0 | 1 | 0 | 1 | 0 | 0 | 1 |
| XX2 | 0 | 0 | 0 | 0 | 0 | 0 | 1 | 1 | 0 | 1 | 0 | 0 | 0 | 0 | 0 | 0 |
| XX1e | 0 | 1 | 1 | 1 | x | x | x | 1 | 0 | 0 | 1 | 0 | 1 | 0 | 0 | 1 |
| XX2e | 0 | 0 | 0 | 0 | x | x | x | 1 | 0 | 1 | 0 | 0 | 0 | 0 | 0 | 0 |

Figure 21:
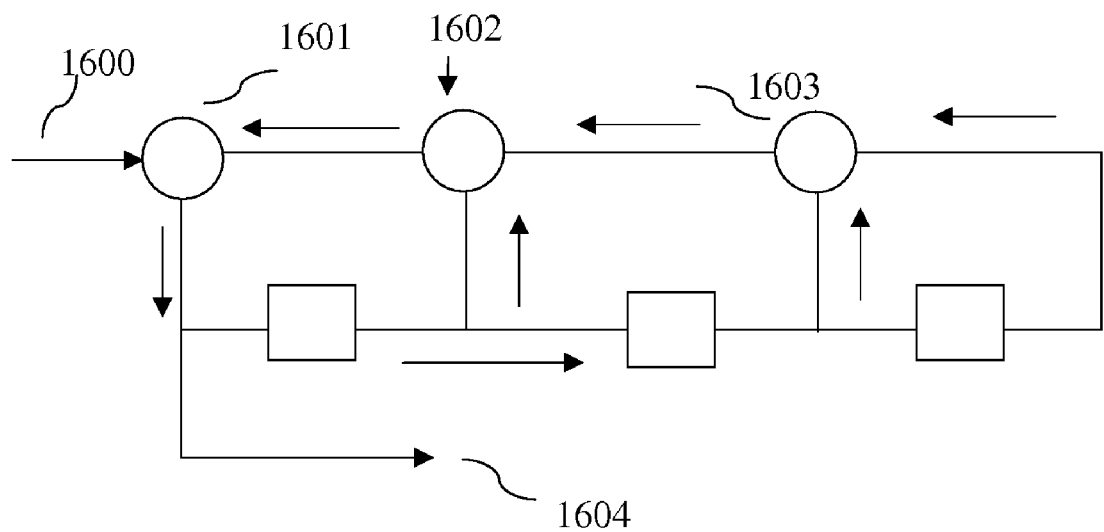
FIG. 21 is a diagram of a shift register based decoder.
Figure 22:
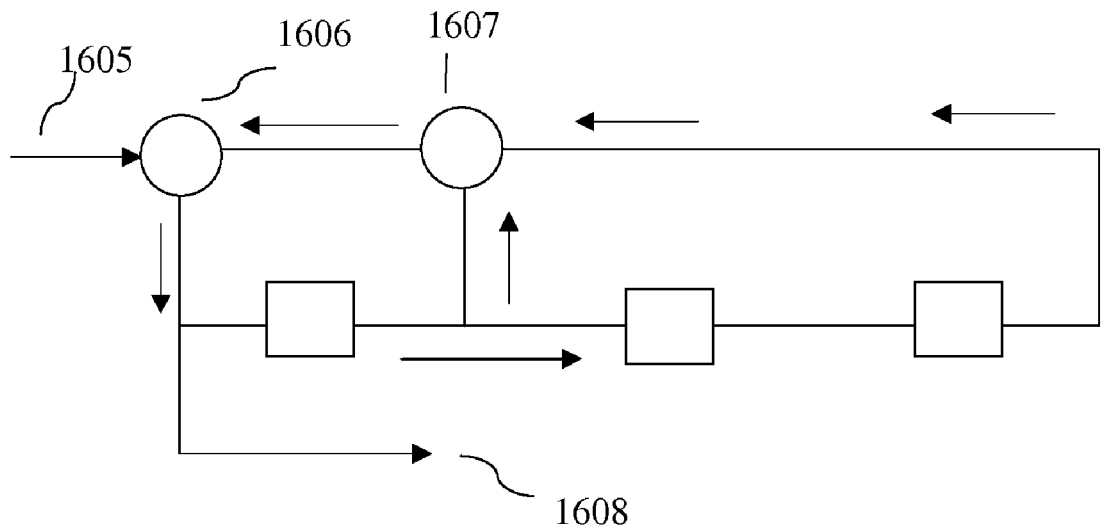
FIG. 22 is a diagram of another shift register based decoder.

The decoders for the sequences are shown in diagram in FIG. 21 and FIG. 22 respectively. The first issue that has to be addressed is where do the errors stop, and accordingly where the correct decoding can be restarted. Using the present coder/decoder configuration without proper restart, may lead to the propagation of errors through the remainder of the sequence after the occurrence of errors. These errors are then called catastrophic errors. Viterbi decoders are in essence maximum-likelihood (ML) decoders used for convolutionally coded signals. In some cases an ML decoder cannot reconstitute a received sequence. This will create an error burst.

The restart method, which is an aspect of the present invention, allows the correct restart of the decoding process, even if not all errors can be corrected. For practical purposes in the illustrative example it is assumed that most errors will occur in a series of maximal 3 consecutive errors in the individual sequences XX1 and XX2, or rather a series of maximal 6 consecutive errors which will overlap in sets of 3 errors (or a series of 5 consecutive errors in the combined sequence, which do not completely overlap in the individual sequences) when the two sequences are combined. A second assumption is that after a series of errors in most of the cases there will be a significant series of error-free symbols. Significant in that sense would be 4 error free symbols individual or 8 error-free consecutive symbols in the combined sequence. For error occurrences with a normal or similar distribution with error probability of p=0.01 or smaller these are very reasonable assumptions. Herein p=0.01 for error probability is very high.

This means that also their shift registers will have identical content. In the illustrative example the two decoders (which are two scramblers) using shift registers with identical content generate two identical outputs under condition of correct inputs. One can run a simulation program having the relevant 3 consecutive received bits of XX1 and XX2 and try all 8 possible initial states of the shift register. There is only one state of the 8 possible binary shift register states (comprised of 3 bits) that will satisfy all conditions. It was assumed that the received sequences XX1 and XX2 at a certain stage become error-free. So using the (in error) calculated state of the shift register as the restart of the decoding process will still create different decoded sequences YY1 and YY2, thus indicating that one should move to later bits of the sequences to calculate a restart point.

In a first embodiment it is possible to determine the correct state by using all possible states of the shift register and determining which (applying the assumed to be correct inputs XX1 and XX2) will generate 3 pairs of identical decoded outputs.

As an illustrative example the following table will take the error free 3-bits part of XX1 and XX2 as coded result of sequence SEQ as shown in a previous table from bits 8 to 10.

|  |  |  |  | YY1(8) | YY1(9) | YY1(10) | YY2(8) | YY2(9) | YY2(10) |
| --- | - | - | - | - | - | - | - | - | - |
| SEQ(8:10) | 1 | 1 | 0 | | | | | | |
| XX1(8:10) | 1 | 0 | 0 | | | | | | |
| XX2(8:10) | 1 | 0 | 1 | | | | | | |
| shift-register | 0 | 0 | 0 | 1 | 1 | 0 | 1 | 1 | 0 |
| shift-register | 0 | 0 | 1 | 0 | 0 | 0 | 0 | 0 | 1 |
| shift-register | 0 | 1 | 0 | 0 | 1 | 1 | 1 | 0 | 1 |
| shift-register | 0 | 1 | 1 | 1 | 0 | 1 | 0 | 1 | 0 |
| shift-register | 1 | 0 | 0 | 0 | 1 | 0 | 0 | 0 | 0 |
| shift-register | 1 | 0 | 1 | 1 | 0 | 0 | 1 | 1 | 1 |
| shift-register | 1 | 1 | 0 | 1 | 1 | 1 | 0 | 1 | 1 |
| shift-register | 1 | 1 | 1 | 0 | 0 | 1 | 1 | 0 | 0 |

One can see in the table that (assuming that the inputs are correct) only the initial shift register situation [0 0 0] will have both decoders generate the same result, being [1 1 0]. This is an illustrative example only. One can run simulation programs with all possible inputs, outputs and shift register states, confirming the conclusion. It should be clear that one can expand this restart decoding approach by exhaustive testing in coders/decoders based on polynomials of a higher degree. However one must then execute of course a greater number of tests.

The restarting state of the decoding shift register is deterministic and not a chance state. It is possible to create a closed expression that can be executed that will create the restarting state. To determine the appropriate expressions for the binary coders/decoders can be done in the following way. It is assumed that the XOR function is used in the coders/decoders. The XOR function (which is modulo-2 addition) is both commutative and associative in properties. The decoder of FIG. 21 has as input [u1 u2 u3]. The decoder of FIG. 22 has as input [v1 v2 v3]. The output of the decoders should be [y1 y2 y3] and the initial state of the shift register is [r1 r2 r3]. Again one is reminded of the fact that the input to the shift registers of both coders is the outputted (and descrambled) signal, which in the error free case should be the same for both decoders. In the next cycle the shift register is [y1 r1 r2]; and the third state is [y2 y1 r1]. Assume that a commutative and associative function 'sc' is executed by the devices (in this example 'sc' is the binary XOR function). The following table shows the valid expressions:

| | |
|---|---|
| y1 | y1 = v1 sc (r1 sc r3) |
| y1 | y1 = u1 sc (r1 sc (r2 sc r3)) |
| | r2 = u1 sc v1 |
| y2 | y2 = u2 sc (y1 sc (r1 sc r2)) |
| y2 | y2 = v2 sc (y1 sc r2) |
| | r1 = u2 sc v2 |
| y3 | y3 = u3 sc {y2 sc (y1 sc r1)} |
| y3 | y3 = v3 sc (y2 sc r1) |
| | r3 = (u3 sc v3) sc (u2 sc v2) sc v1 |

This shows that [r1 r2 r3] can be determined directly from [u1 u2 u3] and [v1 v2 v3]. Applying this to the example:

$r1 = u2\ sc\ v2 = 0\ sc\ 0 = 0$ $r2 = u1\ sc\ v1 = 1\ sc\ 1 = 0$ $r3 = (u3\ sc\ v3)\ sc\ (u2\ sc\ v2)\ sc\ v1 = (0\ sc\ 1)\ sc\ (0\ sc\ 0)\ sc\ 1 = 0.$

Consequently [r1 r2 r3]=[0 0 0] which is correct.

Assume that an error occurred in XX1 at bit 7. Instead of XX1(7)=1, XX1(7)=0. Or XX1e(7:9)=[0 1 0] and XX2e=[1 1 0]. The initial state for rest decoding at bit 7 may be calculated with result [0 1 1] if it was assumed that XX1e and XX2e were error free. One can then determine the resulting decoded YY1e and YY2e using this initial state. The results are:
YY1e=[0 0 0 0 1 1 1 1 1 0]
YY2e=[0 0 0 1 1 1 0 1 0 0]

Clearly beyond the first 3 bits these sequences are different. The conclusion must be that XX1e and XX2e were not error free. Consequently a method, being another aspect of the present invention, has been created to determine the first error free sequences after errors have occurred.

One may apply different strategies to determine when errors occur and to determine a restart point. For instance one may run two decoders real-time or close to real-time. When errors occur, one may use either a strategy that jumps the maximum number of correctable errors to calculate a new restart point, as all errors can be corrected. One may also jump one symbol from the error to calculate a new restart-point and keep jumping until error-free outputs are detected. Other strategies are also contemplated, and will depend on the acceptable delay for finding and using a restart point. For instance one may jump a greater number of symbols than can be corrected and work one's way back to the earliest restart point.

The next step is to correct the errors that have occurred. Assuming in the illustrative example that no more than 3 consecutive bits differ in the two sequences one may assume also that one can find a correct bit before errors occurred by counting back 4 bits from the first correct decoding restart bit. A correct current input/output state of course determines completely the next state of the shift register. One requirement in decoding this is that one should make sure to capture the state of the shift register at decoding a certain bit. It should be clear that the state of the shift register when decoding the first error input is still correct. It is formed by the previous state (which was correct) shifted one position. The symbol that was shifted out is replaced in the first element of the shift register by the previous output, which was assumed to be decoded correctly. The first incorrect output result from the decoder is created by combining a correct state of the shift register with an incorrect incoming symbol into the decoder. The decoding can then be demonstrated in the following table:

| | position 1 | position 2 | position 3 | position 4 | position 5 |
|---|---|---|---|---|---|
| input decoder 1 | u1→y1 | e→x | e→x | e→x | u5→y5 |
| shift register | [rg1 rg2 rg3] | [y1 rg1 rg2] | [x y1 rg1] | [x x y1] | [r1 r2 r3] |
| input decoder 2 | v1→y1 | e→x | e→x | e→x | v5→y5 |

The table shows 5 positions of the decoding process. Certainty exists about correctness of position 1 and position 5. An error may have occurred in position 2, 3 and 4. Also shown are the states of the shift register. The state of the shift register when decoding u1 and v1 in position one is error-free and is [rg1 rg2 rg3]. Because everything is error free at this position, including the decoding result y1, the shift register state for the following decoding position [y1 rg1 rg2] is also error free. Because nothing can be said about the inputs and outputs of positions 2, 3 and 4 all inputs are called 'e' and all output signals are named 'x'. However it is known that certain elements of the shift register during error occurring states are correct, which is shown in the table. Position 5 is again correct (being calculated as such) and the correct shift register state can be determined with the method provided as an aspect of the present invention.

In position 5 the content of the shift register is calculated to be [r1 r2 r3]. From a dynamic decoding perspective (assuming that for instance no errors have occurred) this state is reached from previous states wherein the current state was reached by pushing out the last element of the shift register and entering the generated output signal of the decoder as the first element. One can then show how the state was [r1 r2 r3] in position 5 was reached from position 2, going backwards and using an x where the signal is unknown:
position-2:[x x x]; position-3: [r3 x x]; position-4 [r2 r3 x]; position-5: [r1 r2r3].

But moving forward from position-2 it is known that the states are:
position-2:[y1 rg1 rg2]; position-3: [x y1 rg1]; position-4 [x x y1]. From this one can then derive the error-free states of the shift register:

position-2: [y1 rg1 rg2];
position-3: [r3 y1 rg1];
position-4: [r2 r3 y1];
position-5: [r1 r2 r3].

It should be clear that from this one may conclude that y2=r3; y3=r2 and y4=r1. If needed, one can also determine the actual value of [u2 u3 u4] and [v2 v3 v4], if one is dealing with no more than 3 consecutive errors in each sequence. However this is not needed for decoding purposes, but may be used for instance to repair errors in a Trelllis. The method has as added benefit that when it is decided that more than a number of "solvable" errors has occurred one can still resume decoding and just accept the additional errors before the three corrected errors. Assuming that 3 consecutive errors would be very rare under for instance a normal error distribution with error probability of p=0.01, the occurrence of 4 consecutive errors would be even more exceptional.

Each of the positions with errors in the individual sequences has a known output of the decoders (being the first element of the next shift register state), a known shift register state and (because of potential errors) an unknown input value. Consequently one can 'reconstruct' the correct sequence values. Such reconstruction is not required for the decoding, but may be applied for other purposes. The following illustrative example shows how one can reconstruct the input values 'u' and 'v' to a decoder. It is known that in position 2 of the above example the state of the shift register is [y1 g1 g2], wherein 'y1' is the last known correctly decoding result and [g1 g2 g3] was the last known correct shift register state before the first potential error occurred. Assuming again using the circuits of FIG. 21 and FIG. 22 as decoders one can use the following decoding expressions for position 2 with inputs 'u2' to the circuit of FIG. 21 and 'v2' to the circuit of FIG. 22:

r1=u2 sc (y1 sc (g1 sc g2)). Because function 'sc' is the binary XOR and commutative and associative one can change this to:

$u2 = r1 \; sc \; (y1 \; sc \; (g1 \; sc \; g2))$.

Also r1=v2 sc (y1 sc g2) so: v2=r1 sc (y1 sc g1). The same approach can be applied to all of the other inputs with assumed errors. One reason to determine the actual input values may be when clusters of errors occur in which each sequence may not have more than 3 errors, but wherein 1, 2 or 3 error clusters are separated by error-free areas of at least 1 bit. In that case one can work a "way back" from the end of the sequence to the front in finding errors and correcting errors.

The above example also allows determining the last two decoded symbols with potential errors based on availability of 2 consecutive inputs to the two decoders. The two expressions for the shift register of the first correct symbols, followed by correct symbols are:

$r1 = u2 \; sc \; v2$ $r2 = u1 \; sc \; v1$

This means that the first two elements of the shift register (when the symbols are known to be correct) r1 and r2 are strictly determined by the first two inputs to the decoder. Consequently the two previous decoded symbols are [r2 r1].

Figure 23:
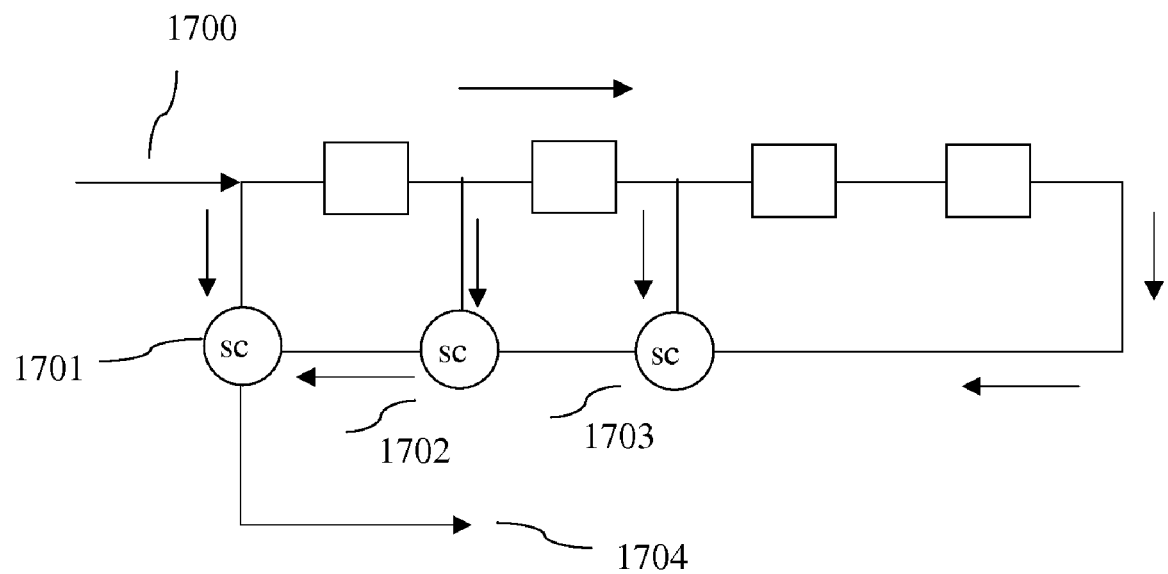
FIG. 23 is a diagram of a shift register based coder.
Figure 24:
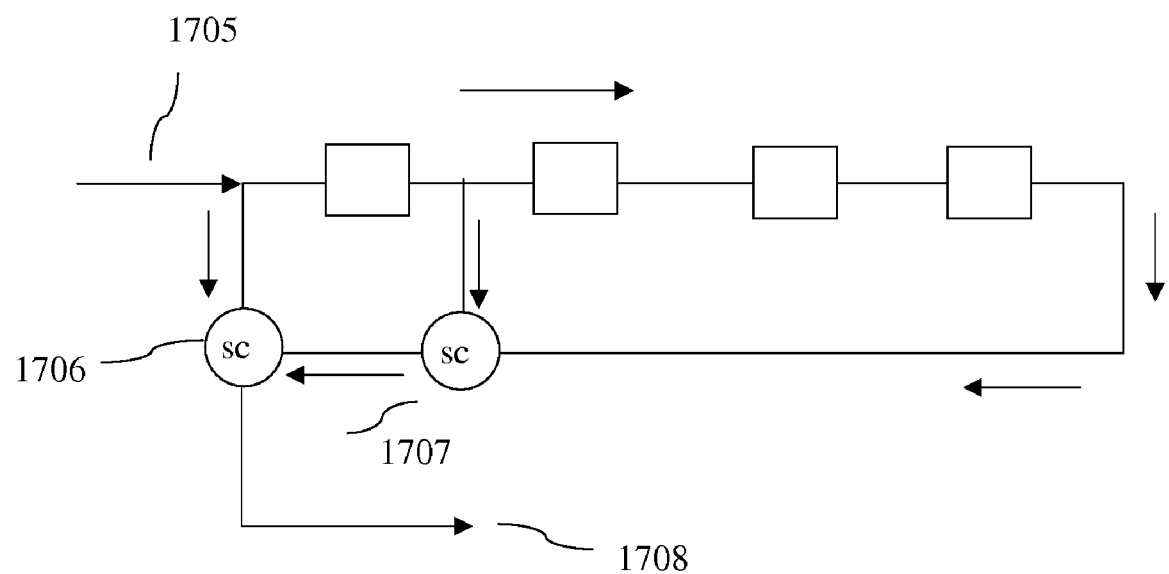
FIG. 24 is a diagram of another shift register based coder.

For illustrative purposes it will be shown that the above approach also works for binary coders and decoders with 4-element shift registers. The coders to be used in the illustrative examples are shown in diagram in FIG. 23 and FIG. 24. These are in fact classical descramblers. As matching decoders the circuits of FIG. 25 and FIG. 26 have to be used, applying the same initial content of the shift register of the coders. The following table shows the shift-register states, the input and output values of the two decoders, assuming that no errors are present in these positions. It will be shown that when the 4 positions are error-free one can 're-start' decoding without prior knowledge of the sequences or decoding process. For illustrative reasons it is assumed that position 6, 7, 8 and 9 are used with input [u6 u7 u8 u9] to the decoder of FIG. 25 and [v6 v7 v8 v9] to the decoder of FIG. 26. The state of the shift register at position 6 is [r1 r2 r3 r4] and the output of the decoders is error free and identical to [y6 y7 y8 y9] for both decoders.

|  | position 6 | position 7 | position 8 | position 9 |
| --- | --- | --- | --- | --- |
| decoder 1 | u6→y6 | u7→y7 | u8→y8 | u9→y9 |
| shift register | [r1 r2 r3 r4] | [y6 r1 r2 r3] | [y7 y6 r1 r2] | [y8 y7 y6 r1] |
| decoder 2 | v6→y6 | v7→y7 | v8→y8 | v9→y9 |

Figure 25:
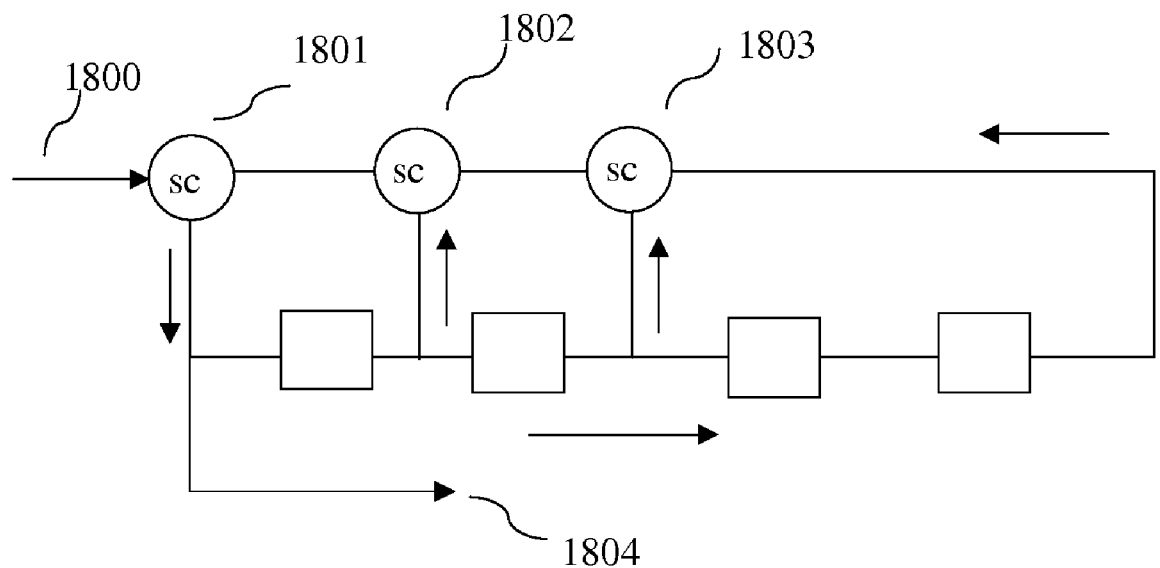
FIG. 25 is a diagram of a shift register based decoder.
Figure 26:
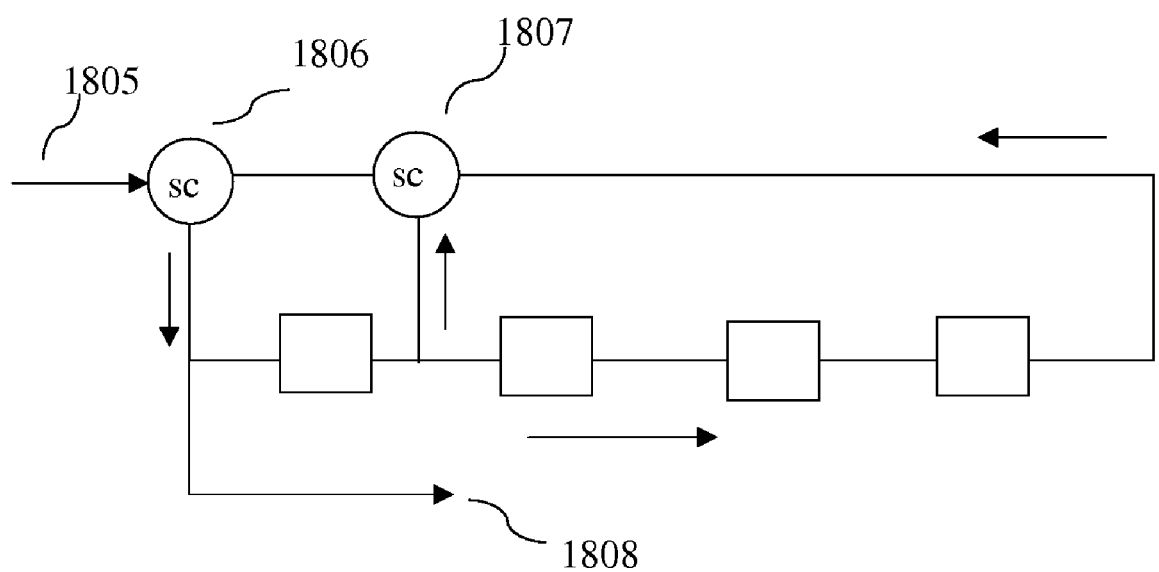
FIG. 26 is a diagram of another shift register based decoder.

The devices 1801, 1802, 1803, 1806 and 1807 of FIG. 25 and FIG. 26 in this illustrative example execute the commutative and associative function XOR. One can derive the following expressions for r1, r2, r3 and r4 using u6, u7, u8, u9, v6, v7, v8 and v9:

$r1 = u7 \; sc \; v7$ $r2 = u6 \; sc \; v6$ $r3 = (u9 \; sc \; v9) \; sc \; (u8 \; sc \; v8) \; sc \; v7$ and $r4 = (u8 \; sc \; v8) \; sc \; (u7 \; sc \; v7) \; sc \; v6$.

Based on earlier analysis one may then conclude that if one has made sure that all inputs are error free for 4 positions then one can determine the state of the shift register at the first position and restart error free decoding. Based on the knowledge of [r1 r2 r3 r4] one can also determine the error-free output of the previous 4 positions being [r4 r3 r2 r1], with the earliest error free decoded signal being r4.

The expressions also show that two correct consecutive inputs allow determination of the previous two correct decoded symbols [r2 r1].

It should be clear that the method of error correction can be applied in many different ways. The selection of applying a certain coder/decoder combination depends on the expected error behavior of a channel. For instance using 4-element shift register coders/decoders may be useful if single errors can occur with one or two error-free symbols inserted but with a total span of 4 symbols. This can reduce additional steps of determining if a position is error-free. One may increase the occurrence of error free symbols by applying interleaving methods.

N-valued Examples

The error-correcting methods can also be applied for coders/decoders applying n-valued signals and devices executing n-valued logic. For illustrative purposes 3-valued coders/decoders will be demonstrated. For those skilled in the art it should be clear that these methods can be extended to n-valued devices and signal with n an integer greater than 3. The example will use the ternary logic function 'sc3' and shift registers that will hold 3-valued signals. The truth table of the function 'sc3' is provided in the following table.

| sc3 | 0 | 1 | 2 |
|---|---|---|---|
| 0 | 0 | 2 | 1 |
| 1 | 2 | 1 | 0 |
| 2 | 1 | 0 | 2 |

The function 'sc3' is self-reversing and it is commutative. However the function does not have the associative property. That means that in general the expression (a sc3 b) sc3 c≠a sc3 (b sc3 c). So if one has for instance the expression: (p sc3 q)=(a sc3 b) then p=(a sc3 b) sc3 q. One can do this because 'sc3' is self reversing and commutative. However care should be taken that expressions within parentheses are kept together and executed first in composite expressions. Because only reversible n-valued functions can be used in the n-valued coders/decoders one can also solve expressions that apply reversible, non commutative functions. Such functions make solving expressions more complicated but are entirely possible. They are less fit for illustrative purposes, but on the other hand provide probably greater security, especially when one combines different functions. How to apply n-valued reversible, non-commutative functions in scramblers/descramblers has been show in the recited patent application Ser. No. 10/935,960 which is incorporated herein by reference in its entirety.

The rules for manipulating expressions with non-commutative reversible logic functions are shown in the following illustrative 3-valued expressions. The ternary logic functions 'sc', 'ds' and 'fs' will be used. The protocol will be such that (a sc b) means that in the truth table of 'sc' the variable 'a' is selected from the left column as a row and variable 'b' is selected as a column from the top row of the truth table. As examples: (1 sc 2)=2; (2 sc 0)=2 and (0 sc 1)=0.

|    |   | b |   |   |
|----|---|---|---|---|
| sc |   | 0 | 1 | 2 |
| a  | 0 | 2 | 0 | 1 |
|    | 1 | 0 | 1 | 2 |
|    | 2 | 1 | 2 | 0 |

|    |   | b |   |   |
|----|---|---|---|---|
| ds |   | 0 | 1 | 2 |
| a  | 0 | 1 | 0 | 2 |
|    | 1 | 2 | 1 | 0 |
|    | 2 | 0 | 2 | 1 |

|    |   | b |   |   |
|----|---|---|---|---|
| fs |   | 0 | 1 | 2 |
| a  | 0 | 1 | 2 | 0 |
|    | 1 | 0 | 1 | 2 |
|    | 2 | 2 | 0 | 1 |

So if c=(a sc b) then a=(c ds b) or a=(b fs c).

Also if c=(a sc b) then b=(a fs c) or b=(c ds a). Even though the function 'sc' is commutative one should carefully maintain order of inputs because its reversing function is non-commutative. The same applies for n-valued reversible functions with n greater than 3. The exception to this are adder functions over $GF(2^p)$ that are self reversing, commutative and associative. The simplest way to manipulate n-valued expressions is when the functions are commutative and associative. One of the easier n-valued logic functions that will work in any n-valued solution is the modulo-n addition. However the modulo-n addition is not self-reversing for n greater than 2.

For the 3-valued illustrative example the coders and decoders of FIG. 19, FIG. 20, FIG. 21 and FIG. 22 will be used, like in the binary example. The expressions for restarting coding when the input signals are known to be correct applied in the binary example with 3 element shift registers also apply to the 3-valued case and are shown in the following table.

| y1 | y1 = v1 sc (r1 sc r3) |
| y1 | y1 = u1 sc (r1 sc (r2 sc r3)) |
| y2 | y2 = u2 sc (y1 sc (r1 sc r2)) |
| y2 | y2 = v2 sc (y1 sc r2) |
| y3 | y3 = u3 sc {y2 sc (y1 sc r1)} |
| y3 | y3 = v3 sc (y2 sc r1) |

All signals, functions and shift registers in the present illustrative example are now 3-valued. Instead of function 'sc' one has to substitute the ternary logic functions 'sc3' of which the truth table is shown in the following table.

| sc3 | 0 | 1 | 2 |
|---|---|---|---|
| 0 | 0 | 2 | 1 |
| 1 | 2 | 1 | 0 |
| 2 | 1 | 0 | 2 |

Because of constraints posed by the absence of associative properties of the function 'sc3' its manipulation to derive the required initial state of the shift register [r1 r2 r3] can become complicated. For the specific functions 'sc3' one can simplify the calculation of [r1 r2 r3] by using the arithmetical (instead of the logical) properties of 'sc3'. One can see that the logic expression (a sc3 b) is actually the arithmetical expression (-a-b) mod3. Taking also into consideration that 2a(mod3) is -a(mod3) one can easily derive the following expressions:

$r1=v2-u2-v1-u1-u3+v3$ which is identical to:

$r1=[(u1\ sc3\ u2)\ sc3\ (u3\ sc3\ v1)]\ sc3\ [v2\ sc3\ v3]$ $r2=-v1-u1-u3+v3$ which is identical to:

$r2=u3\ sc3\ [v3\ sc3\ (u1\ sc3\ v1)]$ $r3=-u3+v3+v1$ which is identical to:

$r3=u3\ sc3\ (v1\ sc3\ v3)$

One can then restart correct decoding with the availability of known error free inputs to the ternary decoder of FIG. 21 with input signal [u1 u2 u3] and ternary decoder of FIG. 22 with input [v1 v2 v3] as one can determine the state of the shift register at inputs u1 and v1 as being [r1 r2 r3]. Knowing the shift register state at this position also allows the conclusion that the previous three decoded values of the (error containing) input signals are [r3 r2 r1]. Consequently the ability to start recoding also allows correcting up to 3 errors. One can provide an actual example of a sequence and a restart using these expressions. Assume the ternary sequence SEQ3=[1 1 1 2 0 0 2 0 2 1 1 0 2 1 0 1 1 2 1 2]. The coder of FIG. 19 in ternary mode will apply function 'sc3' in its logic devices and with initial shift register state [1 0 2] it will code SEQ3 into XX1=[1 2 1 0 0 0 2 2 2 2 1 1 2 0 2 2 2 1 2 2]. The coder of FIG. 20 by applying 'sc3' in its devices and initial state [1 0 2] will code SEQ3 into XX2=[2 0 1 0 0 1 0 2 1 0 0 0 2 2 1 1 1 2 2 0].

Assume that there is uncertainty about symbols 7, 8 and 9 in XX1 and XX2 if they are error-free. This creates:
XX1e=[1 2 1 0 0 0 e e e 2 1 1 2 0 2 2 2 1 2 2]
XX2e=[2 0 1 0 0 1 e e e 0 0 0 2 2 1 1 1 2 2 0] wherein 'e' signifies a potential error.

One would like to re-start decoding at symbol 10 and generate the correctly decoded symbols at position 7, 8 and 9. From the expressions and the correct symbols in XX1 and XX2 in position 10, 11 and 12 one can derive the shift register state [r1 r2 r3] at position 10. The values of [u1 u2 u3] is provided by XX1 symbols at position 10, 11 and 12 and are [2 1 1]. The values [v1 v2 v3] are taken from position 10, 11 and 12 of sequence XX2 and are [0 0 0]. One can then calculate [r1 r2 r3] by using the expressions for 'sc3' and arrive at [2 0 2]. It is also known that YY(7)=r3, YY(8)=r2 and YY(9)=r1, with YY the correctly decoded sequences XX1 and XX2.

Another specific single function to apply in the decoders of FIG. 21 and FIG. 22 is the modulo-n adder. For the 3-valued case the function 'sc' of all applied logic devices will have a truth table as shown in the following table.

| sc3 | 0 | 1 | 2 |
|---|---|---|---|
| 0 | 0 | 1 | 2 |
| 1 | 1 | 2 | 0 |
| 2 | 2 | 0 | 1 |

It should be clear to those skilled in the art that the inverse of modulo-3 addition is modulo-3 subtraction. Unlike the binary case modulo-3 subtraction is not a commutative function. And (a-b)mod3 is generally not the same as (b-a)mod3. The function 'dsc3' that will be used in device 1501 of FIG. 19 and 1506 of FIG. 20 is (b-a)mod3 and its truth table is shown in the following table.

| | | b | |
|---|---|---|---|
| dsc3 | 0 | 1 | 2 |
| a  0 | 0 | 1 | 2 |
| 1 | 2 | 0 | 1 |
| 2 | 1 | 2 | 0 |

The functions 'dsc31' will execute (a-b)mod3. The truth table of 'dsc31' is provided in the following table.

| | | b | |
|---|---|---|---|
| dsc31 | 0 | 1 | 2 |
| a  0 | 0 | 2 | 1 |
| 1 | 1 | 0 | 2 |
| 2 | 2 | 1 | 0 |

Executing the appropriate expressions leads to:

$r1=(v2-u2)$mod3 arithmetically or $r1=(v2\,dsc31\,u2)$ in ternary logic.

$r2=(v1-u1)$mod3 arithmetically or $r2=(v1\,dsc31\,u1)$ in ternary logic.

$r3=[\{(v3-u3)-(v2-u2)\}-v1]$mod3 arithmetically or $r3=[\{(v3\,dsc31\,u3)\,dsc31\,(v2\,dsc31\,u2)\}\,dsc31\,v1]$ Taking again SEQ3 and coding it with FIG. 19 and FIG. 20 both with initial shift register state [1 0 2] will create XX1=[1 2 1 2 2 0 0 1 0 0 1 2 0 1 0 1 2 0 0 1] and XX2 =[1 0 2 0 0 2 0 1 2 0 0 0 1 1 2 2 2 1 1 0]. With errors at positions 7, 8 and 9 this will lead at reception to:
XX1e=[1 2 2 0 0 e e e 1 2 0 1 0 1 2 0 0 1] and
XX2e=[1 0 2 0 0 2 0 e e e 0 0 1 1 2 2 2 1 1 0].

Determining [r1 r2 r3] at position 10 with [u1 u2 u3]=[1 2 0] and [v1 v2 v3]=[0 0 1] applied to the expressions will generate [r1 r2 r3]=[2 0 2], which is correct as these are also the correct values for SEQ3 at position 7, 8 and 9.

Accordingly one can create ternary coders and decoders as shown in FIG. 19, FIG. 20, FIG. 21 and FIG. 22 using the appropriate rules and reversible functions as described in the recited U.S. Non-Provisional Patent Application Ser. No. 10/935,960, filed on Sep. 8, 2004, entitled TERNARY AND MULTI-VALUE DIGITAL SCRAMBLERS, DESCRAMBLERS AND SEQUENCE GENERATORS. One can then apply the methods here provided as an aspect of the present invention to restart coding sequences at a certain position and error correct a number of elements of the initial sequence that was coded. As explained the number of to be recovered ternary elements for the coders/decoders of FIG. 19 FIG. 20, FIG. 21 and FIG. 22 is three, which is identical to the length of the shift register. It should be clear that by using valid ternary coders and decoders with p-elements one may be able to recover up to p consecutive ternary elements in an error affected sequence.

It is another aspect of the present invention to perform error correcting coding of a sequence comprised of n-valued symbols with n≧3. An example will be provided for n=4. The example will use the same approach as in the binary and the ternary case. As an illustrative example a 4-valued sequence will be coded into two different sequences using the coders of FIG. 19 and FIG. 20. These coded sequences may be combined and transmitted or can be transmitted separately. At the receiving side the sequences will be separated if needed and decoded by the corresponding decoders of FIG. 21 and FIG. 22. When both sequences are identical over a certain range of symbols (at least 3) the sequence may be considered to be decoded error free. When errors occur, one can determine where errors start to occur. One can then jump p symbols forward (in fact skipping the errors) and restart correct and error-free decoding of the sequences. If decoding turns out not to be correct more than p errors have occurred and one has to 'skip' forward until correct decoding takes place. From the point of correct decoding one can then correctly decode the immediate p consecutive symbols.

While the 4-valued coders and decoders in this illustrative example have the same configuration as the binary and ternary case they apply 4-valued logic devices while the shift registers can hold 4-valued symbols. The structure of the expressions for determining the state [r1 r2 r3] of 4-valued decoders of FIG. 21 and FIG. 22 is identical to the structure in the binary and ternary case and is shown in the following table. All devices in the 4-valued decoders are assumed to execute a 4-valued logic function 'sc4'. The state [r1 r2 r3] of the shift register occurs at the position where the decoder input of FIG. 21 is 'u1' and of decoder FIG. 22 is 'v1'. Further more it is assumed that the input [u1 u2 u3] and [v1 v2 v3] is error free.

| y1 | y1 = v1 sc4 (r1 sc4 r3) |
| y1 | y1 = u1 sc4 (r1 sc4 (r2 sc4 r3)) |
| y2 | y2 = u2 sc4 (y1 sc4 (r1 sc4 r2)) |
| y2 | y2 = v2 sc4 (y1 sc4 r2) |
| y3 | y3 = u3 sc4 {y2 sc4 (y1 sc4 r1)} |
| y3 | y3 = v3 sc4 (y2 sc4 r1) |

It is again possible to determine expressions for r1, r2 and r3 based on the function 'sc4' and the values of [u1 u2 u3] and [v1 v2 v3]. It is not required for the method that only identical functions are used (within the constraints of course of correctly decoding a 4-valued coded sequence). For illustrative purposes it is assumed that only 'sc4' will be used in the decoders and that the 4-valued logic function is reversible and associative. The modulo-4 adder is one example of such a function. The truth table of 'sc4' is provided in the next table.

| sc4 | 0 | 1 | 2 | 3 |
|---|---|---|---|---|
| 0 | 0 | 1 | 2 | 3 |
| 1 | 1 | 2 | 3 | 0 |
| 2 | 2 | 3 | 0 | 1 |
| 3 | 3 | 0 | 1 | 2 |

This leads to the following solution for [r1 r2 r3]

$r1 = v2 - u2$ $r2 = v1 - u1$ $r3 = v3 - u3 - v1 - v2 + u2$

The solution expression contain subtraction functions. It should be clear that subtraction is non-commutative and that (a-b) mod4 is usually not identical to (b-a)mod4. There is a logical function 'dsc41' which will execute (a-b) mod4. Its truth table is shown in the following table.

| | | b | | |
|---|---|---|---|---|
| dsc31 | 0 | 1 | 2 | 3 |
| a 0 | 0 | 3 | 2 | 1 |
| 1 | 1 | 0 | 3 | 2 |
| 2 | 2 | 1 | 0 | 3 |
| 3 | 3 | 2 | 1 | 0 |

The solution set for [r1 r2 r3] can then be rewritten as 4-valued logic expressions:

$r1 = v2\ dsc41\ u2$ $r2 = v1\ dsc41\ u1$ $r3 = [(v3\ dsc41\ u3)\ dsc41\ (v2\ dsc41\ u2)]\ dsc41\ v1.$ The previous three symbols of the 4-valued sequence then are [r3 r2 r1].

It should be apparent that the method of restarting error-free decoding and correcting up to p previous decoding errors can be applied to any n-valued coder/decoders sets either as shown in FIG. 19, FIG. 20, FIG. 21 and FIG. 22 with shift registers of 3 n-valued elements wherein the applied logic functions are n-valued or modulo-n adding and subtraction functions. To those skilled in the art of manipulations of symbolic expressions it should be clear that any other n-valued reversible logic function may be used. Further more coders and decoders with shift register size different, taps different and functions different from shown in the illustrative examples can be used for realizing error correcting methods.

N-valued functions over extended binary fields such as an adder over $GF(2^p)$ are reversible functions and can be used in the coders and decoders here disclosed. Manipulation of commutative adders over $GF(2^p)$ can be relatively simple compared to other commutative functions. As one example an 8-valued adder defined over the extended binary field $GF(2^3)$ is here provided as an illustrative example. The truth table of this illustrative example is provided in the following table fp.

| | | | | b | | | | | |
|---|---|---|---|---|---|---|---|---|---|
| c | fp | 0 | 1 | 2 | 3 | 4 | 5 | 6 | 7 |
| a | 0 | 0 | 1 | 2 | 3 | 4 | 5 | 6 | 7 |
| | 1 | 1 | 0 | 4 | 7 | 2 | 6 | 5 | 3 |
| | 2 | 2 | 4 | 0 | 5 | 1 | 3 | 7 | 6 |
| | 3 | 3 | 7 | 5 | 0 | 6 | 2 | 4 | 1 |
| | 4 | 4 | 2 | 1 | 6 | 0 | 7 | 3 | 5 |
| | 5 | 5 | 6 | 3 | 2 | 7 | 0 | 1 | 4 |
| | 6 | 6 | 5 | 7 | 4 | 3 | 1 | 0 | 2 |
| | 7 | 7 | 3 | 6 | 1 | 5 | 4 | 2 | 0 |

The function fp is self-reversing. The function is also associative, which makes solving the equations for determining the error-free states and the states of a shift register fairly easy. In fact one can apply the same generic equations as provided for the binary case for the combination of coders/decoders as provided in FIGS. 21-24. These equations are provided in the following table:

| y1 | y1 = v1 fp (r1 fp r3) |
| y1 | y1 = u1 fp (r1 fp (r2 fp r3)) |
| | r2 = u1 fp v1 |
| y2 | y2 = u2 fp (y1 fp (r1 fp r2)) |
| y2 | y2 = v2 fp (y1 fp r2) |
| | r1 = u2 fp v2 |
| y3 | y3 = u3 fp {y2 fp (y1 fp r1)} |
| y3 | y3 = v3 fp (y2 fp r1) |
| | r3 = (u3 fp v3) fp (u2 fp v2) fp v1 |

Figure 27:
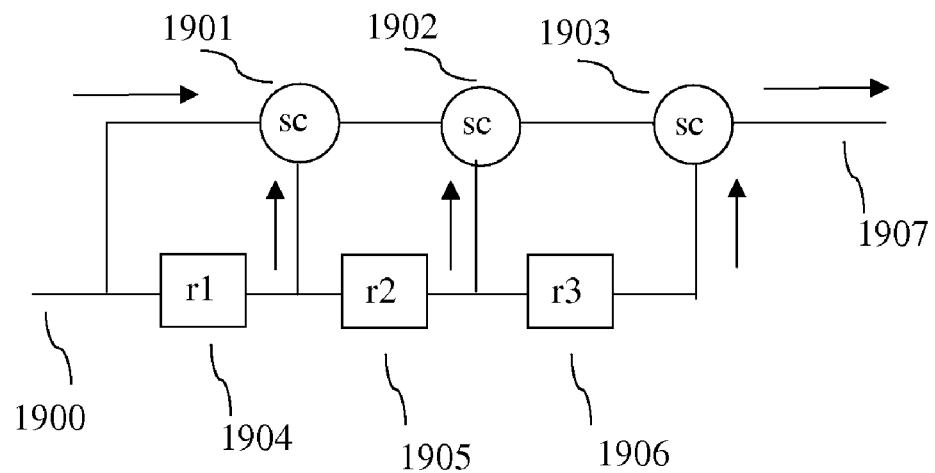
FIG. 27 is a diagram of a shift register based forward coder.

The literature in error-correcting coding, such as the book Fundamentals of Convolutional Coding by Rolf Johannesson and Kamil Sh. Zigangirov, IEEE Press 1999 usually shows the coders used for error-correcting purposes in the configuration as shown in FIG. 27 and combined coders as a convolutional coder as shown in FIG. 1. In essence the basic convolutional coders are formed by a shift register for instance as shown in 3-element configuration as in FIG. 27 with memory elements 1904, 1905 and 1906. The to be coded signal is inputted on 1900 and shifted through the shift register as well as inputted into a separate branch with logic devices. The to be coded signal is first inputted into a logic device 1901 and combined with the content of an element (1904 in this case) of the shift register. The output of the device 1901 is then inputted into a logic device 1902 and combined with the content of shift register 1905. The output of device 1902 is then inputted into a device 1903 and combined with the content of shift register element 1906. The output 1907 of the device is the output of the coder. This coder has no feedback. It is understood that the specifics (taps, length of shift register, functions) of the coder are merely an illustrative example. Coders can have different sized shift registers; they can also have different taps and in the n-valued case, different reversible n-valued logic functions.

Figure 28:
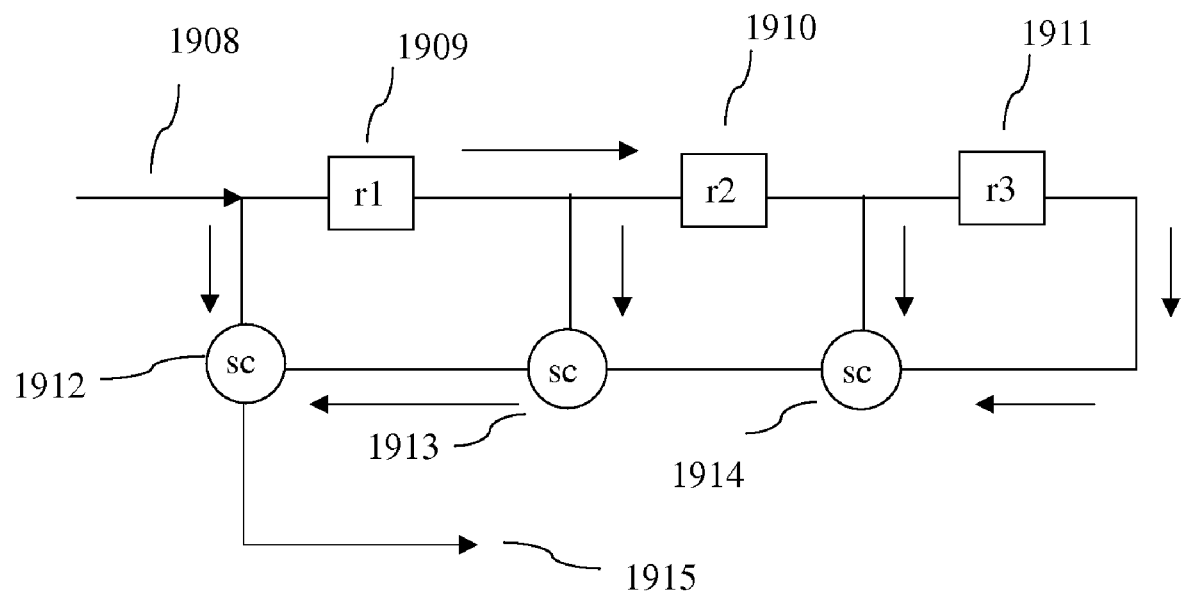
FIG. 28 is a diagram of an equivalent to the shift register based coder of FIG. 27.

In the illustrative examples for error correction the coders of the type as shown in FIG. 28 have been used. This type is generally known as the LFSR based descrambler. In the binary case and there where all functions are self-reversing, commutative and associative, the coders of FIG. 27 and FIG. 28 will generate identical signals and the decoders applied in the methods which are part of the present invention can be used to decode binary signals coded by the binary coders of the type of FIG. 27. This will be shown in expressions describing the generated signals of the coders of type of FIG. 27 and FIG. 28.

Assume that a signal v1 is inputted on 1900 of the binary coder of FIG. 27 in which devices 1901, 1902 and 1903 will execute the associative and self reversing binary XOR function. The initial state of shift register elements 1904, 1905 and 1906 when v1 is being coded is assumed to be [r1 r2 r3]. The output signal on 1907 is assumed to be y1. The following expression describes the generation of y1:
y1=[{(v1 sc r1) sc r2} sc r3].

The function 'sc' herein is the binary XOR (or add modulo-2) function, which is associative, commutative and self-reversing. Because the function is associative and commutative one can also express y1 as: y1=v1 sc r1 sc r2 sc r3.

One can create similar expressions for the circuit of FIG. 28. Assume that a signal v1 is provided on input 1908. The content of shift register elements 1909, 1910 and 1911 at the moment of coding v1 is assumed to be [r1 r2 r3]. The expression to create signal y1 on output 1915, with devices 1912, 1913 and 1914 executing the binary XOR function is: y1=v1 sc {(r2 sc r3) sc r1}. Because the function 'sc' is the associative and commutative XOR function, one can write y1=v1 sc r1 sc r2 sc r3. This is identical to the expression of the generated output of the circuit of FIG. 27. Accordingly one can use the decoder as shown in FIG. 21 (which is a LFSR based scrambler) to decode the signal generated either by the binary coder of FIG. 27 or the coder of FIG. 28.

The literature, such as the earlier cited book Fundamentals of Convolutional Coding, also describes more involved ways of combining different outputs of different coders of shift register based coders to generate coded signals. It should be clear that if the expressions that describe the generated signals are reversible one can create the expressions, and with that the devices and configurations that will decode a coded sequence. Accordingly decoding of sequences of n-valued symbols generated by two or more shift register based coders with n-valued reversible logic functions for which equations can be developed that uniquely and reversibly express the generated sequences as a function of inputted sequences, shift register based decoders can be created, which is another aspect of the present invention. Further more, assuming a limited number of errors in the generated sequences, a certain number of errors in the decoded sequences from the generated sequences with errors can be corrected in accordance with a further aspect of the present invention.

Signals coded with a binary circuit of the type as shown in FIG. 27, also when using more shift register elements and more and/or different taps, can be decoded by the corresponding LFSR based binary scrambler. It has been shown that this is possible because of the commutative and associative properties of the used binary logic function. Accordingly one can use either of the structures of FIG. 8 and FIG. 9 or FIG. 21 and FIG. 22 when applying self reversing associative and commutative n-valued functions such as an adder over GF(21) such as the provided 8-valued function fp.

The equivalence of coders as described may not be valid for 'sc' being non-binary (or n-valued) non-associative and/or non-commutative functions. For instance in the ternary or 3-valued case wherein all functions 'sc' are determined by the following truth-table.

| sc | 0 | 1 | 2 |
|---|---|---|---|
| 0 | 0 | 1 | 2 |
| 1 | 1 | 2 | 0 |
| 2 | 2 | 0 | 1 |

This is also the truth table of the function (-a-b) modulo-3. Using this function in the expression for the circuit of FIG. 27: y1=[{(v1 sc r1) sc r2} sc r3] will lead to:
y1=[-{-(-v1-r1)-r2}-r3]=-v1-r1+r2-r3. While applying the function to the expression of the circuit of FIG. 28:
y1=v1 sc {(r2 sc r3) sc r1} will lead to:
y1=-v1-{-(-r2-r3)-r1}=-v1-r2-r3+r1. Clearly these are two different expressions. Consequently in that case the coder of FIG. 27 has to apply the decoder of FIG. 8. And the coder of FIG. 28 has to apply the decoder of FIG. 22 to correctly decode the coded ternary signal. All aspects of the decoder restart and error correction apply to these and otherwise modified (different taps, different length shift register) n-valued coder/decoder combinations. One should take care to use the appropriate n-valued coder/decoder combination. This may create additional manipulations of equations when the functions are not associative and/or commutative.

Figure 30:
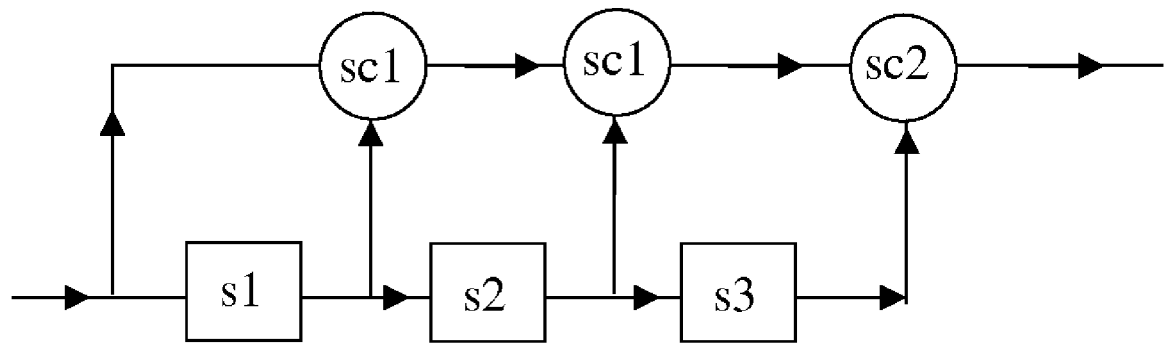
FIG. 30 is a diagram of another shift register based forward coder.

In general convolutional coders as shown in FIG. 1 are used in the binary case. The related decoders are shown in FIG. 8 (for the bottom encoder in FIG. 1) and FIG. 9 (for the top encoder of FIG. 1), taking into account that the functions in the decoders should also be binary. For illustrative purposes two convolutional coders are shown in FIG. 20 and FIG. 30 and their corresponding decoders in FIG. 31 and FIG. 32. A structure of the matching decoders for the multi-valued or n-valued case with n≧3 was provided in U.S. patent application Ser. No. 09/968,641, filed on Sep. 28, 2001, now abandoned, entitled 'Multi-level coding for digital communication', inventors Mix et al. which is incorporated herein by reference in its entirety. This patent application discloses the case wherein the coders have additive functions and the decoders have subtractive functions. These functions provide only a limited set of possible functions. Further more it is not clear what the additive and subtractive functions are. The inventor has disclosed the general rules for n-valued reversible functions in the coders and decoders in U.S. Non-Provisional Patent Application Ser. No. 11/042,645, filed Jan. 25, 2005, entitled MULTI-VALUED SCRAMBLING AND DESCRAMBLING OF DIGITAL DATA ON OPTICAL DISKS AND OTHER STORAGE MEDIA which is incorporated herein by reference in its entirety. By applying these rules one can calculate the state of the shift register for restarting decoding and error correction.

For most of the reversible functions the equations may become quite complicated. As an illustrative example equations will be provided for the decoders of FIG. 31 and FIG. 32 wherein the functions sc1 and sc2 are modulo-n adders. The reversing functions for sc1 and sc2 are then of course the modulo-n subtraction. The reverse of sc1 is sc1$^{-1}$. One should keep in mind that in this example: v1 sc1 u1=u1 sc1 v1;

however for the reverse of sc1 being sc1$^{-1}$ the expression u1 sc1$^{-1}$ v1 is not identical to v1 sc1$^{-1}$ u1. Keeping that restriction in mind one can then develop a set of equations. One may then assume that at a certain stage the input u=[u1 u2 u3] to decoder of FIG. 31 and v=[v1 v2 v3] to decoder of FIG. 32 are error free. In that case the output y=[y1 y2 y3] of the first decoder and z=[z1 z2 z3] of the second decoder should be identical, but only if both decoders have as content of the shift register the state s=[s1 s2 s3].

Figure 31:
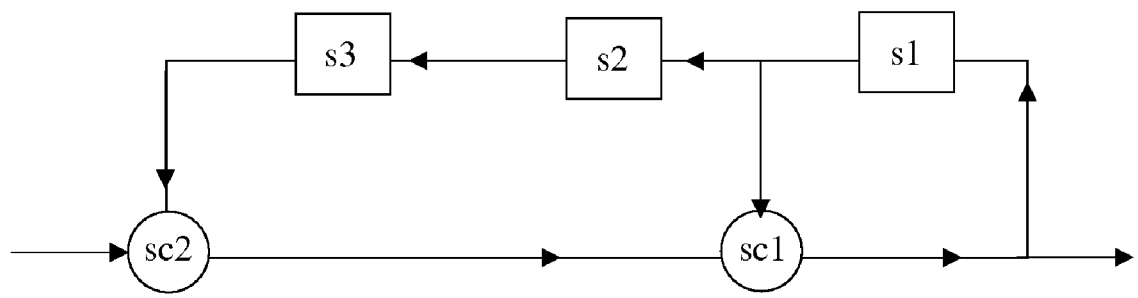
FIG. 31 is a diagram of a shift register based feedback decoder.
Figure 32:
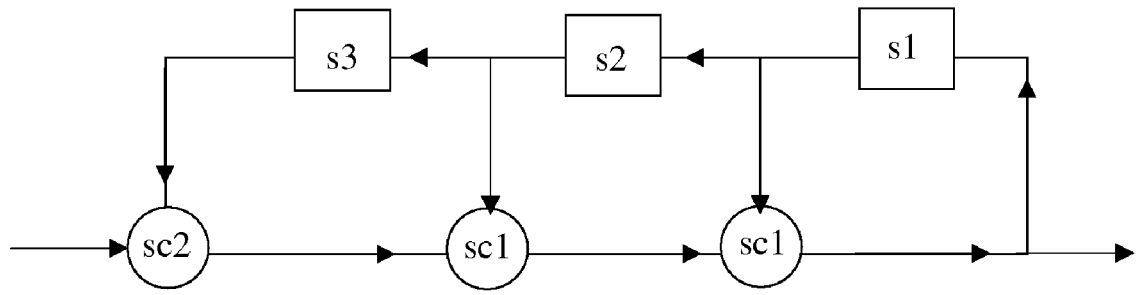
FIG. 32 is a diagram of another shift register based feedback decoder.

The following equations apply at consecutive clock cycles of the decoder of FIG. 31:

| cycle | Output equation FIG. 31 |
|---|---|
| 1 | y1 = (u1 sc2 s3) sc1 s1 |
| 2 | y2 = (u2 sc2 s2) sc1 y1 |
| 3 | y3 = (u3 sc2 s1) sc1 y2 |

The following equations apply at consecutive clock cycles of the decoder of FIG. 32:

| cycle | Output equation FIG. 32 |
|---|---|
| 1 | z1 = [(v1 sc2 s3) sc1 s2] sc1 s1 |
| 2 | z2 = [(v2 sc2 s2) sc1 s1] sc1 z1 |
| 3 | z3 = [(v3 sc2 s1) sc1 z1] sc1 z2 |

Because y1=z1; y2=z2; y3=z3; the functions sc1 and sc2 are +(mod-n) and the reverse are −(mod-n), one can easily derive that:

s1=u2−v2; s2=u1−v1 and s3=(u3−v3)+(v2−u2)+(v1−u1). This provides an initial state of the shift register to calculate the decoded sequences. If after 3 symbols the outputs of the decoders are still identical, then the received sequences may assumed to be error free as of the beginning of receiving u and v with shift register state s. If the fourth symbol in y and z were not identical then the received sequences were still in error and one has to try a next restart position.

This illustrative example for a fairly simple reversible n-valued logic function shows that n-valued decoders having n-valued convolutional decoders also can be applied to find a restart point and to correct errors. The corrected symbols are of course the content of the shift register at the restart point.

If GF($2^m$) self reversing functions are used with associative properties it does not matter if one uses a convolutional decoder or a scrambler type decoder, as the equations will be the same. In case non-associative functions are used it was shown that appropriate equations can be created that enable to determine a restart state and allow for error correction.

Figure 29:
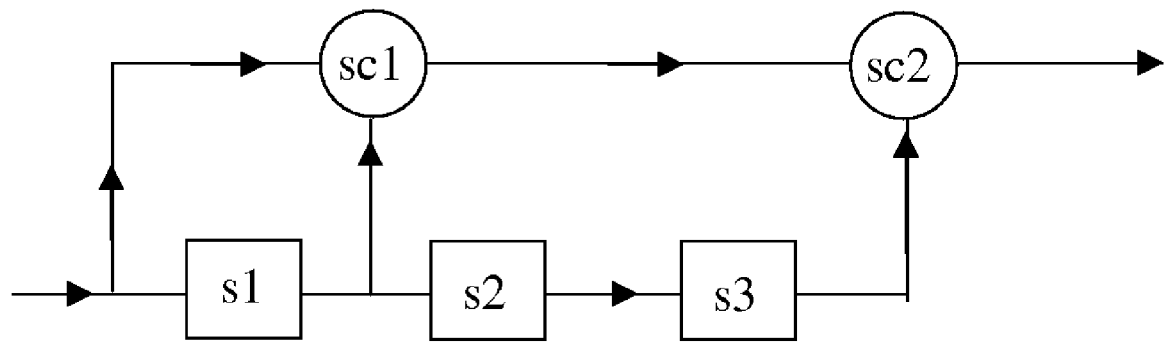
FIG. 29 is a diagram of a shift register based forward coder.

One may code a sequence with a descrambler or convolutional coder and decode with a scrambler or convolutional decoder. It was shown that each configuration can be a coder or a decoder, depending on its role in a system. To be able to distinguish between the roles and configurations the term 'forward coder' will be used for coders as shown in FIG. 15 and FIG. 29, even though different equations may apply. However these types of coders, including convolutional coders and descramblers, do not have feedback of a previous state into the shift register. Types such as shown in FIG. 14 and FIG. 32 will be called 'feedback coders' as they feed back results depending on previous states into the shift register.

N-valued codes like convolutional codes that can be decoded by methods in accordance with one or more aspects of the present invention, involve generating at least 2 different sequences by two different n-valued forward coders, each n-valued forward coder generating a different sequence from the input sequence, but each n-valued forward coder using a shift register of identical length of elements with a an identical starting content. One may generate more coded sequences, using the same conditions. At decoding one may then select the best coded sequences to decode. In any case a complete forward coder comprises at least two individual forward coders with identical shift registers. Such a complete forward coder will be called: a composite n-valued forward coder. An n-valued composite forward coder has as its input a single sequence of n-valued symbols and as output at least 2 different synchronized sequences of n-valued symbols. A composite n-valued forward coder has a length p when the shift register of a decoder has p elements.

Each of the outputted n-valued sequences can be correctly decoded by an n-valued feedback decoder with a shift register of the same length as the shift register of the n-valued forward coder. When all sequences are without errors then at decoding the state of the shift register of each of the n-valued feedback decoders is identical. A set of at least 2 n-valued feedback decoders is called: a composite n-valued feedback decoder. A composite n-valued feedback coder has a length p when the shift register of a decoder has p elements.

When no errors have occurred, the sequence created by decoding the first sequence is identical to the sequence created by decoding the second sequence. Accordingly just one sequence needs to be decoded to recover the original sequence that was coded into at least two sequences.

A sequence may have a number of 't' n-valued symbols. A position 'k' in a sequence, means the position of the $k^{th}$ symbol in the sequence. A position in a sequence corresponds with a state of the coder or decoder shift register, which is the content of the elements of the shift register. It should be clear that if no errors have occurred the content of the shift register in a coder and the corresponding decoder at a position of a sequence, be it a coded, uncoded or decoded sequence, are identical. As a composite forward coder generates at least a first and a second sequence a position k of a symbol in the first sequence corresponds with a position k of a symbol in the second sequence.

Thus, in accordance with one aspect of the present invention, a sequence of n-valued symbols can be coded into two or more different sequences of n-valued symbols by an n-valued composite forward coder. In accordance with a further aspect of the present invention a corresponding n-valued composite feedback decoder is created, the corresponding n-valued composite feedback decoder being able to decode the two or more different sequences of n-valued symbols. In accordance with another aspect of the present invention the rules are provided how to create the corresponding decoder when the coder is known, or conversely how to create the coder when the decoder is known.

In light of the earlier disclosed aspect of the present invention that the role of coder and decoders are interchangeable one can also use the terms composite forward decoder and composite feedback coder. In fact one can use the term forward coder and feedback coder which may be composite, signifying that more than one coder is used and they may be used in coding or decoding situations.

It should be clear to those skilled in the art that methods of decoding in situations wherein two sequences are multiplexed before transmission can be improved by application of interleaving sequences so that the two sequences are not 'close in time'. One may also puncture coded sequences and depuncture coded sequences. Puncturing a code as known to persons skilled in the art is used to limit the number of symbols to be transmitted.

Convolutional binary coders as composite forward coders are known. Convolutional binary decoders as composite feedback decoders are also known. They are for instance described in NASA Tech Brief Vol. 22, 9 of Sep. 1998, entitled Algorithm for Initialization of a Convolutional Decoder by Frank M. Loya. Herein also restarting of decoding in binary convolutional decoders is disclosed. The cited article is strictly concerned with initialization of the shift registers or what is called a restart in the present invention. Error correction capabilities are not recognized in said article. Also the relationship of coder and decoder as being descrambler and scrambler is not recognized. Further more the ability to reconstruct the input binary symbols in error is not disclosed or taught or even suggested. The recited article is strictly focused on binary sequences.

The inventor believes that composite n-valued feedback decoders and coders as disclosed as aspects of the present invention are novel. One reason for that is that n-valued LFSRs in the known art use adders and multipliers, which are substituted in the present invention to single functions. This aspect of LFSRs is an invention by the inventor and was disclosed in U.S. Non-Provisional Patent Application Ser. No. 10/935,960, filed on Sep. 8, 2004, entitled TERNARY AND MULTI-VALUE DIGITAL SCRAMBLERS, DESCRAMBLERS AND SEQUENCE GENERATORS, which is incorporated herein by reference in its entirety. Further more using binary descramblers in a binary composite forward coder and using binary scramblers in a binary composite feedback decoder is also believed to be novel. The inventor has shown as one aspect of the present invention that the equations of binary convolution coders and descramblers and of binary convolutional decoders and scramblers can be identical. This is a non-trivial invention as it further enables convolutional coders and decoders to be implemented in a non-shift register based embodiment, such as an addressable memory based embodiment. The addressable memory based embodiments of binary and n-valued shift register scramblers and descramblers are invented and described by the inventor in U.S. Non-Provisional Patent Application Ser. No. 11/534, 837, filed on Sep. 25, 2006, entitled GENERATION AND SELF-SYNCHRONIZING DETECTION OF SEQUENCES USING ADDRESSABLE MEMORIES and in U.S. Non-Provisional Patent Application Ser. No. 11/555,730, filed on Nov. 2, 2006, entitled SCRAMBLING AND SELF-SYNCHRONIZING DESCRAMBLING METHODS FOR BINARY AND NON-BINARY DIGITAL SIGNALS NOT USING LFSRs, which are both incorporated herein by reference in their entirety.

One of the possible embodiments of n-valued composite feedback and forward coders is that one can apply the coder and decoder to blocks of binary symbols which may represent an n-valued symbol. For instance a block of 4 bits may represent a 16 valued symbol. With a decoder according to the methods here provided as an aspect of the present invention one can correct up to p symbols if the shift register has p elements. Because a 16-valued symbol has 4 bits one can correct up to 4*p errors by using 16-valued coders and decoders. Accordingly one can improve error correcting performance of a channel without increasing the bandwidth of the channel.

One can implement n-valued composite forward coders, be it with convolutional encoders of with descramblers in different ways. In a first embodiment in accordance with an aspect of the present inventions one may implement it as a set of instructions on a processor or a computer. The processor may for instance be a general micro-processor or a dedicated digital signal processor. In a second embodiment one can implement an n-valued composite forward encoder as an apparatus. The apparatus may comprise an n-valued shift register and n-valued reversible logic functions, being implemented in such a way that an n-valued symbol is represented in binary form and an n-valued logic function is implemented using addressable truth tables in memory circuits. One may also implement n-valued shift register type circuits as addressable memories. The same type of embodiments can be applied for n-valued feedback composite decoders.

Methods for finding restart points and for finding and correcting errors can be implemented in a first embodiment as instructions for a processor to execute the instructions. In a second embodiment one can implement the methods in an apparatus, wherein n-valued logic circuits execute the equations to find a restart point. Dedicated circuits can also be used to find points of errors in sequences. Dedicated n-valued logic circuits can also be used to correct errors.

Recalculating Input Signals to Decoders

In general in transmission one would like to focus on outputting at the receiving side a signal with no or as few errors as possible. Most aspects of the present invention are focused on creating such an output signal. Little attention is spent so far on error correction of the un-decoded received signals after transmission and before decoding. Error correction is reflected in the decoded signal wherein symbols that were about to be presented as decoded in error are corrected. It is also possible to correct errors in the 'in error' symbols before they enter the n-valued composite feedback decoder. These signals are used to form a Trellis for decoding. One may improve the quality of existing Trellis based decoders to detect and correct errors in symbols that form such a Trellis.

Figure 34:
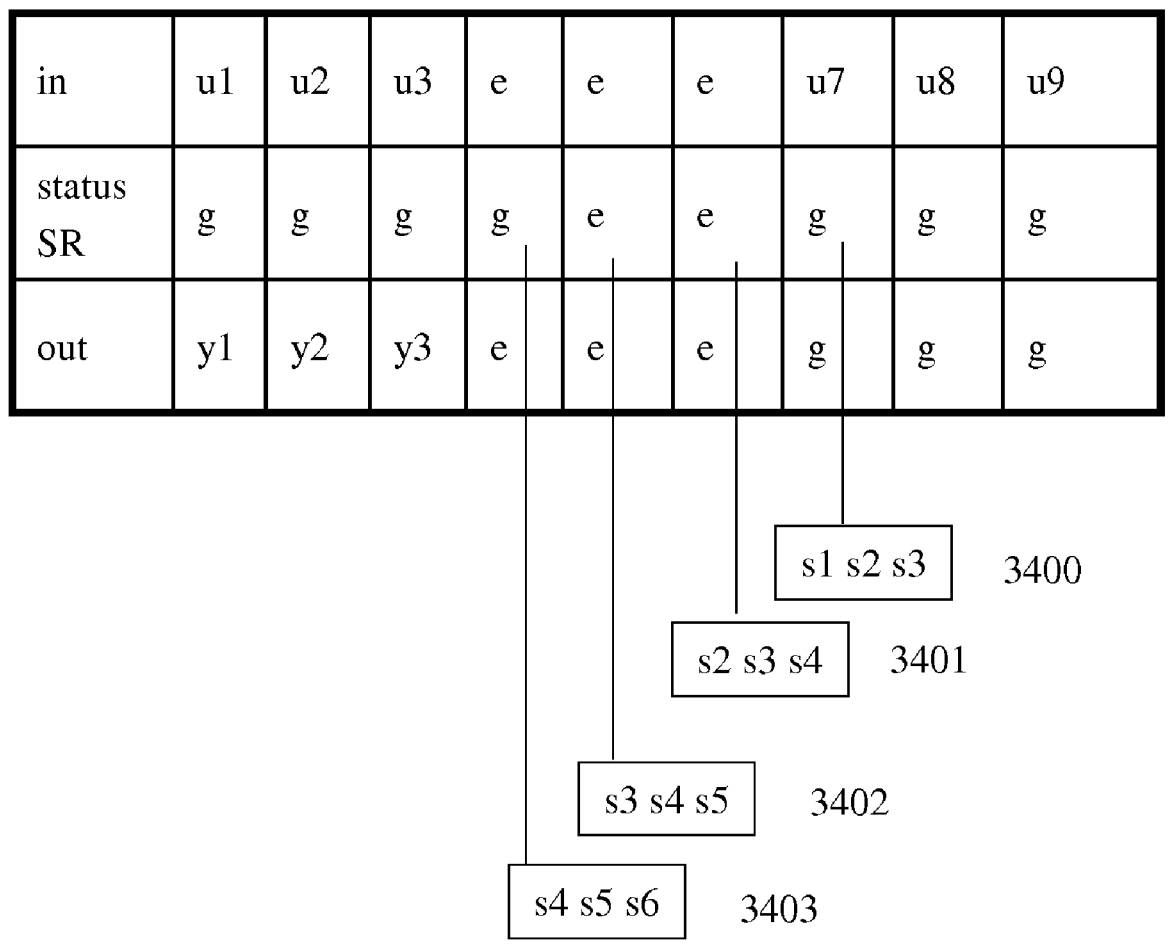
FIG. 34 is a status diagram of another decoding process.

The principle of such error correction is shown in FIG. 33 and FIG. 34. As an illustrative example the coders and decoders of FIGS. 19-22 will be assumed to have an n-valued shift register ($n \geq 2$) of 3 elements. FIG. 33 shows the status of the input, the status of the shift register and the status of the output of one decoder. The decoder receives a sequence u=[u1 u2 u3 u4 u5 u6 u7 u8 u0 u10]. By applying the earlier disclosed methods of the present invention one can determine that the symbols u4 u5 u6 and u7 are in error, indicated by an e in the table of FIG. 33 in the first row. The input sequence is error-free as of u8. The decoded sequence is y=[y1 y2 y3 y4 y5 y6 y7 y8 y9 y10]. Accordingly y4 y5 y6 and y7 were in error also, indicated as e. Because of the error correcting methods, y5, y6 and y7 can be corrected. Only y4 remains in error.

The status of the shift register RS (middle row of the table) is now also important. The symbol y4 is in error because y4 was in error. At that moment the shift register is still error free (or g in the table). In 3300, 3301, 3302, 3303 and 3304 the content of the correct shift register is provided. The content [s1 s2 s3] can be calculated. The content [s5 s6 s7] is also known (keeping in mind that the content of the shift register moves from left to right in each state). It is easy to see that too many errors have occurred and the beginning and ending of correct content of the shift register cannot be bridged.

Looking at FIG. 34 wherein just 3 errors were assumed the situation is different. The error of y4 can now be corrected. The value of y4 is determined as s3. The content of the shift register for in error input u4 is correct and known and is [s4 s5 s6]. The correct output for the decoder was determined as s3. Accordingly one can determine the correct value of the in error symbol u4. The same situation applies for the next two inputs (in error) u5 and u6. For each of those situations the state of the shift register is known and the correct output y5 and y6 are known. Using earlier developed equations one can determine u 5 and u6. Accordingly if no more consecutive errors in both synchronized sequences for the decoder occurred than the number of elements in the shift register one can correct the in-error symbols in the received sequences. One can then develop a search strategy for errors and restarting decoding to find and correct errors in the sequences that are used to form a Trellis for Trellis based decoding. One may for instance select a strategy that leaves simple errors alone, as a Trellis decoder will easily correct these errors. Accordingly one can use the here provided method as a pre-cleaner of the Trellis before going into decoding.

Trellis based methods are used in decoding a convolutional coded sequence. When a series of errors has occurred the Trellis may not be able to trace back the original sequence and create a catastrophic error burst. By calculating a restart point one can also restart a Trellis.

Calculating Initial n-valued Shift Register from Desired Exit State

In several coding schemes using shift registers including convolutional codes, it is desirable to terminate a coded sequence in a known state. This aspect in one form is known as tail-biting. One known method is to terminate a sequence with a series of known symbols. However added symbols add to the length of a sequence without adding to the payload or data content and lower the bandwidth efficiency. For this reason it is desirable to establish a known connection between an input state and an output state of a coder without adding symbols. In a forward n-valued coder such relation can not be established for coders with a coded sequence substantially longer than the shift register. Such a relation can be established for an n-valued feedback coder. However this process is not trivial. An example of establishing such a relationship is provided in U.S. Pat. No. 6,275,538 by Ramesh et al., issued on Aug. 14, 2001, entitled Technique for finding a starting state for a convolutional feedback encoder. The stated purpose of this invention is to create an initial state that is identical to an end state of the encoder. It determines such states by solving a matrix equation, which also involves determining an inverted matrix. This method may become quite time consuming when sequences are fairly long.

Figure 35:
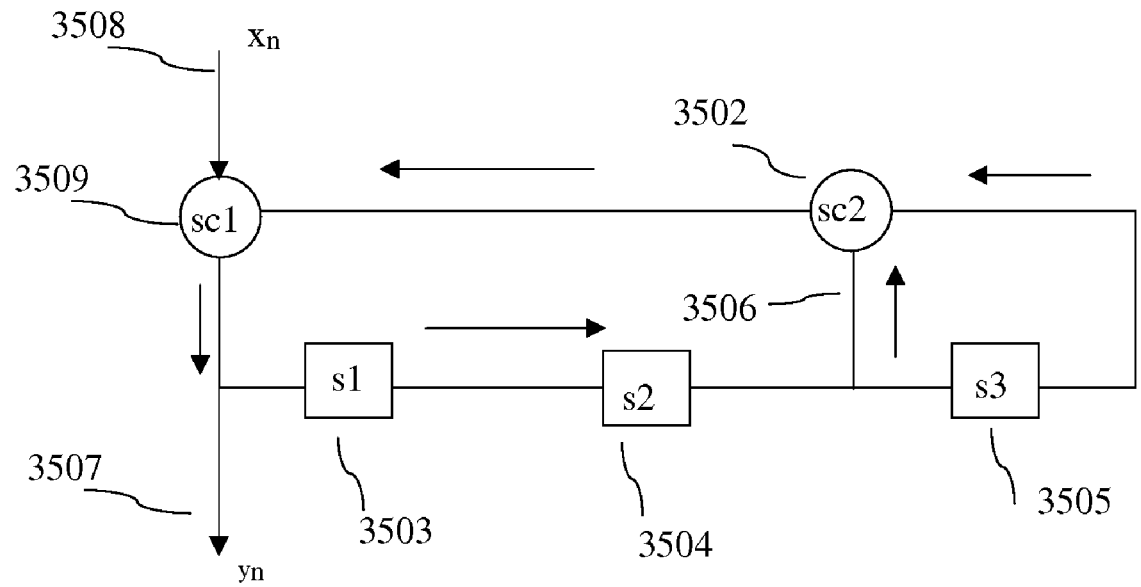
FIG. 35 is a diagram of a shift register based decoder in a first state.
Figure 36:
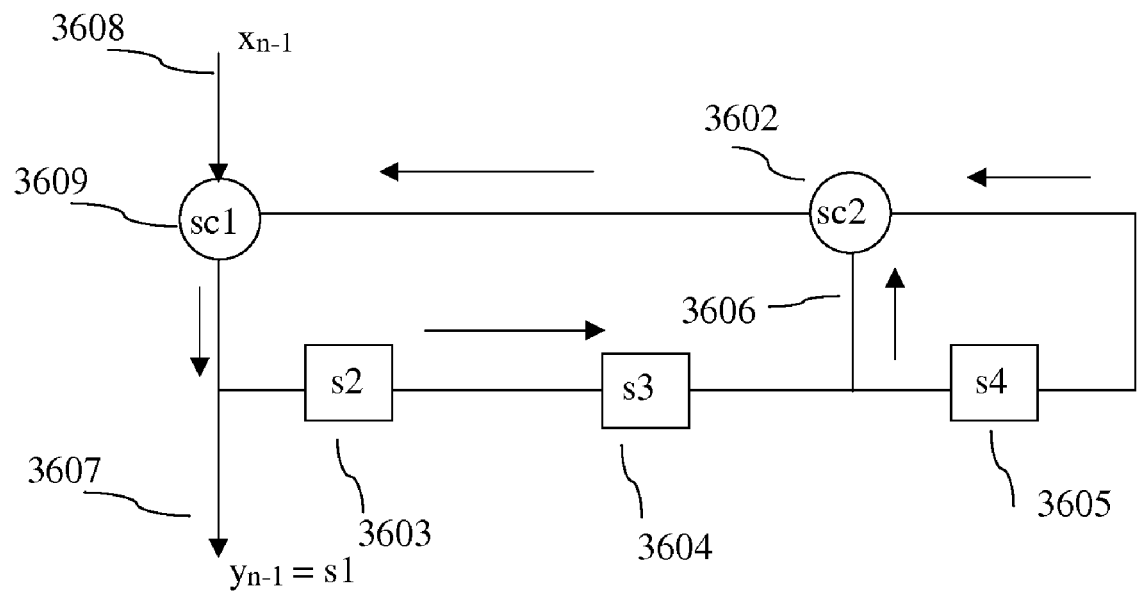
FIG. 36 is a diagram of the decoder of FIG. 34 in a second state.

It is another aspect of the present invention to provide a deterministic method to determine an input state of a feedback coder, based on a desired output state. Its principle is based on the fact that one reverses the direction of a scrambler. This is shown in FIGS. 35 and 36. In FIG. 35 an n-valued feedback coder (in this case a scrambler) is shown with a 3 element shift register. For ease of use the reversible n-valued functions sc1 and sc2 are assumed to be identical and self-reversing functions sc. To further limit complexity it is assumed that n is a power of 2 and that sc is associative in $GF(2^p)$. This is just assumed for the illustrative example. One skilled in the art can fairly easily check that the reasoning applies for all n-valued reversible logic functions. In FIG. 35 the output signal $y_n$ on output 3507 is created from input signal $x_n$ on 3508 and from the content of the shift register elements [s1 s2 s3] in 3503, 3504 and 3505. FIG. 36 shows the coder of FIG. 35 in the state preceding that of FIG. 35. The output is now $y_{n-1}$, the input is $x_{n-1}$ and the content of the shift register is [s2 s3 s4].

Assume that content [s1 s2 s3] is known and that all input symbols [$x_1$ $x_2$ ... $x_{n-1}$ $x_n$] are known. This means that one can calculate all values on the output and the consecutive states of the shift register. Because the coder pushes the content of the shift register from left to right, the reverse pushes it from right to left. Because the content of the first element is always identical to the preceding output symbol: $y_{n-1}$=s1. The equation for the coder of FIG. 36 is:

$y_{n-1} = x_{n-1} sc\ (s3\ sc\ s4)$ or, $s1 = x_{n-1} sc\ (s3\ sc\ s4)$ and thus:

$s4 = x_{n-1}\ sc\ s1\ sc\ s3$.

Accordingly one has determined the output as well as the state of the shift register and one can repeat this process for each preceding state of the coder. This means that one may require an end state of a shift register and calculate what the initial state of the coder should be to achieve this end state. In some cases one may to want to impose a known state on not a last state, for instance to be able to calculate if errors have occurred and error correct the state. Accordingly one may make a state at least (p+1), with p the length of the shift register, before the end of the sequence a known state. This allows one to calculate if the end state or the beginning state were in error. Realizing that the imposed state may be a real end state or a close to end state, it will be called an 'end' state. One way to impose an 'end' state is for instance providing a known state like [0 1 2] if the coder is a ternary coder. However one may also require that the 'end' state is related to the input sequence; for instance the 'end' state should be identical to the first three symbols of the inputted sequence.

In a first illustrative example assume the coder to be binary and the input sequence: sigin=[0 1 1 1 1 0 1 0 0 1 0 0 1 0 1 1 0]. The function sc is +mod-2. Further assume that the end state is identical to the first 3 symbols of sigin or [0 1 1]. A program executing the method will generate as result [0 1 0] as initial state. One can then run the coder again and check that with initial state [0 1 0] the end state is indeed [0 1 1]. One should keep in mind that in the example the final state is the state of the shift register that will generate the last result. One can also generate the state following that state, but that requires another clock pulse. Though using that state as an end state is fully contemplated.

As a ternary illustrative example one can use the self reversing ternary function sc of which the truth table is provided in the following table.

| sc | 0 | 1 | 2 |
|---|---|---|---|
| 0 | 1 | 0 | 2 |
| 1 | 0 | 2 | 1 |
| 2 | 2 | 1 | 0 |

The equations for the method in the ternary illustrative case are:

$y_{n-1} = x_{n-1} sc\ (s3\ sc\ s4)$ or, $(s1\ sc\ x_{n-1}) = (s3\ sc\ s4)$ and thus:

$(s1\ sc\ x_{n-1})\ sc\ s3 = s4$ $s4 = x_{n-1}\ sc\ (s1\ sc\ s3)$.

Assume an input signal sigin3=[0 1 2 1 0 2 2 1 0 1 1 1 0 2 0 0 2 1 2 0 0 1 1] to the ternary coder. Make the end state again identical to the first three symbols of the input sequence [0 1 2]. Using again the method as disclosed will generate the initial state [1 0 1]. One can check this by running the ternary coder with initial state [1 0 1] and reaching end-state [0 1 2].

The method works for all n-valued coders either in scrambler or in convolutional coder configuration. For n=$2^p$ and sc being reversible, commutative and associative convolutional coder and scrambler configurations are identical, as was shown before.

One should keep in mind that in the above method the beginning state is not known and should be calculated. The assumption is that it is unlikely that beginning as well as ending of a sequence will have catastrophic errors and that correct determination of at least one state is possible and calculation is both state is likely.

The reversing method for a scrambler as provided here is not a descrambler. The functional approach is different and the movement of the shift register content is different. Also the input of the reversing method starts at the end of a sequence rather than at the beginning. The method has been applied to a scrambler configuration. It should be clear and it is fully contemplated to apply to descramblers as well as to convolutional coders and decoders.

Recursive Systematic Convolutional Coders

Figure 37:
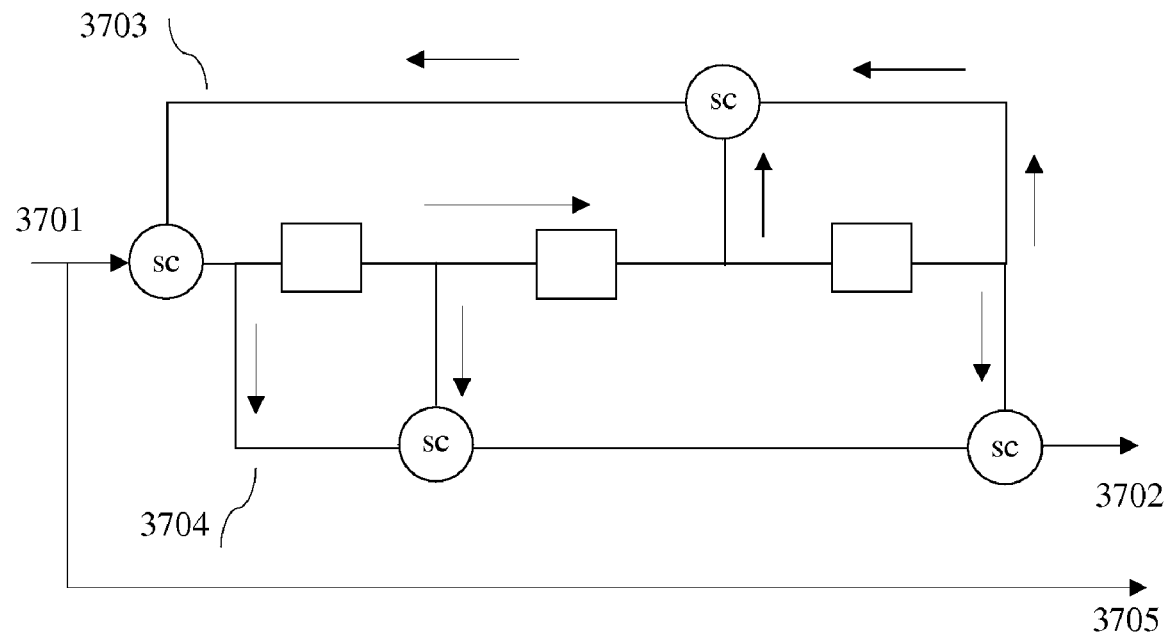
FIG. 37 is a diagram of a Recursive Systematic Convolutional (RSC) coder.

Recursive systematic convolutional (RSC) coders are generally applied in Turbo Coders. FIG. 37 shows a 3-element RSC coder. It comprises the recursive part 3703, the convolutional forward coder 3704, and the unmodified or systematic output 3705. Such a coder is known in binary form but is believed to be novel for n-valued inputs and functions. The functions can be all different as long as they are n-valued reversible logic functions for an n-valued input. In order to keep the equations simple it is assumed that all functions are identical and are called sc. It is also assumed that sc is self reversing, commutative and associative. This means that $n=2^p$. As before, it is easy to demonstrate for a person skilled in the art that the methods apply for other values of n.

Figure 38:
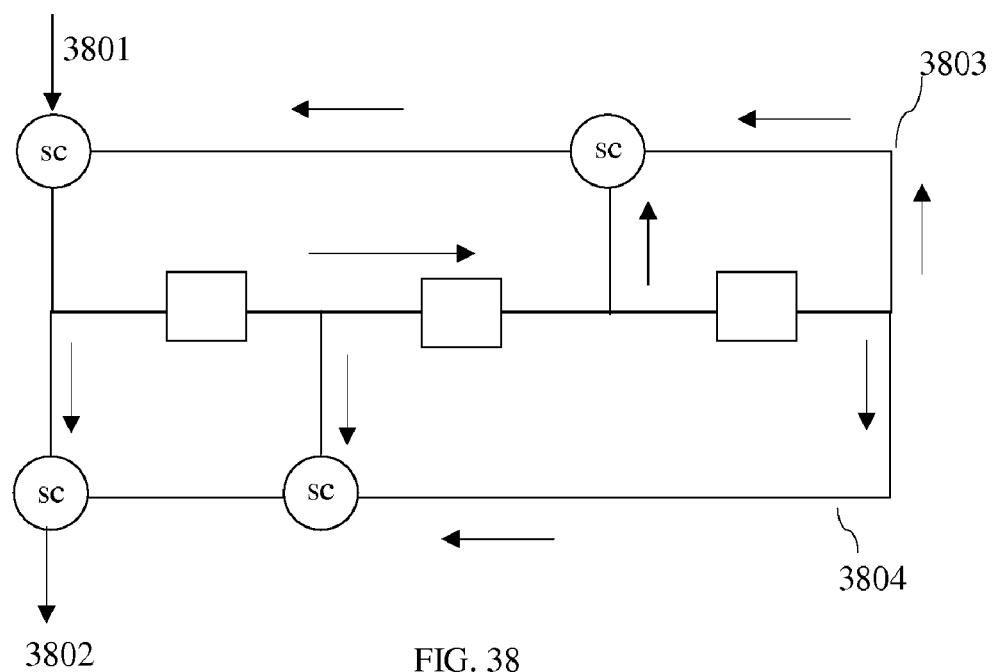
FIG. 38 is an equivalent diagram of an RSC coder.
Figure 39:
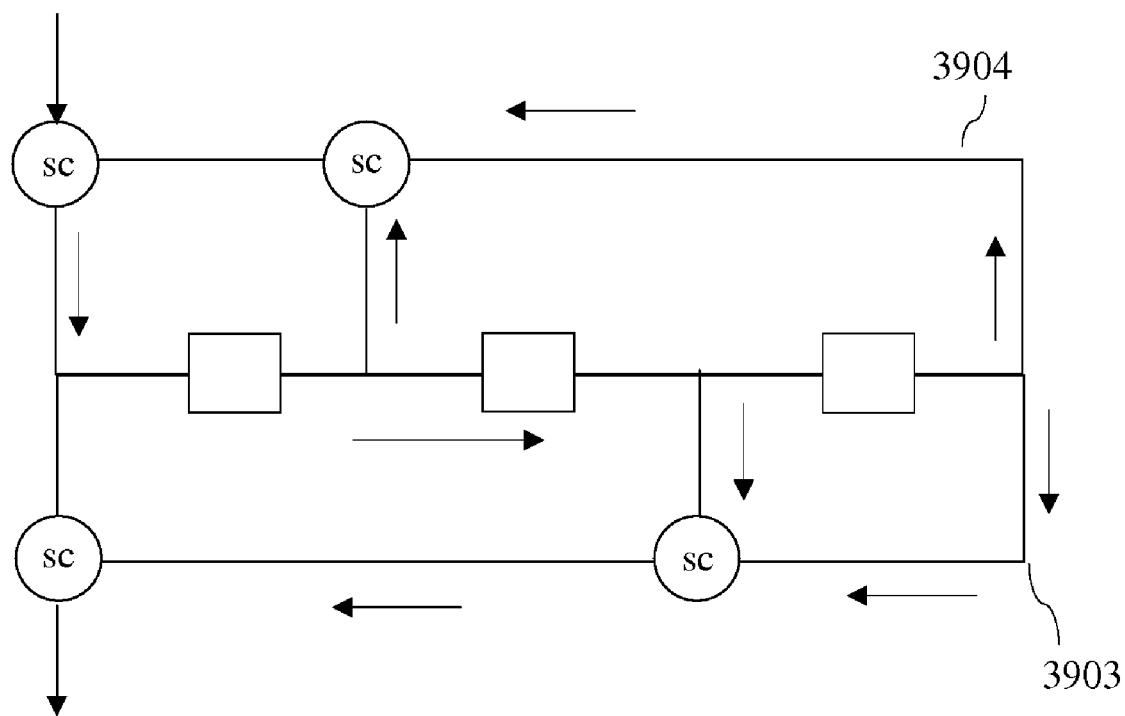
FIG. 39 is a diagram of an RSC decoder.

In light of earlier analysis it should be clear that recursive or feedback coder 3703 determines the state of the shift register. The forward coder 3705 uses the state of the shift register but does not influence it. Further more, and based on earlier analysis, it should be clear that 3703 is in fact a scrambler and 3704 (under the earlier assumptions) can be represented as a descrambler. This is shown in FIG. 38, wherein the systematic part is not drawn. The coder 3703 is drawn as 3803 and coder 3704 is now coder 3804. FIG. 39 shows the combined decoder for the combined coder.

As an illustrative example assume that the coder is a 5-valued RSC coder wherein sc is a 5-valued self-reversing function. (it is not associative, but that does not matter in this case as one starts out with FIG. 38 as the coder). The truth table of 'sc' is provided in the following table.

| sc | 0 | 1 | 2 | 3 | 4 |
|---|---|---|---|---|---|
| 0 | 0 | 4 | 3 | 2 | 1 |
| 1 | 4 | 3 | 2 | 1 | 0 |
| 2 | 3 | 2 | 1 | 0 | 4 |
| 3 | 2 | 1 | 0 | 4 | 3 |
| 4 | 1 | 0 | 4 | 3 | 2 |

Figure 40:
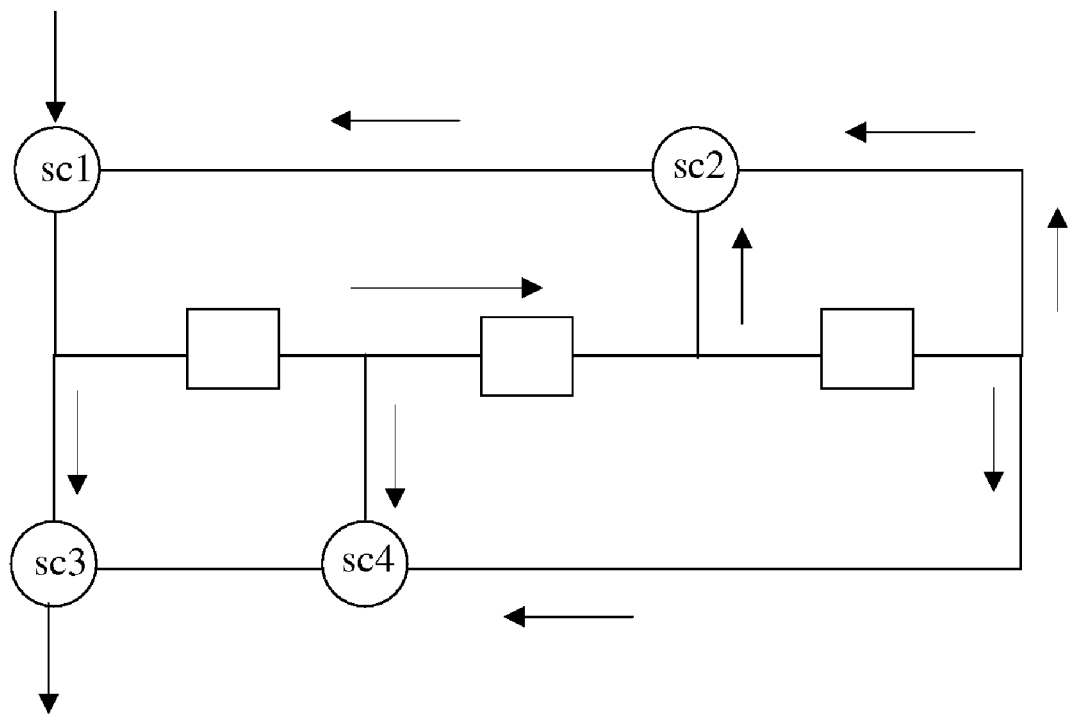
FIG. 40 is a diagram of an RSC coder.
Figure 41:
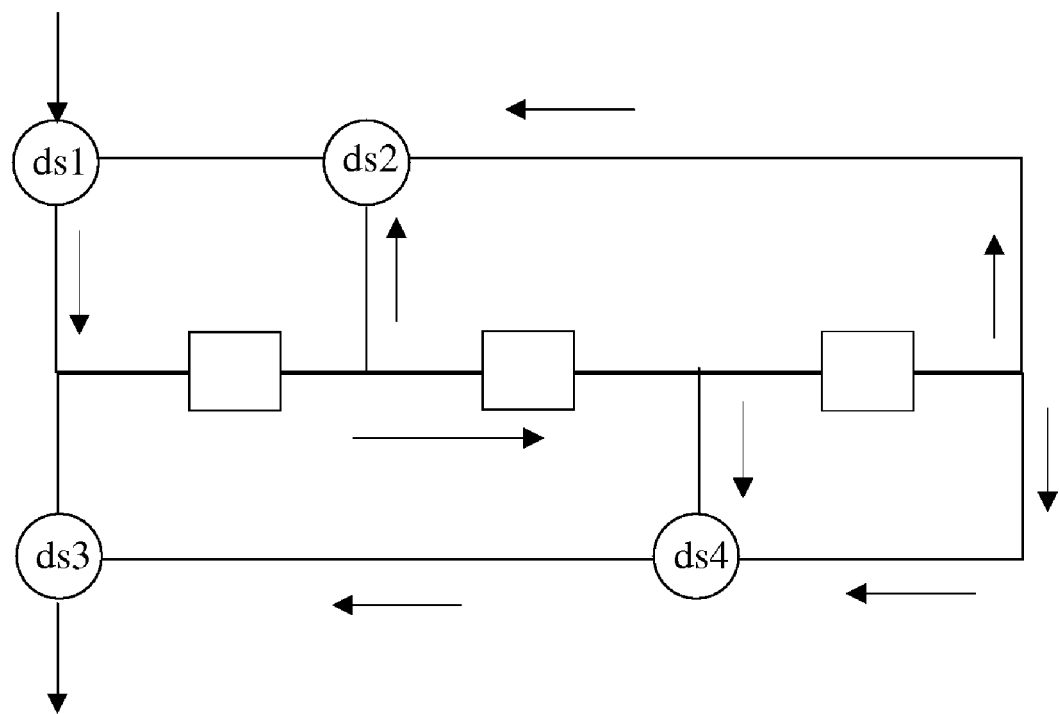
FIG. 41 is a diagram of an RSC decoder.

Assume a valued input signal [0 1 2 3 4 3 4 3 1 2 2 0 1 0 0 1 4 3 1 2 3 4 0 4] and an initial shift register content [0 2 4] this will create [3 2 2 1 4 0 3 4 3 4 4 4 2 0 1 2 4 2 3 3 3 1 0 0 2 0]. Entering the result into the decoder of FIG. 39 with the same initial content will recover the original signal. The rules earlier established for matching n-valued scrambler and descrambler pairs, as disclosed in U.S. Non-Provisional Patent Application Ser. No. 10/935,960, filed on Sep. 8, 2004, entitled TERNARY AND MULTI-VALUE DIGITAL SCRAMBLERS, DESCRAMBLERS AND SEQUENCE GENERATORS and which is incorporated herein by reference, apply to the RSC coders and decoders as shown in FIGS. 38 and 39. For illustrative purposes the coder of FIG. 38 is shown in FIG. 40 with all different n-valued logic functions sc1, sc2, sc3 and sc4. The matching RSC decoder as shown in FIG. 41 has the n-valued logic functions ds1, ds2, ds3 and ds4. According to the rule established in the cited patent application the functions which process the symbols from the shift register only in the coder sc2 and sc4 should be the same in the decoder in corresponding positions. This means that ds4=sc2 and ds2=sc4. Further more the functions in the encoder that also has external symbols as input should have the reversing function in corresponding position in the decoder. Accordingly: $ds1=sc3^{-1}$ and $ds3=sc1^{-1}$. One should be careful to watch the order of inputs if functions are not commutative. The here provided rules apply to any of the n-valued RSC coders with shift registers of length 2 or greater.

An analysis of the RSC encoder of FIG. 39 and FIG. 40 shows that only the 'scrambler' part of the encoder (3904 in FIG. 39) affects the contents of the shift register. The convolutional or descrambler coder part further modifies the generated signal, but does not contribute to a change in the shift register. In accordance with a further aspect of the present invention this phenomenon will be used to detect errors.

It was noted that only the scrambler contributes to the content of the shift register. This suggests that in decoding one can apply a partial RSC decoder, consisting only of the descrambler part of the RSC coder. This will be applied to find where errors start in a received n-valued signal that was RSC coded. Assume a signal 'sign' is a sequence of n-valued symbols that is RSC coded according to an RSC coder as shown in FIGS. 37 and 38. That means that (for illustrative purposes) the shift register is assumed to have 3 elements and the taps as shown. This generates a coded sequence 'outn'. The sequences sign (the systematic part) and 'outn' (the coded part) are transmitted over a channel. Usually 'outn' and 'sign' will be serialized by a multiplexer. During transmission both 'outn' and 'sign' may experience errors.

Figure 42:
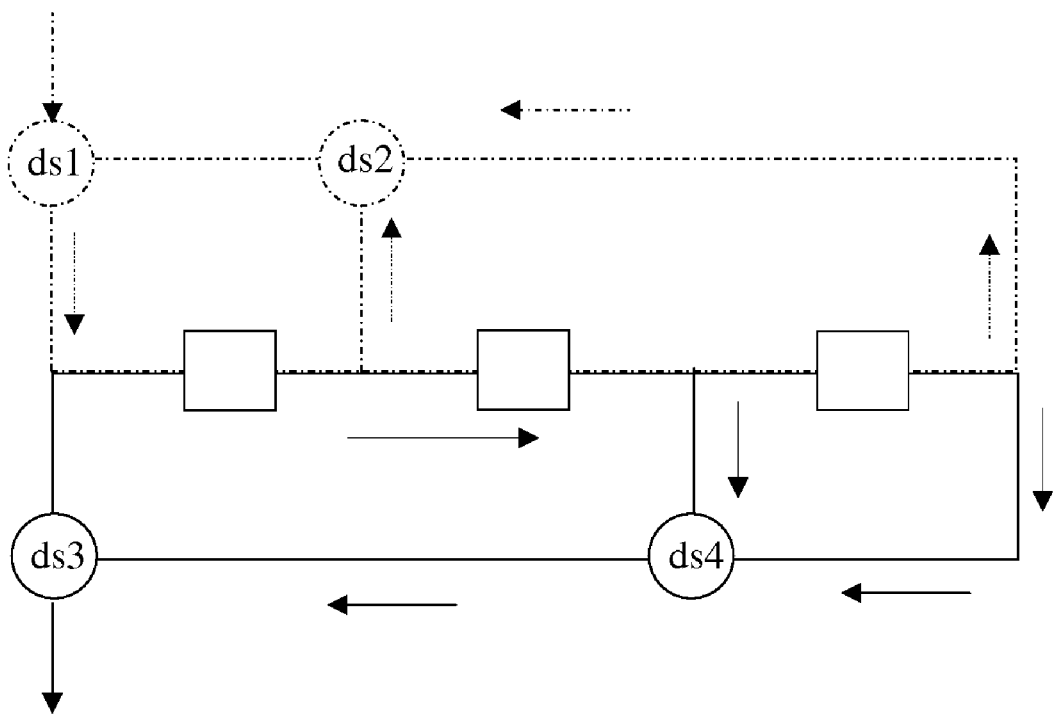
FIG. 42 is a first diagram of a reduced RSC decoder.

The errors in 'sign' will lead to a sequence 'signe', and the errors in 'outn' will create a sequence 'outne'. It is of course not known a priori where the errors occurred. A simple way to find the start of errors is the following. Take the sequence 'signe' and code this sequence according to the coder of 'sign' with identical initial shift register content, and generate a sequence 'outnre'. In a next step decode both 'outnre' and 'outne' with the descrambler of FIG. 42 with the same initial shift register content as the coder. The descrambler of FIG. 42 is in fact only the descrambler part of the decoder as shown in FIG. 41. The dotted part of FIG. 42 is assumed to be inactive in this part of the method of decoding. Decoding 'outnre' will create 'resnre' and decoding 'outne' will create 'resne'. Comparing 'resnre' and 'resne' and determining where both sequences start to be different shows were errors started. After errors the shift register of the descrambler flushes. This means that counting back according to the length of the shift register from the position in the comparison where both sequences are identical again one may find the ending of the errors. One should calculate, as was shown earlier, what the correct content of the shift register is at the first correct position, and determine the error corrected symbols.

The following 8-valued example will be used to demonstrate the method. Assume al functions to be the earlier defined self reversing commutative and associative 8-valued function fp. The input signal sign=[0 1 2 3 4 5 6 7 0 1 2 3 4 5 6 7 0 1 2 3 4 5 6 7]. The initial state of the shift register is set at [0 7 1]. Coding 'sign' with the coder of FIG. 38 will generate outn=[7 7 2 5 1 4 2 4 2 6 6 4 5 4 0 3 0 2 2 3 5 1 6 5]. Assume that symbols 6, 7 and 8 of the received coded sequence were in error. For instance they all were received as [5 5 5] so that the received coded sequence 'outn' has now become outne=[7 7 2 5 1 5 5 5 2 6 6 4 5 4 0 3 0 2 2 3 5 1 6 5]. Assume that the systematic part of the code, which is the unmodified sequence 'sign', also has experienced errors in symbols 6, 7 and 8, for instance they were received as [0 0 0]. Accordingly 'sign' is now: signe=[0 1 2 3 4 0 0 0 1 2 3 4 5 6 7 0 1 2 3 4 5 6 7].

In a following step 'signe' is coded according to the coder, generating: outnre=[7 7 2 5 1 7 4 6 5 7 2 7 1 0 1 0 2 6 3 4 7 0 4 3]. In a next step both 'outnre' and 'outne' will be decoded by a descrambler corresponding to the coder. This results into:
resnre=[1 0 6 5 5 1 3 4 0 1 4 5 5 6 7 1 4 5 5 5 5 6 7 1] and
resne=[1 0 6 5 5 2 1 1 2 6 4 5 5 6 7 1 4 5 5 5 5 6 7 1]. Comparing the two sequences, by for instance subtracting them from each other, provides:
resnre-resne-=[0 0 0 0 0 -1 2 3 -2 -5 0 0 0 0 0 0 0 0 0 0 0 0 0 0].

This result demonstrates that the descrambler allows determining where the first error occurred: in symbol 6. It also shows the benefit of decoding with a descrambler rather than with an RSC decoder. After a certain number of errors the shift register will be flushed and accordingly one can detect a plurality of errors, given sufficient error free symbols between errors, without having to first restart the decoding process with calculated content of the shift registers. This will be illustrated in the following 8-valued example.

Assume that due to errors the following results are achieved:
outnre=[7 7 2 5 1 7 4 6 5 7 2 7 1 0 1 0 2 6 3 4 7 0 4 3]
outne=[7 7 2 5 1 5 5 5 2 6 6 4 5 4 0 4 4 4 2 3 5 1 6 5]
outnre-outne=[0 0 0 0 0 2 -1 1 3 1 -4 3 -4 -4 1 -4 -2 2 1 1 2 -1 -2 -2]

The result of 'outnre-outne' demonstrates that a first error occurred at symbol 6. But nothing can be concluded about additional errors. Decoding 'outne' and 'outnre' by the RSC decoder and subtracting the result will provide:
[0 0 0 0 0 4 5 3 7 2 2-3-2 0-2-1 1 1 4-1 2 1-6-2]. Nothing can be concluded from this result about additional errors. However descrambling 'outne' and 'outnre' will create:
resnre=[1 0 6 5 5 1 3 4 0 1 4 5 5 6 7 1 4 5 5 5 5 6 7 1] and
resne=[1 0 6 5 5 2 1 1 2 6 4 5 5 6 7 5 0 0 2 3 6 6 7 1] and the difference:
resnre-resne=[0 0 0 0 0 -1 2 3 -2 -5 0 0 0 0 0 -4 4 5 3 2 -1 0 0 0].

This shows that after one or more errors at position 6 a new series of errors started at position 16. The same applies if errors occur in both sequences in position 16.

One can apply the previous disclosed method of calculating a restart point based on finding the start of errors. The descrambler of FIG. 42 allows for comparison of sequences, without completely decoding them. A sequence, descrambled by FIG. 42 may be considered an intermediate state of decoding. Accordingly two identical sequences coded by the RSC coder and then descrambled will create identical intermediate sequences. If the two coded sequences have differences (like errors) descrambling will generate different sequences only so far as the differences in the input sequences exists plus the propagation through the length of the shift register. After that the sequences will be identical again. Assume having an n-valued RSC coder with a shift register of length p, having a first and a second identical sequence coded by a RSC; and inserting an error in one of the resulting sequences at position k. Decoding both sequences with a descrambler will create almost identical sequences, with a difference starting in symbol k and that can last up till the k+p symbol. After that the shift register is flushed and the sequences will be identical again, until a new error occurs.

Because errors in descramblers are not catastrophic errors, one can first establish where potential errors have occurred. Then with methods here disclosed one can calculate the restart value of the shift register of the RSC decoder. Once that is established one can error correct the errors that have occurred, in so far each series of consecutive errors in the relevant part of the sequences do not exceed the length of the shift register. Also there should be a minimum number of non-error symbols between errors.

Assuming for illustrative purposes an RSC coder of FIG. 38 with decoder FIG. 39. It is to be understood that the method here presented in accordance with a further aspect of the present invention will apply to any n-valued RSC with p length shift register and n-valued functions which are reversible. For the purpose of the illustrative example it is assumed that sc is a commutative, reversible n-valued logic function with associative properties and that (b sc a sc a)=b. For an example of such a function see the earlier provided 8-valued function fp. Assume that an error free part of an input sequence is [x1 x2 x3]. The error free coded corresponding output of the RSC coder is [u1 u2 u3]. The content of the shift register when decoding u1 into x1 is [s1 s2 s3]. As before the equations related to the combinations (u1,x1), (u2,x2) and (u3,x3) can be determined; they are:

$x1 = u1 \; sc \; s1 \; sc \; s2$ $x2 = u1 \; sc \; u2 \; sc \; s3$ $x3 = u2 \; sc \; u3 \; sc \; s2$

Assuming that [x1 x2 x3] and [u1 u2 u3] are error free one can determine [s1 s2 s3].

Figure 43:
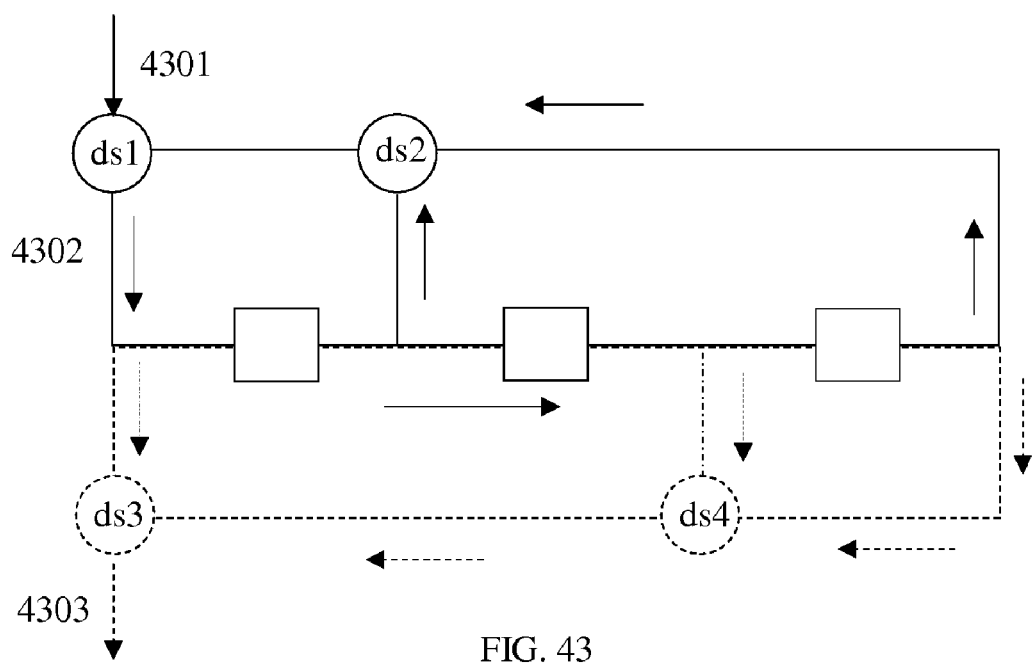
FIG. 43 is a second diagram of a reduced RSC decoder.

FIG. 43 shows the scrambler that is part of the RSC decoder that can be used to correct errors in the received coded and in the systematic (uncoded) sequence. In the previous part it was shown how one can determine where a first error has occurred in a series of errors in a RSC coded sequence. It was then shown how one can calculate the content of the shift register once no errors are present. In this section, using as an illustrative example the scrambler of FIG. 43, wherein the dotted lines indicate a part of the decoder that will initially not be considered.

Figure 44:
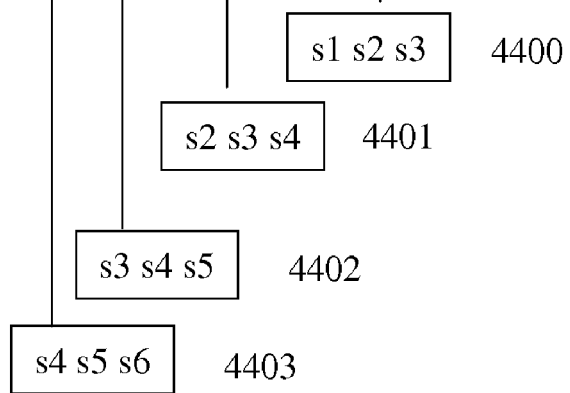
FIG. 44 is a status diagram of an RSC decoder.

FIG. 44 is a diagram showing the states of input 4301 of the scrambler of FIG. 43; it also shows the states of the output 4302 of the scrambler (which will also be shifted into the shift register), and the state 4303 of the output of the coder. The output 4303 is important, because it provides the end result of the decoding process. However 4303 will not influence the state of the shift register, neither of the decoder nor of the scrambler.

Assume that by the earlier provided methods, it was established that the first error occurred in position 4 of the received systematic and/or to be decoded sequences. Further more it was established that at position 7, both sequences are error free. At position 7 the content of the shift register is calculated to be [s1 s2 s3]. This means that the output of the scrambler (not of the decoder) in positions 4, 5 and 6 is [s3 s2 s1]. This by itself may not be sufficient to calculate the error-free input or output of the coder. The reason for that is of course the additional decoding step that requires the correct content of the shift register. If the number of parallel errors did not exceed the length of the shift register one can then calculate the value of the inputs or outputs. The last correct content of the shift register before it contained errors is known, and is [s4 s5 s6] at position 4. The error produced at position 4 is because either the input or the output or possibly both were in error. However at that time the content of the shift register is still correct. As both the shift register content as the output of the scrambler 4302 are known at this stage one can, as shown before, calculate the correct output 4303 of the decoder as well as the correct input 4301.

Applying the above methods the calculated content of the shift register at position 9 is [s1 s2 s3]=[0 2 3]. The content of the shift register at position 6 can be calculated by running 'signe' through the coder until position 6 before the content is shifted to position 7. That content is [s4 s5 s6]=[1 3 5]. Accordingly the content of the shift register at position 7 is [3 1 3] and at position 8 is [2 3 1]. Further more the output of the scrambler at positions 6, 7 and 8 is [3 2 0]. One can then calculate the correct output of the RSC coder at positions 6, 7 and 8 to be [5 6 7]. The corresponding error free coded input symbols at 4301 at positions 6, 7 and 8 is calculated at [4 2 4]. One can check with the earlier data that this result is correct.

The methods of the present invention have been explained in detail for binary and non-binary and mainly non-systematic coders and decoders. In systematic situations a non-coded copy of an input sequence is available. This will simplify the equations to solve restarting and error correction as well as end state calculation. In general ½ coding methods have been analyzed, wherein 1 input sequence is coded into 2 sequences. Related coders are 1/k coders and the methods here provided can also be used, wherein 1 sequence is coded into k sequences. Somewhat more complex coders are p/k coders wherein p input sequences are coded into k sequences. However in most cases fairly simple equations can be derived to solve instantaneous equations over the length of the used shift register, wherein usually the length of the longest shift register will determine the complexity.

In accordance with a further aspect of the present invention a method will be provided for determining an initial state of the shift register of an RSC coder in order for the RSC coder to have a known content in the shift register in a known position in the coded sequence. This method is similar to the earlier provided method of reverse scrambling. The reason for that is that in the RSC coder, for instance as provided in FIG. 38, the coder can be analyzed as comprising a scrambler and a descrambler part. As stated earlier only the scrambler part contributes to the content of the shift register. Accordingly if one wants to have a content [s1 s2 s3] in the shift register of the RSC coder at a position k, having a known input symbol $x_n$ from the sequence of symbols to be coded, one can reverse the process of scrambling, including determining the content of the shift register at previous positions. The reason for that, as stated before, is that the output of the scrambler at the position preceding position k is s1, the input symbol to the scrambler is known and is $x_{n-1}$ and the content of the shift register at that position is [s2 s3 s4]. The unknown is s4, which can be calculated as before. One can then reverse the whole scrambling process along the symbols of the sequence until one arrives at the first position of the sequence with of course the initial content of the shift register.

An illustrative example again assumes an RSC coder as shown in FIG. 38 with the 8-valued self-reversing, associative logic function sc is fp.

Assume an input sequence sig8=[0 1 2 3 4 5 6 7 0 1 2 3 4 5 6 7 0 1 2 3 4 5 6 7] and make the content of the shift register of the RSC coder [7 7 7] at the last coding position of the sequence. One can then easily determine that the initial content has to be [5 5 3]. In order to check one can then run the RSC coder with the initial content [5 5 3] and and find that the end state will have the content [7 7 7]. The sequence generated by the RSC coder is then: out8=[0 7 1 4 2 7 3 5 2 3 2 0 0 7 7 3 4 6 1 2 0 3 6 7]. Further more one can check that decoding the sequence out8 with the decoder of FIG. 39 will recover the original sig8 when the correct initial shift register content is applied.

Figure 45:
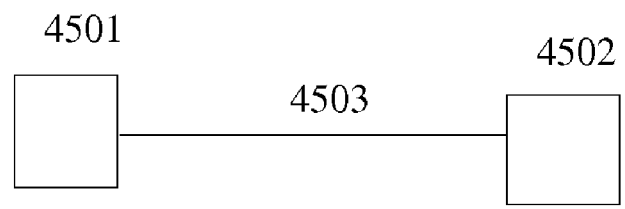
FIG. 45 is a diagram of a system in accordance with one aspect of the present invention.

In accordance with a further aspect of the present invention a communication system is provided for communication between at least two apparatus, at least two apparatus applying one or more of the methods provided in accordance with one or more aspects of the present invention. A diagram of such a system in a first embodiment is shown in FIG. 45 and has two apparatus 4501 and 4502. However it may have more apparatus also. An apparatus may be a telephone, for instance a mobile phone. An apparatus may also be a personal computer or any other computing device. An apparatus should comprise circuitry for receiving and/or sending of signals. For instance 4501 may be a remote control able to transmit data and 4502 a receiver, able to receive data. The connection 4503 can be a wireless connection or a wired connection, suitable for transmitting data.

Figure 46:
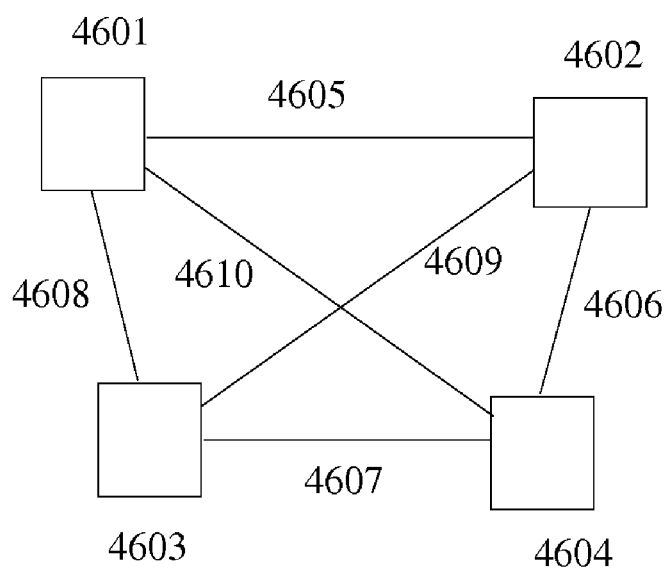
FIG. 46 is a diagram of a system in accordance with another aspect of the present invention.

A second embodiment is shown in FIG. 46, wherein more than 2 apparatus are present to use one or more methods in accordance with the different aspects of the present invention. An embodiment as shown in diagram in FIG. 46 may be considered a peer-to-peer network wherein none of the 4 apparatus 4601, 4602, 4603 and 4604 shown as an illustrative example have inherent priority for communication, except perhaps rules that an apparatus may finish communicating once it has started. The protocol of such a network may be: all-connected-to-all, such as in a radio connection; it may also be that some type of ring network is used, wherein for instance only 4605, 4606, 4607 and 4608 are used. Herein all the apparatus will perform one or more aspects of the present invention.

Figure 47:
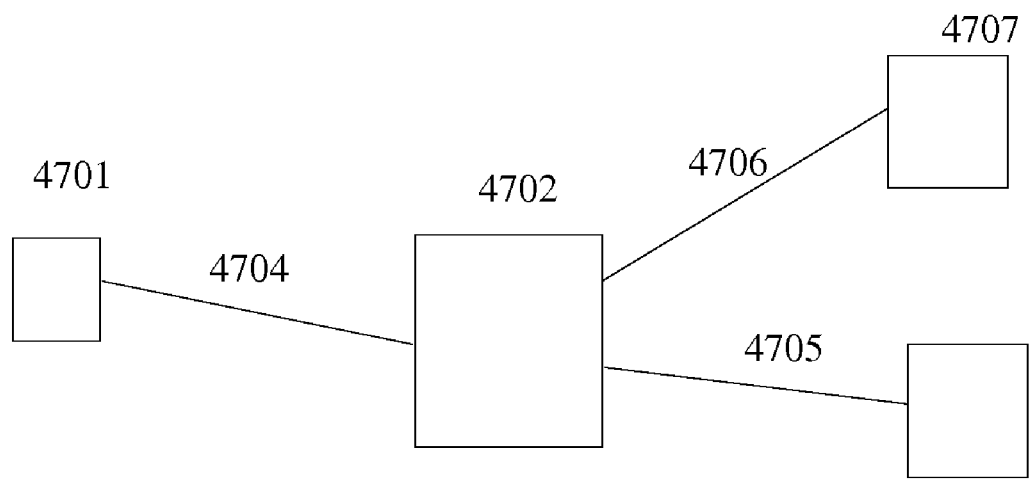
FIG. 47 is a diagram of a system in accordance with a further aspect of the present invention.

A third embodiment of a system is shown in diagram in FIG. 47. Herein at least 3 apparatus are included: an apparatus 4701 to communicate with apparatus 4703 and network apparatus 4703. Communication takes place over a network that has connections 4704 and 4706. Further more one or more apparatus 4702 may be included in the transmission way to facilitate transmission. Accordingly 4704, 4702 and 4706 may represent all aspects of a network, including switches, servers, routers, modems and other equipment for completing transmitting signals between 4701 and 4703. In many cases an apparatus 4701 can also communicate with other apparatus such as 4707. The network is thus not limited to only two communicating apparatus but may include one more or for instance 1000s more. However two apparatus when communicating should be aware of each other's use of methods according to the different aspects of the present invention, in order to correctly decode signals and correct errors for instance. One or more aspects of the coding/decoding and error correction methods may be present in network apparatus such as 4702. One or more aspects of the present invention are present in at least two apparatus of the network.

Other systems using error correcting coding, specifically in data storage are also fully contemplated.

The methods of encoding and decoding in accordance with the different aspects of the present invention are explained with examples within the context of error correction. It should be apparent to one skilled in the art that the novel methods and apparatus for encoding and decoding, such as the RSC coder and decoder can be used for encryption and decryption purposes also. In fact one may then leave out the redundant systematic part.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto. For instance n-valued shift registers are used in the illustrative examples. It should be clear that implementation of n-valued shift registers can be realized in various ways. Including by using addressable memories and Look-up Tables. N-valued switching functions can be implemented in different ways. One way is to apply a memory based switching table having the states of the switching function. Signals can be n-valued digital or discrete signals. They can also be represented in binary form. N-valued switching here means any form of n-valued switching and can for instance be achieved in electronic form, in optical form, in electromechanical form or any form where n-valued output states can be achieved from one or more n-valued input states. The different aspects of the present invention can be implemented as instructions on a processor, in dedicated switching applications or any other means that can realize n-valued switching functions and data retaining elements.

The following patent applications, including the specifications, claims and drawings, are hereby incorporated by reference herein, as if they were fully set forth herein: (1) U.S. Non-Provisional Patent Application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (2) U.S. Non-Provisional Patent Application Ser. No. 10/936,181, filed Sep. 8, 2004, entitled TERNARY AND HIGHER MULTI-VALUE SCRAMBLERS/DESCRAMBLERS; (3) U.S. Non-Provisional Patent Application Ser. No. 10/912,954, filed Aug. 6, 2004, entitled TERNARY AND HIGHER MULTI-VALUE SCRAMBLERS/DESCRAMBLERS; (4) U.S. Non-Provisional Patent Application Ser. No. 11/042,645, filed Jan. 25, 2005, entitled MULTI-VALUED SCRAMBLING AND DESCRAMBLING OF DIGITAL DATA ON OPTICAL DISKS AND OTHER STORAGE MEDIA; (5) U.S. Non-Provisional Patent Application Ser. No. 11/000,218, filed Nov. 30, 2004, entitled SINGLE AND COMPOSITE BINARY AND MULTI-VALUED LOGIC FUNCTIONS FROM GATES AND INVERTERS; (6) U.S. Non-Provisional Patent Application Ser. No. 11/065,836 filed Feb. 25, 2005, entitled GENERATION AND DETECTION OF NON-BINARY DIGITAL SEQUENCES; (7) U.S. Non-Provisional Patent Application Ser. No. 11/139,835 filed May 27, 2005, entitled MULTI-VALUED DIGITAL INFORMATION RETAINING ELEMENTS AND MEMORY DEVICES; (8) U.S. Provisional Patent Application No. 60/695,317 filed on Jun. 30, 2005 entitled CREATION AND DETECTION OF BINARY AND NON_BINARY PSEUDO-NOISE SEQUENCES NOT USING LFSR CIRCUITS; (9) U.S. Provisional Patent Application No. 60/720,655 filed on Sep. 26, 2005 entitled: ENCIPHERMENT OF DIGITAL SEQUENCES BY REVERSIBLE TRANSPOSITION METHODS AND SELF-SYNCHRONIZING DETECTION METHODS FOR SEQUENCES NOT USING LFSRS; (10) U.S. Non-Provisional Patent Application Ser. No. 11/534,837, filed on Sep. 25, 2006, entitled GENERATION AND SELF-SYNCHRONIZING DETECTION OF SEQUENCES USING ADDRESSABLE MEMORIES; (11) U.S. Non-Provisional Patent Application Ser. No. 11/555,730, filed on Nov. 2, 2006, entitled SCRAMBLING AND SELF-SYNCHRONIZING DESCRAMBLING METHODS FOR BINARY AND NON-BINARY DIGITAL SIGNALS NOT USING LFSRs,

The invention claimed is:

1. A method for error correction decoding with a processor of a first sequence which is a coded version of a second sequence, and a third sequence each containing k n-valued symbols with n>2 and k>2, at least one of the first and third sequence having an n-valued symbol in error after being received by the processor, comprising:
   applying a shift-register of p elements with p>2 for decoding the first sequence into a decoded first sequence;
   determining a first position of a first error in the first sequence;
   determining a second position in the first and third sequence after the first position from where there are p+1 error-free n-valued symbols;
   determining a content of the shift register at the second position; and
   generating the decoded first sequence with up to p consecutive errors corrected by applying the error free content of the shift register.

2. The method of claim 1, wherein the first and third sequence have been generated by a convolutional encoder.

3. An apparatus for error correction of up to p consecutive n-state symbols in error with p>3 in a decoded sequence of k n-state symbols, an n-state symbol being represented by one or more signals, the decoded sequence being derived from at least a first and a second sequence of n-state symbols with n>2 and k>p, using an n-state shift register of p shift register elements, each shift register element enabled to hold an n-state symbol, comprising:
   a processor implementing the n-state shift register and executing instructions to perform the steps of:
       processing an n-state symbol by at least one n-state logic function to identify a first position of a first symbol in error in one or both of the at least first and second sequence;
       determining a second position in the at least first and second sequence from which at least p+1 consecutive n-state symbols are error free;
       determining an error free content of the n-state shift register at the second position; and
       generating the decoded sequence with up to p consecutive errors corrected by applying the error free content of the shift register.

4. The apparatus as claimed in claim 3, further comprising a composite n-valued feedback decoder to apply a third and a fourth sequence of n-state symbols to generate the at least first and second sequence.

5. The apparatus as claimed in claim 4, wherein the composite feedback decoder includes an n-state Linear Feedback Shift Register (LFSR) scrambler.

6. The apparatus as claimed in claim 4, further comprising a composite forward coder wherein the composite forward coder includes an n-state Linear Feedback Shift Register (LFSR) descrambler.

7. The apparatus as claimed in claim 3, further comprising instructions to perform replacing an n-state symbol in error in the decoded sequence by an n-state symbol from the error free content of the n-state shift register at the second position.

8. The apparatus of claim 3, wherein the first position is identified by determining a position where the first and the second sequence have a different n-state symbol.

9. The apparatus as claimed in claim 8, further comprising instructions for performing the steps of:

initializing the shift register with the content at the second position;
generating a regenerated first and second sequence starting at the second position each of the regenerated sequences having at least p+1 n-state symbols; and
determining that the regenerated first and the second sequence have at least p+1 identical n-state symbols starting from the second position.

10. The apparatus as claimed in claim 3, further comprising a recursive systematic convolutional (RSC) decoder.

11. The apparatus as claimed in claim 10, wherein the RSC decoder is formed by combining a descrambler with a scrambler sharing the shift register.

12. The apparatus as claimed in claim 10, wherein the third sequence is generated by coding a fourth sequence by an RSC coder, and the second sequence is a copy of the fourth sequence.

13. The apparatus as claimed in claim 3, wherein n>2.

14. The apparatus as claimed in claim 3, wherein n>3.

15. The apparatus as claimed in claim 3, wherein the first and second sequence have been generated by a convolutional encoder.

16. A system for error-correcting decoding of n-state symbols in error with n>1 in a first sequence of k n-state symbols with k>2, comprising;
a processor implementing an n-state logic function and executing instructions to perform the steps of:
receiving the first sequence of k n-state symbols and a second sequence of k n-state symbols associated with the first sequence of k n-state symbols, wherein the first sequence of n-state symbols has up to p n-state symbols in error with p>1;
decoding the first sequence of k n-state symbols into a decoded first sequence of k n-state symbols with a decoder that includes a shift register of p n-state shift register elements;
determining a first position of a first error in the first sequence of k n-state symbols;
determining a second position in the first and second sequence after the first position from where there are p+1 error-free n-state symbols in the first and second sequence;
determining a content of the shift register of p shift register elements of the decoder corresponding with the second position; and
correcting n-state symbols in error from the first position until the second position in the decoded first sequence based on the content of the shift register.

17. The system of claim 16, wherein n>3.

18. The system of claim 16, wherein the first and second sequence have been generated by a convolutional encoder.

19. The system of claim 16, wherein the system is a communication system.

20. The system of claim 16, wherein the system is a data storage system.

* * * * *

UNITED STATES PATENT AND TRADEMARK OFFICE
CERTIFICATE OF CORRECTION

Page 1 of 2

PATENT NO. : 7,877,670 B2
APPLICATION NO. : 11/566725
DATED : January 25, 2011
INVENTOR(S) : Peter Lablans It is certified that error appears in the above-identified patent and that said Letters Patent is hereby corrected as shown below:

Please note that n≥2 stands for: n greater than or equal to 2; p≥2 stands for: p greater than or equal to 2.

CLAIM 1 Column 44 Lines 5-22 Should Read

1. A method for error correction decoding with a processor of a first sequence which is a coded version of a second sequence, and a third sequence each containing k n-valued symbols with n≥2 and k>2, at least one of the first and third sequence having an n-valued symbol in error after being received by the processor, comprising:
 applying a shift-register of p elements with p≥2 for decoding the first sequence into a decoded first sequence;
 determining a first position of a first error in the first sequence;
 determining a second position in the first and third sequence after the first position from where there are p+1 error-free n-valued symbols;
 determining a content of the shift register at the second position; and
 generating the decoded first sequence with up to p consecutive errors corrected by applying the error free content of the shift register.

Please note that n≥2 stands for: n greater than or equal to 2; p≥3 stands for: p greater than or equal to 3.

CLAIM 3 Column 44 Lines 25-46 Should Read

3. An apparatus for error correction of up to p consecutive n-state symbols in error with p≥3 in a decoded sequence of k n-state symbols, an n-state symbol being represented by one or more signals, the decoded sequence being derived from at least a first and a second sequence of n-state symbols with n≥2 and k>p, using an n-state shift register of p shift register elements, each shift register element enabled to hold an n-state symbol, comprising:

Signed and Sealed this
Fifteenth Day of March, 2011

David J. Kappos
*Director of the United States Patent and Trademark Office* a processor implementing the n-state shift register and executing instructions to perform the steps of:

processing an n-state symbol by at least one n-state logic function to identify a first position of a first symbol in error in one or both of the at least first and second sequence;

determining a second position in the at least first and second sequence from which at least p+1 consecutive n-state symbols are error free;

determining an error free content of the n-state shift register at the second position; and generating the decoded sequence with up to p consecutive errors corrected by applying the error free content of the shift register.